United States Patent
Kondoh et al.

[11] Patent Number: 5,883,534
[45] Date of Patent: Mar. 16, 1999

[54] WAVEFORM SHAPING DEVICE AND CLOCK SUPPLY APPARATUS

[75] Inventors: Harufusa Kondoh; Masahiko Ishiwaki; Hiromi Notani, all of Tokyo, Japan

[73] Assignee: Mitsubishi Denki Kabushiki Kaisha, Tokyo, Japan

[21] Appl. No.: 747,076

[22] Filed: Nov. 8, 1996

[30] Foreign Application Priority Data

May 31, 1996 [JP] Japan .................................. 8-138452

[51] Int. Cl.⁶ .................................................. H03L 7/06
[52] U.S. Cl. ........................ 327/156; 327/160; 327/161
[58] Field of Search ..................... 327/141, 146, 327/147, 148, 149, 150, 152, 154, 156, 157, 158, 159, 161; 331/17; 375/373, 375, 376

[56] References Cited

U.S. PATENT DOCUMENTS

| | | | |
|---|---|---|---|
| 4,994,687 | 2/1991 | Fujii et al. .............................. | 327/217 |
| 5,136,260 | 8/1992 | Youselfi-Elezei ......................... | 331/17 |
| 5,285,122 | 2/1994 | Honda et al. ............................ | 327/277 |
| 5,412,698 | 5/1995 | Van Brunt et al. ..................... | 327/141 |
| 5,670,903 | 9/1997 | Mizuno ................................... | 327/149 |
| 5,684,421 | 11/1997 | Chapman et al. ...................... | 327/270 |

FOREIGN PATENT DOCUMENTS

| | | |
|---|---|---|
| 63-306732 | 12/1988 | Japan . |
| 4-134672 | 5/1992 | Japan . |
| WO 91/08549 | 6/1991 | WIPO . |

*Primary Examiner*—Timothy P. Callahan
*Assistant Examiner*—My-Trang Nu Ton
*Attorney, Agent, or Firm*—Oblon, Spivak, McClelland, Maier & Neustadt, P.C.

[57] ABSTRACT

The operating speed of an apparatus which operates with a clock is increased by obtaining a clock having a constant duty ratio. The maximum variable delay quantity of a first variable delay circuit 11 is set more than one cycle and less than two cycles of an input clock IN. The delay quantities of the first and second variable delay circuits 11, 12 are decreased with a control signal Vin. In addition, the ratio of the delay quantity of the second variable delay circuit 12 to that of the first variable delay circuit 11 is set to a constant value which is less than 1. A control portion 13 increases and decreases the control signal Vin in such a manner that the phases of an input clock IN and an output clock OUT-A of the first variable delay circuit are coincident with each other. An output clock OUT of the device is set by the output clock OUT-A of the first variable delay circuit, and is reset by an output clock OUT-B of the second variable delay circuit. Consequently, the output clock of the device has the same phase as that of the input clock IN and a constant duty ratio.

17 Claims, 30 Drawing Sheets

F I G. 1 1
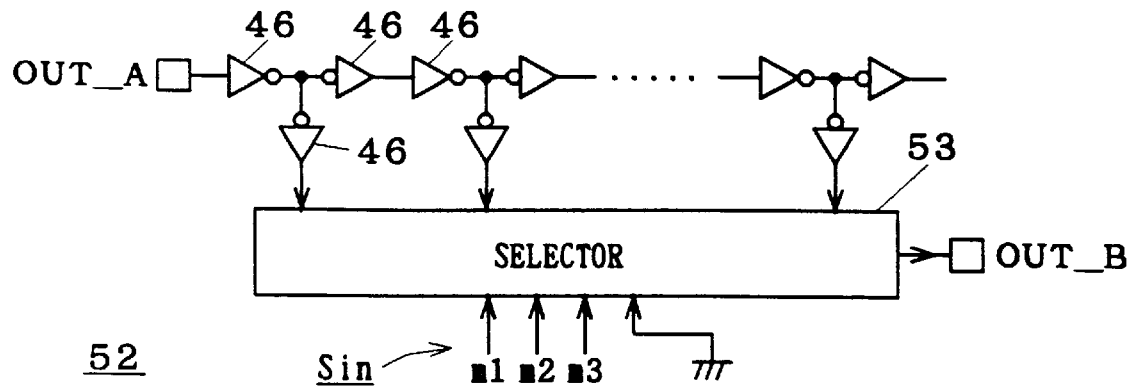
F I G. 1 2
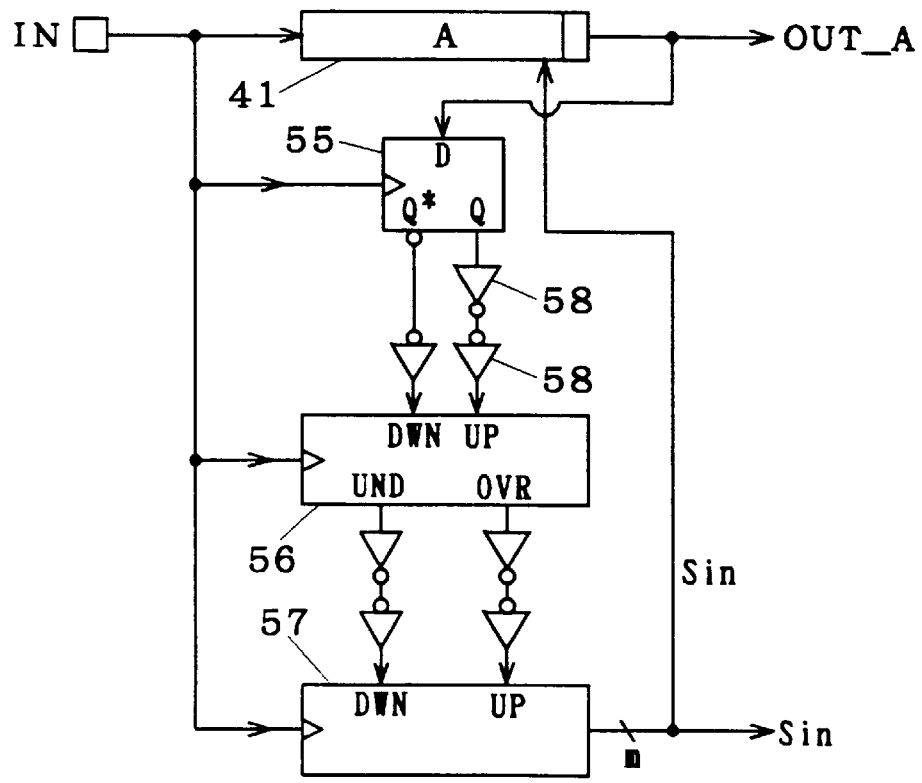

101

101a

101b

F I G. 3 6
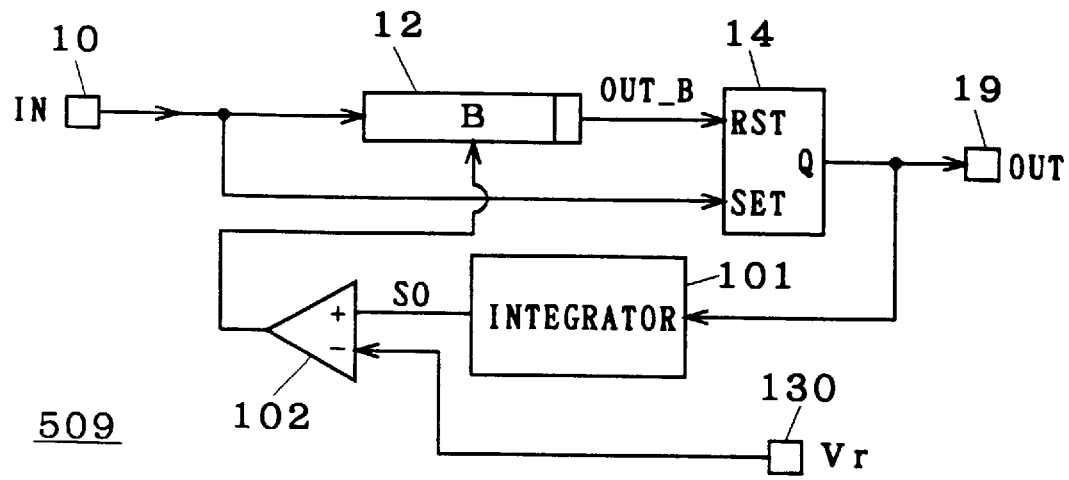
F I G. 3 7
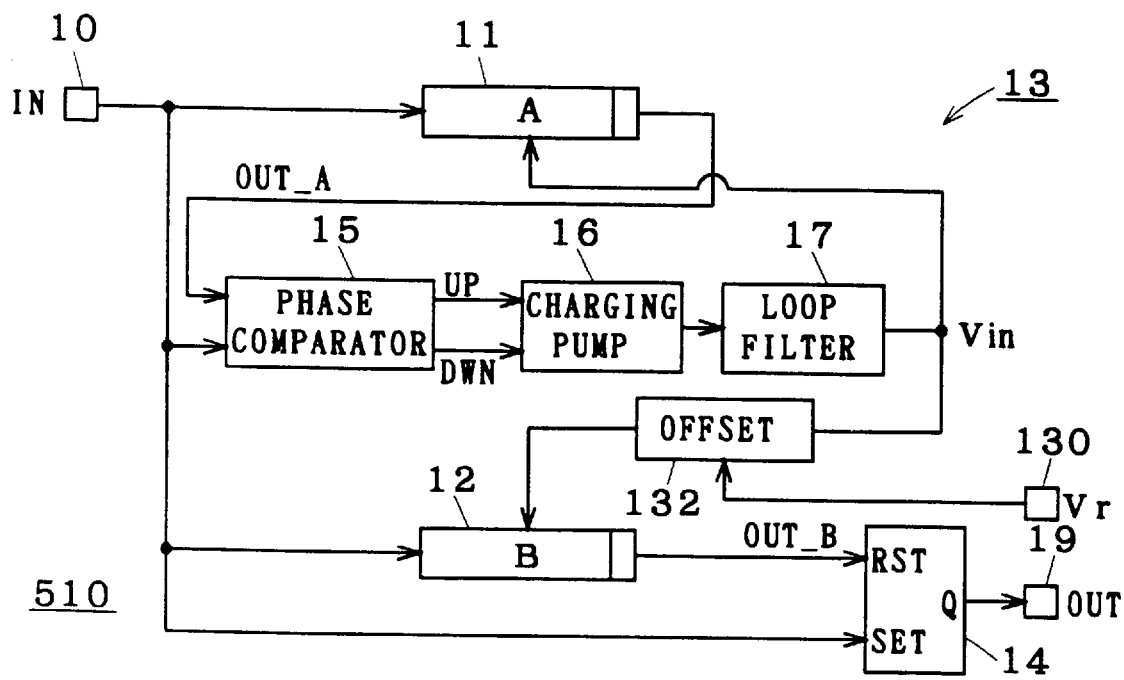

F I G. 3 8
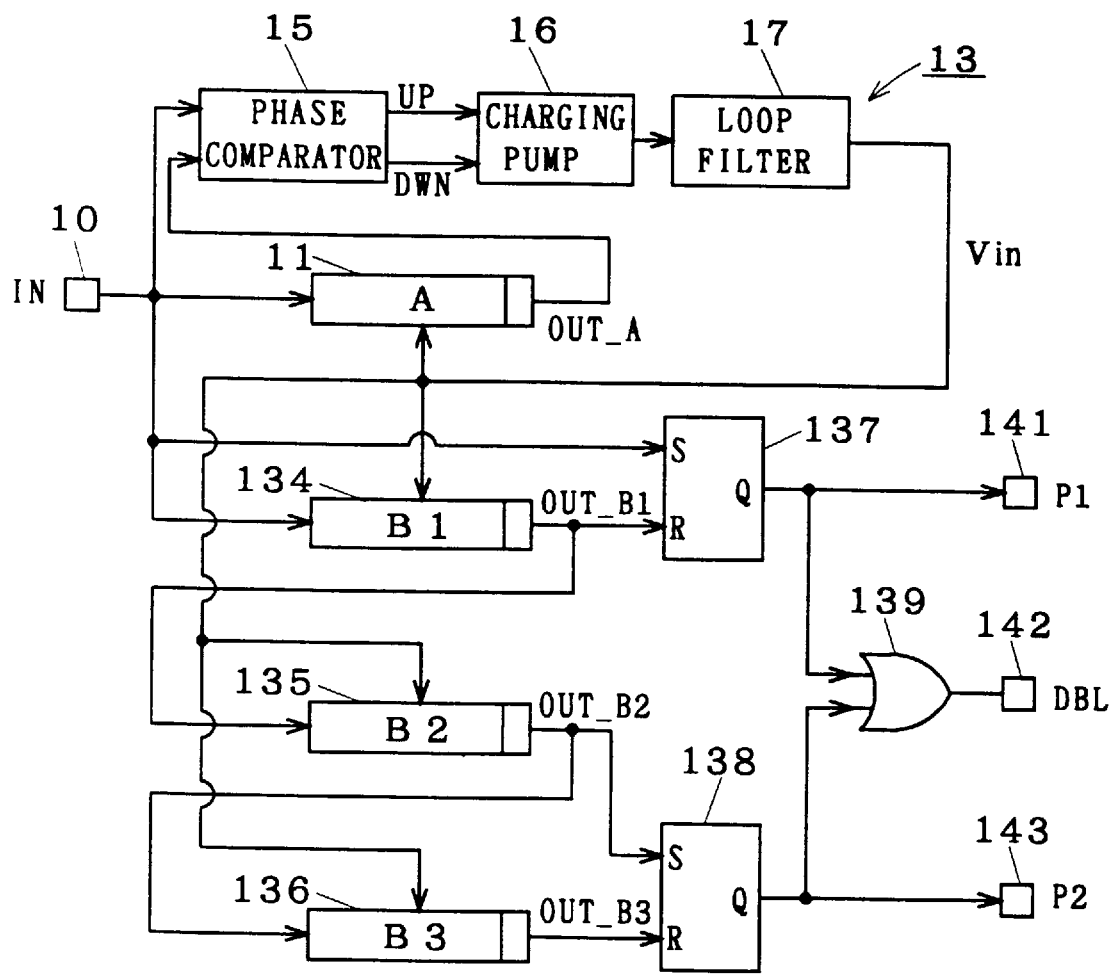

WAVEFORM SHAPING DEVICE AND CLOCK SUPPLY APPARATUS

BACKGROUND OF THE INVENTION

1. Field of the Invention

The present invention relates to a waveform shaping device for converting the duty ratio, the frequency and the like of a clock signal, and to a clock supply apparatus formed by combining a DLL device with the waveform shaping device.

2. Description of the Background Art

A DLL (Delay Locked Loop) device causes a variable delay circuit to delay an external clock by a time which does not quite reach a 1-clock cycle, and offsets delays generated by a clock driver and the like so as to supply an internal clock with substantially same phase as that of the external clock. The DLL device operates by adding a delay which is a little smaller than the 1-clock cycle to the delays generated by the clock driver and the like so as to get the delay of exact 1-clock cycle. For this reason, it seems as if the internal clock is supplied without any delay.

FIG. 47 is a block diagram showing the structure of a clock supply apparatus using the DLL device according to the prior art which is the background of the present invention. In FIG. 47, the reference numeral 1 designates a DLL device, the reference numeral 3 designates a clock driver, the reference numeral 4 designates a clock wiring, the reference numeral 6 designates a clock input terminal, the reference numeral 201 designates a variable delay circuit, the reference numeral 202 designates a phase comparator, the reference numeral 203 designates a charging pump circuit, the reference numeral 204 designates a loop filter, the reference numeral 551 designates a clock supply apparatus, CL designates an input clock (external clock), OUT_D designates an output clock, Vc designates a control signal, and FB designates a feedback clock.

A device portion for receiving the supply of a clock through the clock wiring 4 is usually integrated into a single semiconductor chip. Similarly, the DLL device 1 and the clock driver 3 are usually built in the same semiconductor chip.

FIG. 48 is a circuit diagram showing an example of the well-known structure of the phase comparator 202 according to the prior art. In this example, a Motorola type phase frequency comparator is used. In FIG. 48, N1 to N9 designate NAND circuits, Q1 to Q4 designate output signals of an SR flip-flop formed by the NAND circuits N1 to N8, UP* designates an up signal, DWN* designates a down signal, and RESET* designates a reset signal.

FIG. 49 is a timing chart showing the signal waveform of each portion which accompanies the operation of the device shown in FIG. 48. As shown in FIG. 49, if the phase of the feedback clock FB is later than that of the input clock CL, the up signal UP* becomes an active value (In this case, a value is "0") over a period which is equivalent to a phase difference. On the contrary, if the phase of the feedback clock FB is earlier than that of the input clock CL, the down signal DWN* becomes active over a period which is equivalent to a phase difference.

FIG. 50 is a state transition diagram of the device shown in FIG. 48. As shown in FIG. 50, when the input clock CL rises in the idle state in which neither the up signal UP* nor the down signal DWN* is outputted, the up signal UP* becomes active. Then, when the feedback clock FB rises, reset is performed to return to the idle state. When the feedback clock FB rises earlier, the down signal DWN* becomes active.

FIG. 51 is a circuit diagram showing an example of the well-known structures of the charging pump circuit 203 and the loop filter 204 according to the prior art. In FIG. 51, the reference numerals 211 and 212 designate current sources, the reference numeral 213 designates a PMOS transistor, the reference numeral 214 designates an NMOS transistor, the reference numeral 215 designates an inverter, the reference numeral 216 designates a capacity element, the reference numeral 217 designates a resistive element, Icp1 designates a current supplied from the current source 211, and Icp2 designates a current supplied from the current source 212.

FIG. 52 is a circuit diagram showing the structure of the current source 211. In FIG. 52, the reference numeral 221 designates a PMOS transistor, and the reference numeral 222 designates a bias source for supplying a bias voltage to the PMOS transistor 221.

FIG. 53 is a circuit diagram showing the structure of the current source 212. In FIG. 53, the reference numeral 223 designates an NMOS transistor, and the reference numeral 224 designates a bias source for supplying a bias voltage to the NMOS transistor 223. The bias voltages are supplied from the bias sources 222 and 224 in such a manner that the currents Icp1 and Icp2 are equal to each other.

With reference to FIG. 51 again, when the up signal UP* is active, the PMOS transistor 213 is turned on and the current Icp1 supplied from the current source 211 is fed to the loop filter 204 to charge the capacity element 216. On the contrary, when the down signal DWN* is active, the NMOS transistor 214 is turned on and the capacity element 216 is discharged by the current Icp2 supplied from the current source 212.

More specifically, the charging pump circuit 203 supplies the currents Icp1 and Icp2 set by the current sources 211 and 212 to the loop filter 204 in mutually opposite directions over a period where the up signal UP* and the down signal DWN* are active, which is referred to as a current packet. Positive and negative current packets are stored by the capacity element 216 which is provided in the loop filter 204. FIG. 54 is a circuit diagram showing an example of the well-known structure of a variable delay circuit 201 according to the prior art. In FIG. 54, the reference numeral 232 designates a resistive element, the reference numerals 233, 235 and 243 designate NMOS transistors, the reference numerals 234, 236 and 244 designate PMOS transistors, and the reference numeral 245 designates an inverter. The input clock CL is inputted to a first stage of the inverters 245 which are cascade-connected, and the output clock OUT_D is outputted from a final stage. Every time the input clock CL is propagated to each stage of the inverter 245, a delay time is accumulated.

A current which flows in the resistive element 232 is regulated by the control signal Vc. The magnitude of the current is reflected in that of a current which flows in the MOS transistors 243 and 244 by current mirror circuits which are formed by the PMOS transistors 234 and 236 and the NMOS transistors 235 and 243 respectively. The MOS transistors 243 and 244 function as the current sources of the inverters 245.

More specifically, the source current of each inverter 245 is regulated by the control signal Vc. As the voltage of the control signal Vc is higher, the source current is increased. As the magnitude of the current supplied to the inverter 245 is increased, the delay time of the clock which passes through the inverter 245 is reduced. In other words, as the voltage of the control signal Vc is higher, the delay quantity of the output clock OUT_D for the input clock CL is reduced.

With reference to FIG. 47 again, the input clock CL sent through the clock input terminal 6 is delayed by the DLL device 1 and outputted as the output clock OUT_D. The output clock OUT_D is amplified by the clock driver 3 and then transferred to the clock wiring 4.

The clock wiring 4 usually has the form of a clock tree. A clock on the intermediate skew point of the clock tree is picked up as the feedback clock FB and fed back to the phase comparator 202 of the DLL device 1.

When the phase of the feedback clock FB is later than that of the input clock CL, the phase comparator 202 outputs the up signal UP* over a period which is equivalent to a phase difference for each cycle of the input clock CL. Accordingly, the charging pump circuit 203 sends the positive current packet to the loop filter 204. As a result, the control signal Vc outputted from the loop filter 204 is raised. Consequently, the delay quantity of the variable delay circuit 201 is decreased so that the phase of the output clock OUT_D is advanced and the phase of the feedback clock FB approaches that of the input clock CL.

On the contrary, when the phase of the feedback clock FB is earlier than that of the input clock CL, the phase comparator 202 outputs the down signal DWN* over a period which is equivalent to a phase difference for each cycle of the input clock CL. Accordingly, the charging pump circuit 203 sends the negative current packet to the loop filter 204. As a result, the control signal Vc outputted from the loop filter 204 drops. Consequently, the delay quantity of the variable delay circuit 201 is increased so that the phase of the output clock OUT_D is delayed and the phase of the feedback clock FB approaches that of the input clock CL.

When the phase of the feedback clock FB is coincident with that of the input clock CL, the phase comparator 202 outputs neither the up signal UP* nor the down signal DWN* so that the supply of the current packet to the loop filter 204 is stopped. Consequently, the control signal Vc is not changed. Accordingly, the phase of the feedback clock FB gradually converges on that of the input clock CL so that the phase difference becomes stable in the zero state. The coincidence of the phases is apparent or substantial one. To be exact, the phase of the feedback clock FB is delayed by one cycle of the input clock CL. However, such apparent coincidence is practically equivalent to no phase difference.

As described above, the clock supply apparatus comprising the DLL device according to the prior art functions to compensate for the delay time of a clock. For a duty ratio related to the waveform of the clock, the value of the input clock CL is transmitted to the clock wiring 4 as it is. There is a case where some of various device portions for receiving the supply of the clock through the clock wiring 4 operate at the leading edge of the clock and some of them operate at the trailing edge of the clock. In this case, it is preferable that the duty ratio of the clock should be 50%. By way of example, an edge-triggered flip-flop and a macro block such as a RAM (a circuit block which has a very large hardware scale and implements the specific functions, for example, a RAM, a FIFO, an ALU and the like) are provided together.

If the device portion in which the operation that is started at the leading edge of the clock is latched at the trailing edge of the clock and the device portion which performs the reverse operation are provided together, it is assumed that the duty ratio of the supplied clock is 30%. While the operation should be terminated in a time which is 30% of the clock cycle in the former device portion, the operation can be performed in a time which is 70% of the clock cycle in the latter device portion.

If the amounts of operation of both device portions are equal to each other, the maximum operating speed of the whole apparatus is determined by a period in which the clock has a value of "1" (HIGH level), that is, a length which is 30% of the cycle. On the other hand, if the duty ratio of the clock is 50%, it is possible to employ a higher clock frequency than in the case where the duty ratio of the clock is 30%. In other words, the whole apparatus can operate at a higher speed. Accordingly, it is desirable that the clock supply apparatus comprising the DLL device should have the waveform shaping function for converting the duty ratio of the clock to 50%.

It is not easy to become conscious of the operation performed for a period in which the clock has a value of "1" and the operation performed for a period in which the clock has a value of "0" (LOW level) to be positively reflected in design for each device portion. For this reason, the largest margin of design can usually be obtained by employing the clock having a duty ratio of 50% described above. Assuming that the circuit can operate at the highest speed when the duty ratio of the clock is set to a specific value other than 50%, however, the operating speed of the circuit can be increased to the maximum of potential capacities if the clock supply apparatus can give a desired duty ratio irrespective of the duty ratio of the clock supplied from the outside of the circuit.

Some apparatus need clocks having different phases for each device portion, and some apparatus need clocks having different frequencies for each device portion. However, a clock supply apparatus having the waveform shaping function for converting the duty ratio, the frequency, the number of phases and the like of the clock supplied from the outside has not been known as an apparatus having the function of compensating for out-of-phase according to the prior art.

SUMMARY OF THE INVENTION

A first aspect of the present invention is directed to a waveform shaping device which converts the waveform of an input clock inputted from the outside to output an output clock, comprising a first variable delay circuit which inputs the input clock, delays the input clock by a delay quantity that is changed monotonously with a control signal and outputs a first delay clock and in which the upper bound of the delay quantity is set more than one cycle and less than two cycles of the input clock, a second variable delay circuit which inputs either of the input clock and the first delay clock to be delayed according to the control signal by a delay quantity which is changed with a constant ratio that is less than 1 to the delay quantity of the first variable delay circuit, and outputs a second delay clock, a control portion which compares the phases of the input clock and the first delay clock, and generates and sends the control signal according to the result of comparison, and an SR flip-flop which has a set terminal and a reset terminal connected to input and output sides of the second variable delay circuit respectively, and outputs an output signal as the output clock, wherein the control portion changes the control signal in such a manner that the delay quantity of the first variable delay circuit is decreased when the phase of the first delay clock is later, and that the delay quantity of the first variable delay circuit is increased when the phase of the first delay clock is earlier.

A second aspect of the present invention is directed to the waveform shaping device according to the first aspect of the present invention, wherein the control portion includes a phase comparator which compares the phases of the input clock and the first delay clock, selects either of an up signal and a down signal according to whether one of the input clock and the first delay clock is later or earlier than the other clock, and outputs a selected signal over a period which is equivalent to a phase difference for each cycle of the input clock, a charging pump circuit for selectively outputting one or the other of positive and negative currents over a period in which the up signal or the down signal is outputted respectively, and a loop filter which has a capacity element, stores the positive and negative currents outputted from the charging pump in the capacity element, and outputs the voltage of the capacity element as the control signal.

A third aspect of the present invention is directed to the waveform shaping device according to the first aspect of the present invention, wherein the first variable delay circuit and the second variable delay circuit have respectively a first part and a second part of a group of unit delay elements having the same structure that are cascade-connected so as to be arranged straight, each of the unit delay elements forming the group includes an inverter for sending a signal in a delay time which is reduced as a supplied source current is increased, and a current source for supplying the source current to the inverter in response to a bias signal, and the first variable delay circuit and the second variable delay circuit further share a single bias circuit portion for supplying, in response to the control signal, a common signal as the bias signal to each the current source respectively belonging to each of the unit delay elements forming the group.

A fourth aspect of the present invention is directed to the waveform shaping device according to the first aspect of the present invention, wherein the first variable delay circuit includes a first fixed delay circuit which has a group of first unit delay elements that are cascade-connected, and outputs, as a first signal string, a string of output signals fetched every first constant number of the first unit delay elements, and a first selector which is connected to the first fixed delay circuit, selects a signal from the first signal string in response to a selection signal of a digital form expressing a binary number in such a manner that a delay quantity is varied monotonously with the binary number, and outputs a selected signal as the first delay clock, wherein the second variable delay circuit includes a second fixed delay circuit which has a group of second unit delay elements that are cascade-connected, and outputs, as a second signal string, a string of output signals fetched every second constant number of the second unit delay elements, and a second selector which is connected to the second fixed delay circuit, selects, from the second signal string in response to the selection signal, a signal which has a delay quantity having the constant ratio to a delay quantity of the signal selected by the first variable delay circuit, and outputs a selected signal as the second delay clock, and wherein the control portion sends the selection signal as the control signal.

A fifth aspect of the present invention is directed to the waveform shaping device according to the fourth aspect of the present invention, wherein the first and second selectors have the same structure, and a connecting relationship between the first selector and the first fixed delay circuit is set identical to a connecting relationship between the second selector and the second fixed delay circuit, the first and second unit delay elements have the same structure, and the first constant number is set greater than the second constant number.

A sixth aspect of the present invention is directed to the waveform shaping device according to the fourth aspect of the present invention, wherein the first and second selectors have the same structure, the first and second fixed delay circuits have the same structure, the control portion sends the selection signal corresponding to a binary number as a parallel signal, a connecting relationship between the first selector and the first fixed delay circuit is set identical to a connecting relationship between the second selector and the second fixed delay circuit, and a wiring between the first or second selector and the control portion is connected in such a manner that the control signal is bit-shifted.

An seventh aspect of the present invention is directed to the waveform shaping device according to the fourth aspect of the present invention, wherein the control portion includes a D latch that has a data input terminal and a clock input terminal to which one and the other of the first delay clock and the input clock are inputted respectively, and updates an output according to a level of a signal of the data input terminal every leading edge, to an active level, of a signal of the clock input terminal, a first counter for selectively executing count-up and count-down in the cycle of the input clock according to the level of the output of the D latch, and a second counter for increasing and decreasing a count value synchronously with the input clock every time the first counter overflows and underflows respectively, and for sending the count value as the selection signal.

A eighth aspect of the present invention is directed to the waveform shaping device according to the first aspect of the present invention, further comprising N ($\geq 1$) third variable delay circuits which are sequentially cascade-connected after the second variable delay circuit and have the same structure as that of the second variable delay circuit, and to which the control signal is inputted as a signal for controlling a delay quantity, and the device, referring to the SR flip-flop as a first SR flip-flop, further comprising M second SR flip-flops having set and reset terminals connected to M ($1 \leq M \leq N$) input and output sides of the N third variable delay circuits respectively.

A ninth aspect of the present invention is directed to the waveform shaping device according to the eighth aspect of the present invention, wherein the N is an even number and the M is N/2, the first SR flip-flop and the M second SR flip-flops are connected every other circuit of a group of variable delay circuits which are formed by the second variable delay circuit and the N third variable delay circuits and are cascade-connected, and the constant ratio is set to 1/(N+2), the waveform shaping device further comprising an OR circuit for calculating and outputting a logical OR of the output signals of the first SR flip-flop and the M second SR flip-flops.

A tenth aspect of the present invention is directed to the waveform shaping device according to the first aspect of the present invention, further comprising an offset generating portion which is inserted between the control portion and the second variable delay circuit, and superposes an offset signal on the control signal sent from the control portion to send a superposed signal to the second variable delay circuit.

An eleventh aspect of the present invention is directed to the waveform shaping device according to the first aspect of the present invention, wherein the SR flip-flop includes two one-shot pulse circuits for generating a one-shot pulse synchronously with the leading edge, to an active level, of clocks inputted to the set terminal and the reset terminal respectively.

A twelfth aspect of the present invention is directed to the waveform shaping device according to first aspect of the present invention, further comprising a one-shot pulse circuit for outputting a one-shot pulse synchronously with the leading edge, to an active level, of the input clock inputted from the outside, wherein the one shot-pulse is supplied to each portion of the waveform shaping device except for the one-shot pulse circuit in place of the input clock.

An thirteenth aspect of the present invention is directed to a waveform shaping device which converts the waveform of an input clock inputted from the outside to output an output clock, comprising a one-shot pulse circuit for outputting a one-shot pulse synchronously with a leading edge of the input clock to an active level, a first variable delay circuit which inputs the one-shot pulse, delays the one-shot pulse by a delay quantity that is changed monotonously with a control signal, and outputs a first delay clock and in which the upper bound of the delay quantity is set more than one cycle and less than two cycles of the input clock, a second variable delay circuit for inputting either of the one-shot pulse and the first delay clock, and for outputting a delay signal string which is sequentially delayed with a delay width that is changed according to the control signal in such a manner that the delay quantity of a signal on a last portion keeps a constant ratio which is less than 1 to the delay quantity of the first variable delay circuit, a control portion which compares the phases of the one-shot pulse and the first delay clock, and generates and sends the control signal according to the result of comparison, and an OR circuit which calculates a logical OR of a clock inputted to the second variable delay circuit and the delay signal string, and outputs the logical OR as the output clock, wherein the control portion changes the control signal in such a manner that the delay quantity of the first variable delay circuit is decreased when the phase of the first delay clock is later, and that the delay quantity of the first variable delay circuit is increased when the phase of the first delay clock is earlier.

A fourteenth aspect of the present invention is directed to a waveform shaping device which converts the waveform of an input clock inputted from the outside to output an output clock, comprising a variable delay circuit which inputs the input clock, delays the input clock by a delay quantity that is changed monotonously with a control signal, and outputs a delay clock and in which the upper bound of the delay quantity is set less than one cycle of the input clock, an SR flip-flop that has a set terminal and a reset terminal to which the input clock and the delay clock are inputted respectively, and outputs an output signal as the output clock, an integrator for integrating and outputting the output clock, and a differential amplifier which has two inputs one of which is connected to an output of the integrator, amplifies a difference in value between the two inputs so as to decrease the delay quantity of the variable delay circuit when a value of the one of the two inputs is greater than a value of an other of the two inputs and to increase the delay quantity of the variable delay circuit when the value of the one of the two inputs is smaller than the value of the other, and outputs an amplified signal as the control signal.

A fifteenth aspect of the present invention is directed to the waveform shaping device according to the twelfth aspect of the present invention, further comprising a reference signal generating portion for generating a signal having a constant value to be sent to the other of the two inputs.

A sixteenth aspect of the present invention is directed to a waveform shaping device which converts the waveform of an inputted clock input from the outside to output an output clock, comprising a fixed delay circuit which has a group of unit delay elements that are cascade-connected, and outputs a signal string that is obtained by sequentially delaying the input clock every constant number of the unit delay elements, and a selector which is connected to the fixed delay circuit, selects a signal from the signal string in response to a selection signal of a digital form expressing a binary number in such a manner that a delay quantity has the monotonous relationship with the binary number, and outputs a selected signal as a delay clock, an SR flip-flop that has a set terminal and a reset terminal to which the input clock and the delay clock are inputted respectively, and outputs an output signal as the output clock, a first counter for selectively executing count-up and count-down in a smaller cycle than the input clock according to the level of the output clock, and a second counter for selectively increasing and decreasing a count value in such a manner that a deviation of the duty ratio of the output clock from 50% is eliminated every time the first counter overflows and underflows, and for sending the count value as the selection signal.

A seventeenth aspect of the present invention is directed to the waveform shaping device according to the first aspect of the present invention, the constant ratio is set to ¼, the SR flip-flop is replaced with an exclusive OR circuit for calculating exclusive-OR of signals input to two input terminals and for outputting the exclusive-OR as the output clock, and the set terminal and the reset terminal are replaced with the two input terminals.

A eighteenth aspect of the present invention is directed to a clock supply apparatus for compensating a delay of an input clock supplied from the outside generated at the process of amplifying by a clock driver and propagation through a clock wiring, comprising a DLL device which inputs the input clock to one of inputs and inputs a feedback clock fed back from one point of the clock wiring to the other of the inputs, and shifts and outputs the input clock in such a manner that a phase of the input clock is delayed or advanced according to whether a phase of a clock of the other of the inputs is earlier or later than that of a clock of the one of the inputs, and a waveform shaping device which converts, to a constant value, the duty ratio of a clock outputted from the DLL device and outputs a converted clock to the clock driver.

A nineteenth aspect of the present invention is directed to a clock supply apparatus for compensating a delay of an input clock supplied from the outside generated at the process of amplifying by a clock driver and propagation through a clock wiring, comprising a fixed delay circuit which has a group of unit delay elements that are cascaded-connected, and outputs a signal string which is obtained by sequentially delaying the input clock every constant number of the unit delay elements, a first selector for selecting a signal from the signal string in response to a first selection signal of a digital form expressing a binary number in such a manner that a delay quantity is linearly increased with the binary number, and for outputting a selected signal as a first delay clock, a second selector for selecting a signal from the signal string in response to a second selection signal of a digital form expressing a binary number, with the same relationship between selected signal and second selection signal as between that and the first selection signal, and for outputting the selected signal as a second delay clock, a first selection signal generating portion which inputs the input clock to one of inputs and inputs a feedback clock fed back from one point of the clock wiring to the other of the inputs, and increases or decreases the first selection signal according to whether a phase of a clock of the other of the inputs is earlier or later than that of a clock of the one of the inputs respectively, a cycle measuring portion for measuring a cycle of the input clock, generating a selection signal which can select, from the signal string, a signal having a delay quantity that is half of the cycle, and outputting the selection signal as a third selection signal, a second selection signal generating portion for adding the third selection signal to the first selection signal and for outputting an added signal as the second selection signal, and an SR flip-flop that has a set terminal and a reset terminal to which the first and second delay clocks are inputted respectively, and outputs an output signal to the clock driver.

A twentieth aspect of the present invention is directed to the clock supply apparatus according to the nineteenth aspect of the present invention, wherein the cycle measuring portion, referring to the fixed delay circuit as a first fixed delay circuit, includes a second fixed delay circuit which has a group of unit delay elements that are cascade-connected and outputs a signal string obtained by sequentially delaying the input clock every constant number of the unit delay elements, and in which the delay quantity of the signal string is equal to that of a signal string of a first fixed delay circuit; a third selector for selecting a signal from the signal string of the second fixed delay circuit in response to a fourth selection signal of a digital form expressing a binary number, with the same relationship between selected signal and the fourth selection signal as between that and the first selection signal, and for outputting the selected signal as a third delay clock, a fourth selection signal generating portion which inputs the input clock to one of inputs and inputs the third delay clock to the other of the inputs, and increases or decreases the fourth selection signal according to whether a phase of the clock of the other of the inputs is earlier or later than that of the clock of the one of the inputs, and a divider for converting the fourth selection signal to a half value as a binary number and for outputting a divided value as the third selection signal.

According to the first aspect of the present invention, the first delay clock is delayed from the input clock by one cycle by the operation of the control portion so that their phases become substantially coincident with each other. Accordingly, the output of the second variable delay circuit is delayed from the input thereof by a time which is equivalent to a constant ratio that is less than one cycle. The SR flip-flop is set by the input of the second variable delay circuit and is reset by the output thereof. Consequently, the clock outputted from the SR flip-flop has a constant duty ratio which is equivalent to the constant ratio. In other words, it is possible to obtain an output clock which always has a constant duty ratio irrespective of the duty ratio of the input clock and has a phase that is substantially coincident with the phase of the input clock.

According to the second aspect of the present invention, the control portion includes the phase comparator, the charging pump circuit and the loop filter. For this reason, the control portion has a simple structure and can be manufactured easily.

According to the third aspect of the present invention, the first and second variable delay circuits are formed by the unit delay elements having the same structure. In addition, a bias signal is inputted in common to a current source provided on each unit delay element. For this reason, even though the control signal is changed, the delay quantities of the first and second variable delay circuits precisely keep a constant ratio which is equivalent to that of the numbers of unit delay elements. In other words, the relationship of both delay quantities can be realized with high precision. Since a bias circuit is shared, the number of elements is saved. Furthermore, a factor of noises such as signal coupling can be reduced because the unit delay elements are arranged straight.

According to the fourth aspect of the present invention, the first and second variable delay circuits are hardly influenced by noises because they are formed by a digital circuit for processing a digital signal. Furthermore, a signal is selected from the signal string which is obtained every constant number of unit delay elements in response to the control signal, the delay quantity has high precision and the linearity between the control signal and the delay quantity is excellent.

According to the fifth aspect of the present invention, the unit delay elements which belong to the first and second variable delay circuits are identical and their umbers for each signal string are different. Consequently, their delay quantities are different from each other. Thus, even though the control signal is changed, the ratio of the delay quantities between the first and second variable delay circuits is kept constant with high precision.

According to the sixth aspect of the present invention, the first and second variable delay circuits have the same structure, and their delay quantities are set different by connecting a wiring so as to bit-shift the control signal. Consequently, even though the control signal is changed, the ratio of the delay quantities between the first and second variable delay circuits is kept constant with high precision. Furthermore, since the first and second variable delay circuits can be manufactured identically, a manufacturing efficiency is high.

According to the seventh aspect of the present invention, the control portion is formed by the digital circuit. Consequently, characteristics are constant, the control signal is generated with high precision, and the influence of noises is small so that stable operation can be performed. In addition, the control portion is formed by well-known simple circuits, that is, the D latch and the counter. Accordingly, manufacture can be performed easily and the manufacturing cost can be reduced.

According to the eighth aspect of the present invention, by the third variable delay circuit and the second SR flip-flop, it is possible to obtain a clock having the same duty ratio as that of a clock outputted from the first SR flip-flop and having a phase which is different from that of the clock outputted from the first SR flip-flop. Accordingly, the device of the present invention is suitable for a device which requires a polyphase clock.

According to the ninth aspect of the present invention, a polyphase clock having a duty ratio of 50% and a phase which is shifted by 1/(1+M) of the cycle of the input clock is obtained from the first SR flip-flop and M second SR flip-flops. In addition, a clock having a duty ratio of 50% and a frequency which is (M+1) times as much as the frequency of the input clock is obtained from the OR circuit. Accordingly, the device of the present invention is suitable for a device which requires a polyphase clock or a multiplied clock.

According to the tenth aspect of the present invention, the offset generating portion is provided. Consequently, the duty ratio can be changed easily by varying the value of the control signal inputted to the second variable delay circuit.

According to the eleventh aspect of the present invention, the SR flip-flop includes the one-shop pulse circuit. Consequently, even though the input clock having a great duty ratio is inputted, the device of the present invention operates normally.

According to the twelfth aspect of the present invention, the device is provided with the one-shot pulse circuit. The input clock is converted by the one-shot pulse circuit and supplied to each portion of the device. Consequently, even though the input clock having a great duty ratio is inputted, the device of the present invention operates normally.

According to the thirteenth aspect of the present invention, the one-shot pulse is delayed from the input clock by one cycle by the operation of the control portion so that their phases become substantially coincident with each other. Accordingly, the output of the last portion of the second variable delay circuit is delayed from the input thereof by a time which is equivalent to a constant ratio that is less than one cycle. Accordingly, a clock having the same phase as that of the input clock and a constant duty ratio is outputted from the OR circuit. In other words, an output clock which always has a constant duty ratio irrespective of the duty ratio of the input clock and has a phase that is coincident with the phase of the input clock can be obtained by using the device of the present invention.

According to the fourteenth aspect of the present invention, the clock outputted from the SR flip-flop has a phase which is coincident with that of the input clock, and a period for an active level which is coincident with the delay quantity of the variable delay circuit. The output clock is integrated by the integrator. The delay quantity of the variable delay circuit is increased and decreased according to the difference between an integral signal and the value of the other input of the differential amplifier. Consequently, the delay quantity is decided in such a manner that the integral signal is coincident with the value of the other input.

More specifically, an output clock whose phase is coincident with that of the input clock can be obtained and its duty ratio can be regulated by the value of the other input irrespective of the input clock. Furthermore, the device of the present invention can also be used as a PWM device by inputting, to the other input, a signal which is changed with the time.

According to the fifteenth aspect of the present invention, the device is provided with the reference signal generating portion. Consequently, it is possible to obtain an output clock having a constant duty ratio which corresponds to the value of the generated reference signal.

According to the sixteenth aspect of the present invention, the fixed delay circuit and the selector are connected to each other to function as a variable delay circuit. The clock outputted from the SR flip-flop has a phase which is coincident with that of the input clock and a period for an active level which is coincident with the delay quantity of the variable delay circuit. The delay quantity is changed by the first and second counters in such a manner that the deviation of the duty ratio of the output clock from 50% is eliminated. Consequently, the duty ratio of the output clock is set to 50% irrespective of the input clock.

According to the seventeenth aspect of the present invention, the delay quantity of the second variable delay circuit is set to ¼ of that of the first variable delay circuit, and the SR flip-flop is replaced with the exclusive OR circuit. Consequently, when the clock having a duty ratio of 50% is inputted, a clock having a double frequency is obtained from the exclusive OR circuit.

According to the eighteenth aspect of the present invention, the clock supply apparatus is provided with the waveform shaping device. Consequently, the clock which has a constant duty ratio irrespective of the input clock is supplied to the clock wiring. In addition, the waveform shaping device is inserted between the DLL device and the clock driver i.e. within the loop of the DLL device. For this reason, phase compensation is performed by the DLL device including the delay given by the waveform shaping device.

Thus, it is possible to obtain the output clock having a constant duty ratio irrespective of the input clock without damaging the phase compensating function of the DLL device by using the clock supply apparatus. Consequently, it is possible to increase the operating speed of an object device which receives the supply of the output clock.

According to the nineteenth aspect of the present invention, the fixed delay circuit and the first selector are connected to each other to function as the first variable delay circuit. Furthermore, the fixed delay circuit and the second selector are connected to each other to function as the second variable delay circuit. The delay quantity of the first variable delay circuit is controlled by the first selection signal generating portion in such a manner that the phase difference between the input clock and the feedback clock is eliminated. Furthermore, the delay quantity of the second variable delay circuit is adjusted to half of one cycle of the input clock by the cycle measuring portion and the second selection signal generating portion. Accordingly, the clock having a duty ratio of 50% is outputted from the SR flip-flop.

Thus, it is possible to compensate for the phase and obtain a duty ratio of 50% irrespective of the input clock by using the clock supply apparatus. Consequently, the operating speed of the object device for receiving the supply of the output clock can be increased.

According to the twentieth aspect of the present invention, the second fixed delay circuit and the third selector are connected to each other to function as the third variable delay circuit. By the operation of the fourth selection signal generating portion, the delay quantity of the third variable delay circuit is coincident with one cycle of the input clock. In this case, the value of the fourth control signal is set to a value which can select the delay quantity for one cycle of the input clock.

The delay quantity of the second fixed delay circuit is equal to that of the first fixed delay circuit, and the relationship between the selection signal of the third selector and the selected signal string is set in the same manner as in the first and second selectors. Consequently, the second control signal obtained by adding the third control signal which is equivalent to half of the value of the fourth selection signal to the first control signal selects, as the second delay clock, a clock which is delayed from the first delay clock by half of the cycle of the input clock. Accordingly, the duty ratio of the clock outputted from the SR flip-flop is set to 50% irrespective of the input clock.

Thus, the cycle measuring portion has a structure similar to the structures of the first fixed delay circuit, the first and second selectors, and the first selection signal generating portion, and can have the same structures as in corresponding portions. In other words, the design resources such as circuit patterns can be shared, the manufacturing process can be simplified and the manufacturing cost can be reduced.

Accordingly, it is an object of the present invention to provide a clock supply apparatus which has the function of compensating for the out-of-phase of a clock and the waveform shaping function so as to increase the operating speed of a device for receiving the supply of the clock, and a waveform shaping device suitable for the clock supply apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a block diagram showing another example of the second variable delay circuit according to the third embodiment of the present invention;

FIG. 12 is a block diagram showing a part of a waveform shaping device according to a fourth embodiment of the present invention;

FIG. 36 is a block diagram showing a waveform shaping device according to a thirteenth embodiment of the present invention;

FIG. 37 is a block diagram showing a waveform shaping device according to a fourteenth embodiment of the present invention;

FIG. 38 is a block diagram showing a waveform shaping device according to a fifteenth embodiment of the present invention;

FIG. 49 is a timing chart of the phase comparator according to the prior art;

FIG. 50 is a state transition diagram of the phase comparator according to the prior art;

DESCRIPTION OF THE PREFERRED EMBODIMENTS

1. First Embodiment

Figure 2:
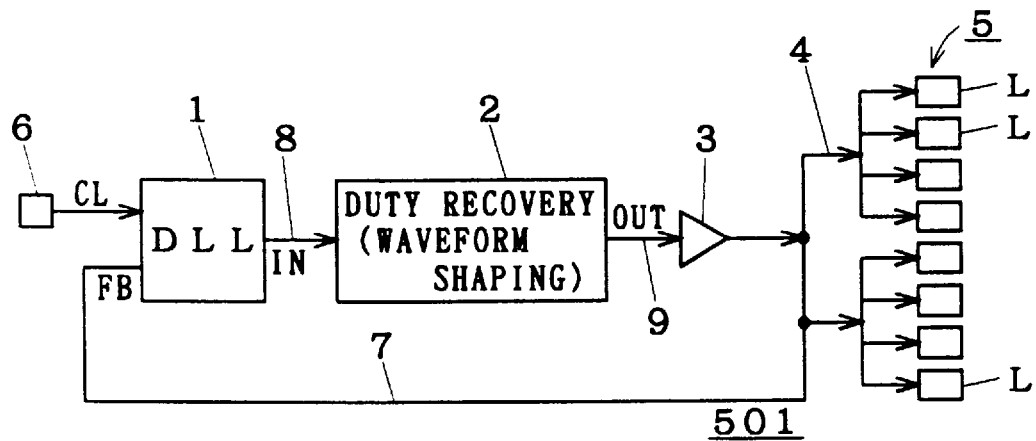
FIG. 2 is a block diagram showing a clock supply apparatus according to a first embodiment of the present invention.

FIG. 2 is a block diagram showing the structure of a clock supply apparatus according to a first embodiment. In the following drawings, the same portions have the same reference numerals as in the apparatus according to the prior art shown in FIGS. 47 to 54 and their detailed description will be omitted.

In FIG. 2, the reference numeral 1 designates a DLL device, the reference numeral 2 designates a waveform shaping device, the reference numeral 3 designates a clock driver, the reference numeral 4 designates a clock wiring, the reference numeral 6 designates a clock input terminal, the reference numeral 7 designates a feedback wiring, the reference numeral 8 designates a DLL device output wiring, the reference numeral 9 designates a clock driver input wiring, CL designates an input clock (external clock) sent from the outside, FB designates a feedback clock, IN designates an input clock sent to the waveform shaping device 2, OUT designates an output clock sent from the waveform shaping device 2, and the reference numeral 501 designates a clock supply apparatus.

The reference numeral 5 designates an object device (system) which is connected to the clock supply apparatus 501 and operates synchronously with a clock supplied from the clock supply apparatus 501. For example, the object device 5 includes a lot of latches L which operate synchronously with the clock as shown in FIG. 2. In a large scale element such as an LSI or the like, the number of latches L is usually several thousands or more. For this reason, the clock wiring 4 usually has the form of a clock tree.

Figure 47:
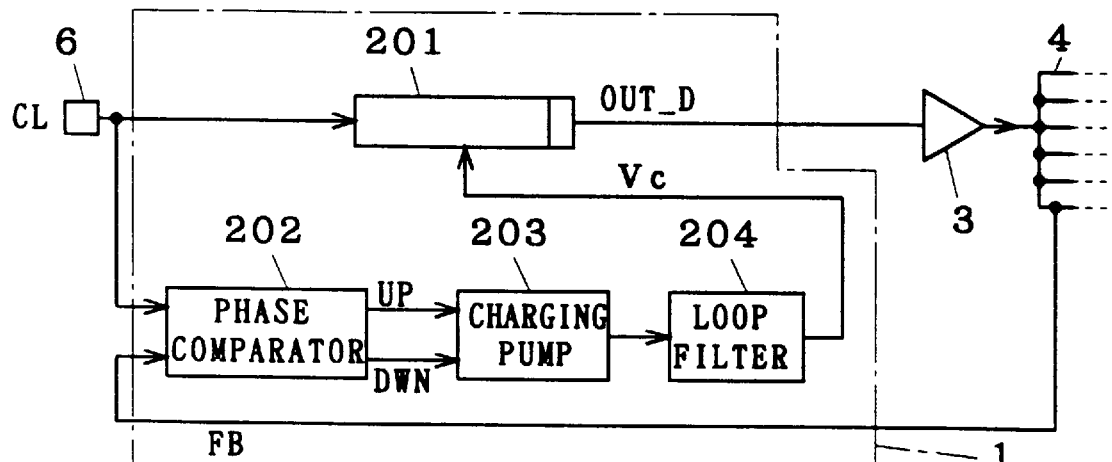
FIG. 47 is a block diagram showing a clock supply apparatus according to the prior art.
Figure 48:
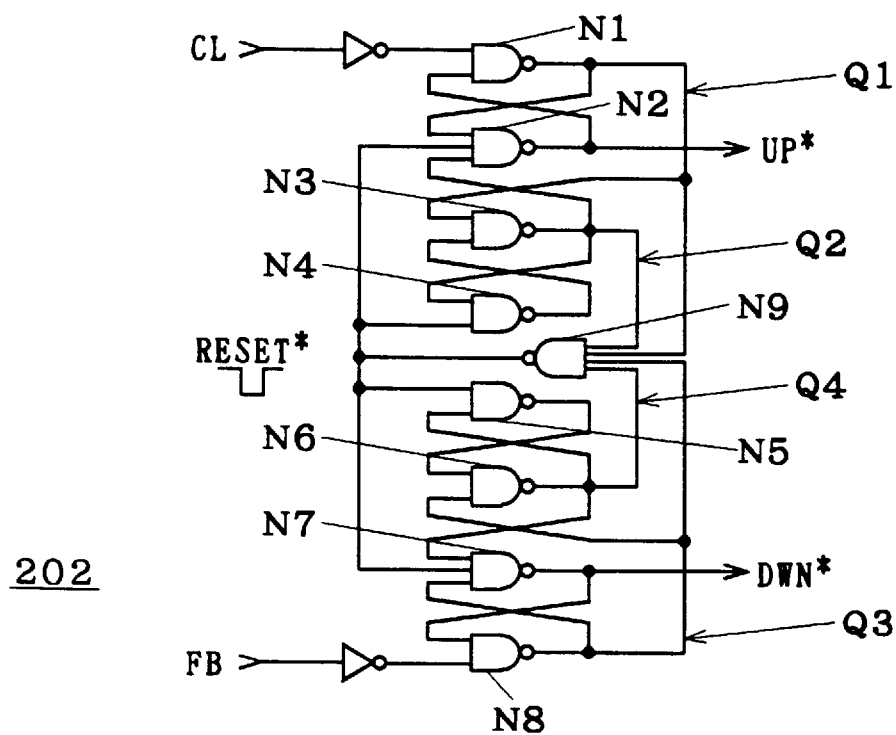
FIG. 48 is a block diagram showing a phase comparator according to the prior art.
Figure 4:
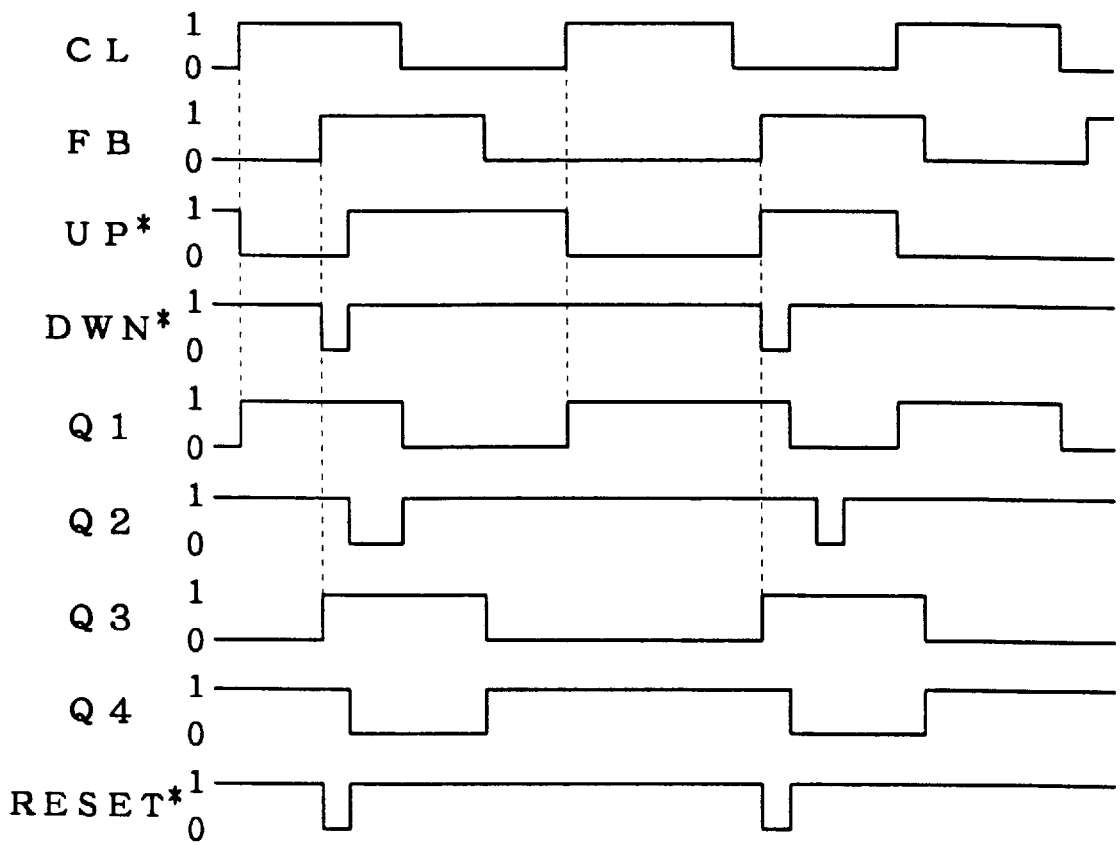
Figure 5:
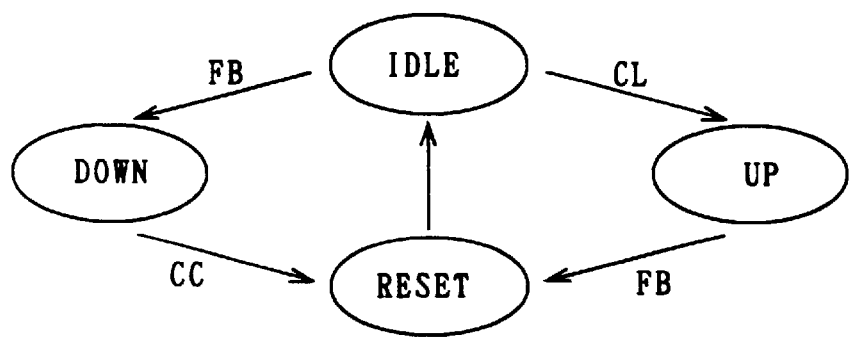
Figure 51:
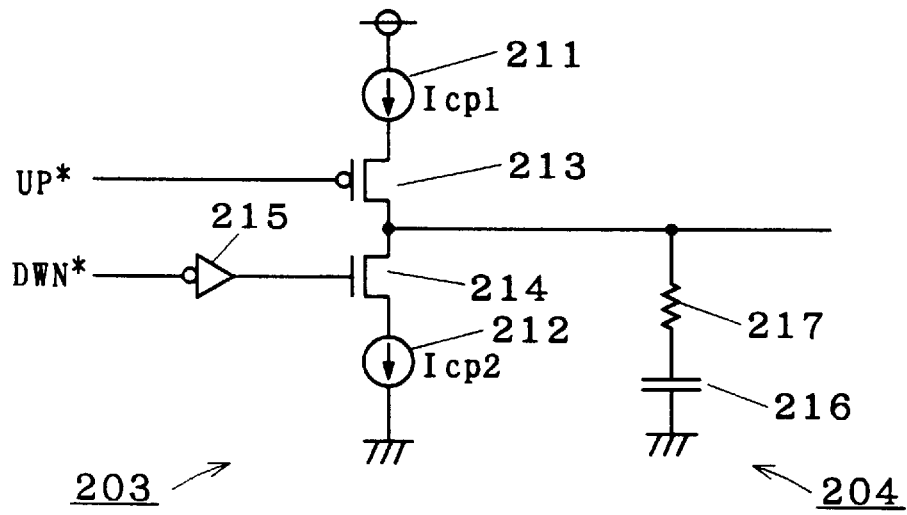
FIG. 51 is a block diagram showing a charging pump circuit and a loop filter according to the prior art.
Figure 52:
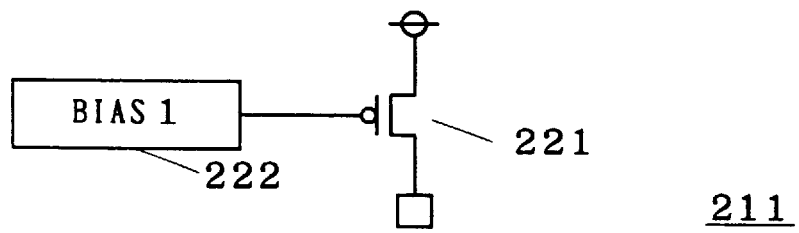
FIG. 52 is a block diagram showing a current source according to the prior art.
Figure 53:
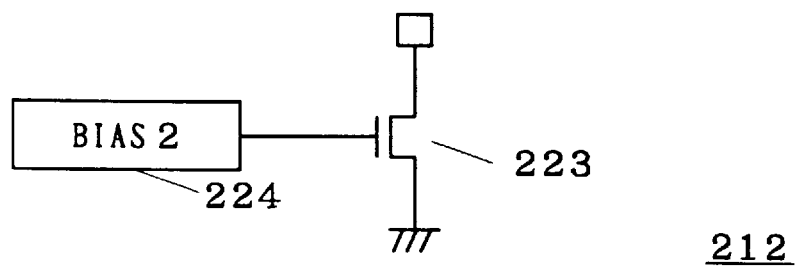
FIG. 53 is a block diagram showing the current source according to the prior art.
Figure 54:
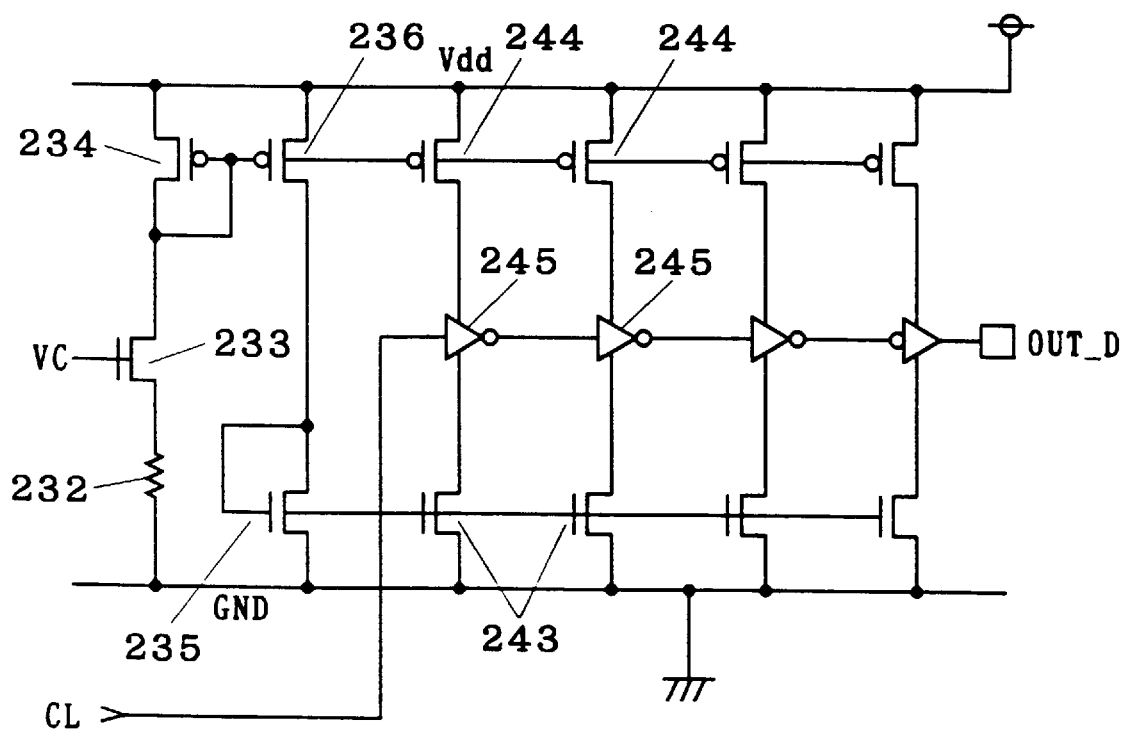
FIG. 54 is a block diagram showing a variable delay circuit according to the prior art.

The DLL device 1 and the clock driver 3 have been known well as shown in FIG. 47. The waveform shaping device 2 is formed as a duty ratio recovering device which converts the input clock IN having various duty ratios into a clock having a duty ratio of 50%. Accordingly, the clock having a duty ratio of 50% is supplied from the clock supply apparatus 501 to the object device 5.

A clock signal is returned as the feedback clock FB from a point in the clock wiring 4 to one of two inputs of the DLL device 1. In other words, the clock supply apparatus 501 characteristically differs from the clock supply apparatus 551 according to the prior art in that the waveform shaping device 2 is inserted between the DLL device 1 and the clock driver 3.

Figure 3:
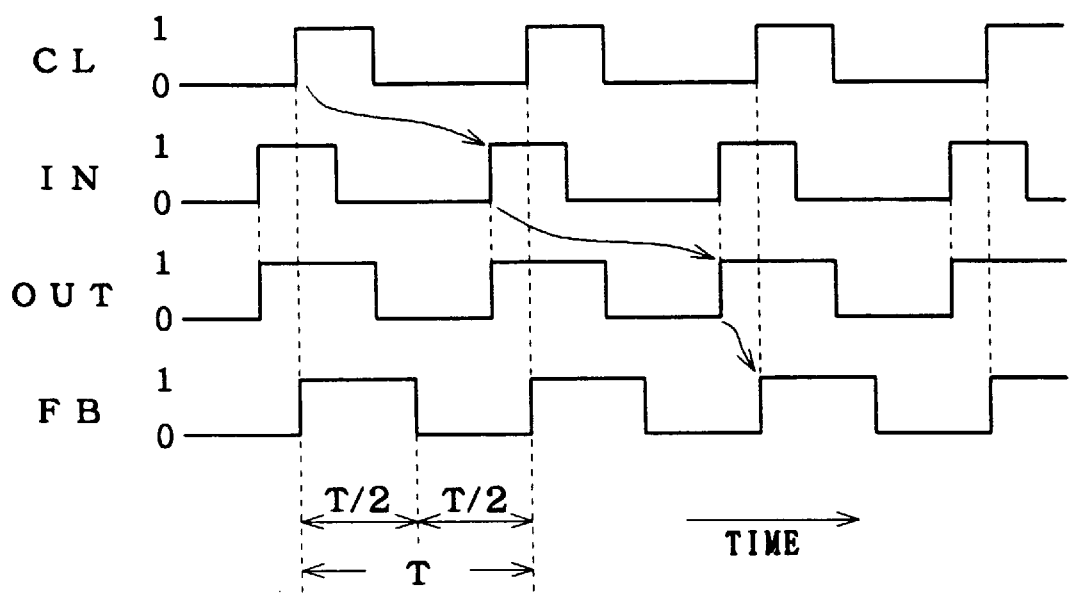
FIG. 3 is a timing chart of the clock supply apparatus according to the first embodiment of the present invention.

FIG. 3 is a timing chart showing the signal waveform of each portion of the clock supply apparatus 501. In FIG. 3, T designates a cycle of the input clock CL. By the operation of the waveform shaping device 2, the waveform of the input clock IN is shaped so as to have a duty ratio of 50% and the output clock OUT is outputted. As a result, the feedback clock FB, that is, the clock on a point of the clock wiring 4 also has a duty ratio set to 50%.

In addition, the phase of the feedback clock FB is equivalently coincident with that of the input clock CL by the operation of the DLL device 1. In an example shown in FIG. 3, the feedback clock FB is later than the input clock CL by 2 cycles. Consequently, an equivalent phase difference is eliminated.

As described above, the clock supply apparatus 501 is formed as if the waveform shaping device 2 is inserted in the loop of the DLL device 1. Consequently, the duty ratio of the clock is recovered to 50% without damaging the delay compensating function of the DLL device 1. In addition, the delay between the input clock CL and the feedback clock FB including the delay of a clock generated by the waveform shaping device 2 can be eliminated equivalently.

The clock having a duty ratio of 50% on which delay compensation is performed is supplied to the object device 5 by using the clock supply apparatus 501. Therefore, in the case where the object device 5 which needs the delay compensation has portions which are synchronized with the leading and trailing edges of the clock, the operating speed can be increased.

2. Second Embodiment

A waveform shaping device according to a second embodiment will be described below.

2-1. Whole Device

Figure 1:
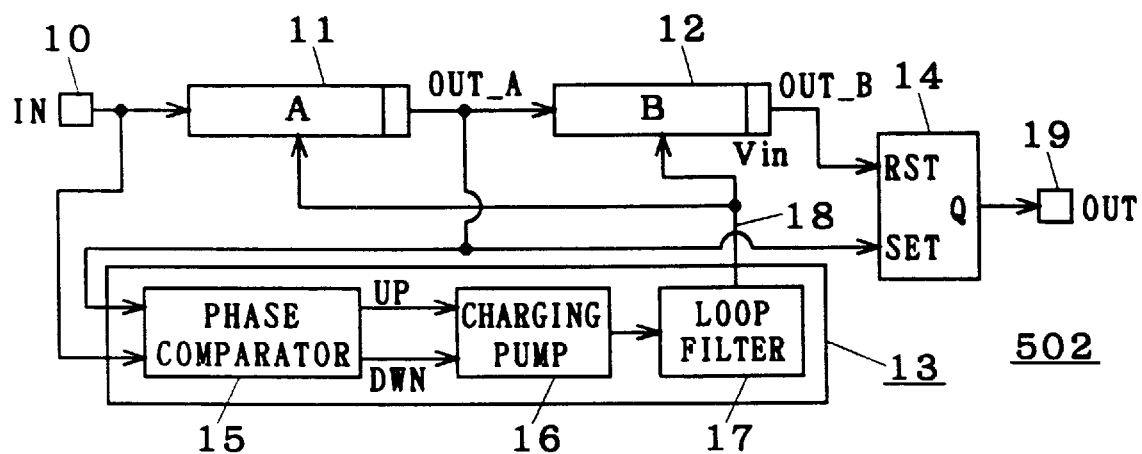
FIG. 1 is a block diagram showing a waveform shaping device according to a second embodiment of the present invention.

FIG. 1 is a block diagram showing the structure of the waveform shaping device according to the second embodiment. A waveform shaping device 502 is formed as a duty ratio recovering device for converting the duty ratio of an input clock to 50% and outputting the converted clock, and is suitable for the waveform shaping device 2 of the clock supply apparatus 501 described above.

As shown in FIG. 1, the waveform shaping device 502 is mainly formed by an analog circuit. In FIG. 1, the reference numeral 10 designates a clock input terminal, the reference numeral 11 designates a first variable delay circuit, the reference numeral 12 designates a second variable delay circuit, the reference numeral 13 designates a control portion, the reference numeral 14 designates an SR flip-flop, the reference numeral 15 designates a phase comparator, the reference numeral 16 designates a charging pump circuit, the reference numeral 17 designates a loop filter, the reference numeral 18 designates a control signal line, the reference numeral 19 designates a clock output terminal, Vin designates a control signal, OUT_A designates an output clock of the first delay circuit 11, and OUT_B designates an output clock of the second delay circuit 12.

The control signal Vin outputted from the loop filter 17 is inputted to the first variable delay circuit 11 and the second variable delay circuit 12 in common. The first variable delay circuit 11 delays an input clock IN sent from the clock input terminal 10 by a delay quantity corresponding to the control signal Vin, and outputs the output clock OUT_A. Similarly, the second variable delay circuit 12 further delays the output clock OUT_A by a delay quantity corresponding to the control signal Vin, and outputs the output clock OUT_B.

In addition, the first variable delay circuit 11 and the second variable delay circuit 12 are formed in such a manner that the delay quantity of the second variable delay circuit 12 is always half of the delay quantity of the first variable delay circuit 11 on condition that the same value is supplied to both the variable delay circuits 11 and 12 as the control signal Vin. In other words, the relationship of:

$$\text{delay (A)} = 2 \times \text{delay (B)} \tag{Formula 1}$$

is always kept between delay (A): a delay quantity of the first variable delay circuit 11 and delay (B): a delay quantity of the second variable delay circuit 12. Furthermore, the maximum variable delay quantity of the first variable delay circuit 11 is set greater than the clock cycle of the input clock IN (for example, 10 nsec for a 100 MHz clock), and is set less than twice as much as the cycle.

The phase comparator 15, the charging pump circuit 16 and the loop filter 17 provided in the control portion 13 operate in the same manner as the phase comparator 202, the charging pump circuit 203 and the loop filter 204 provided in the clock supply apparatus 551 according to the prior art. The phase comparator 15 compares phases between the input clock IN and the output clock OUT_A, and sends an up signal UP or a down signal DWN according to the result of comparison.

The charging pump circuit 16 converts the up signal UP and the down signal DWN into a current packet to be output to the loop filter 17. The loop filter 17 outputs, as the control signal Vin, a voltage signal corresponding to the quantity of integration of the input current packet.

The output clock OUT_A and the output clock OUT_B are inputted to a set terminal SET and a reset terminal RST of the SR flip-flop 14, respectively. The output of a non-inverted output terminal Q of the SR flip-flop 14 is sent as an output clock OUT to the outside through the clock output terminal 19. A reset priority SR flip-flop is used for the SR flip-flop 14.

Figure 4:
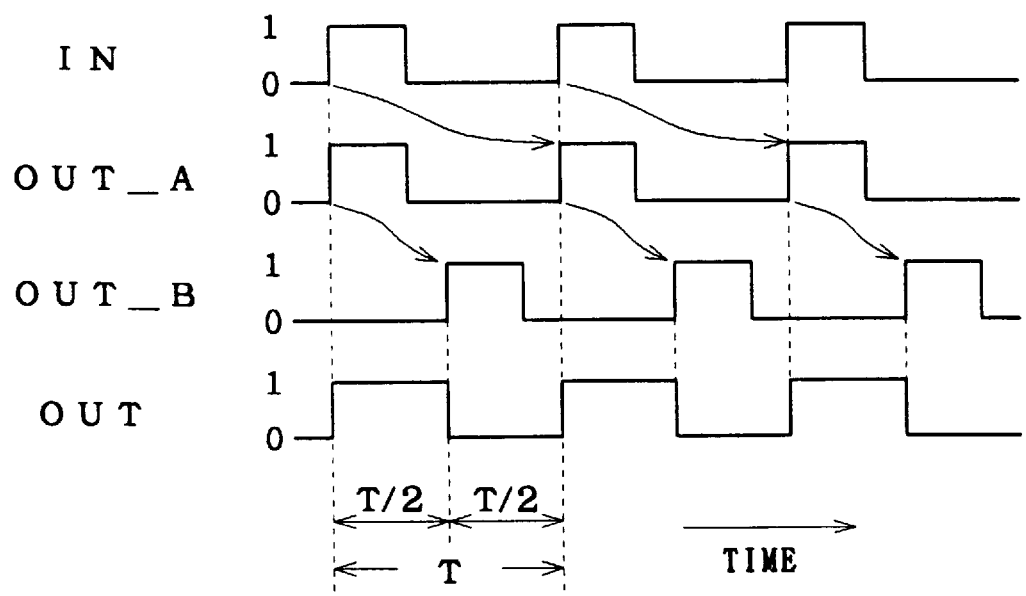
FIG. 4 is a timing chart of the waveform shaping device according to the second embodiment of the present invention.

FIG. 4 is a timing chart showing the signal waveform of each portion of the waveform shaping device 502. In FIG. 4, T designates a cycle of the input clock IN. In general, a clock having a duty ratio which is not always 50% is inputted as the input clock IN.

The input clock IN and the output clock OUT_A are inputted to the control portion 13. The control signal Vin outputted from the control portion 13 is sent to the first variable delay circuit 11. Consequently, the first variable delay circuit 11 and the control portion 13 form a kind of DLL device. For this reason, the phase of the output clock OUT_A is apparently coincident with that of the input clock IN.

The maximum variable delay quantity of the first variable delay circuit 11 is set less than two cycles of the input clock IN. Consequently, the output clock OUT_A is delayed from the input clock IN by a cycle (=T) so that the phases are equivalently coincident with each other. The delay quantity of the second variable delay circuit 12 becomes half of the cycle T (=T/2) according to the relationship of Formula 1.

The SR flip-flop 14 is set synchronously with the leading edge of the output clock OUT_A (a transition from 0 to 1), and is reset synchronously with the leading edge of the output clock OUT_B. For this reason, the output of the non-inverted output terminal Q, that is, the output clock OUT rises synchronously with the leading edge of the output clock OUT_A and falls (makes a transition from 1 to 0) synchronously with the leading edge of the output clock OUT_B. As a result, the period of the output clock OUT staying at an active level (a period of "1") becomes half of the cycle T. In other words, the duty ratio of the output clock OUT is 50%.

As described above, the waveform shaping device 502 functions as a duty ratio recovering device which converts the various duty ratios of the input clock IN to 50% to be outputted.

It is desirable that the initial value of the delay quantity of the first variable delay circuit 11 should be set to a minimum delay quantity. In other words, it is preferable that the initial value of the control signal Vin should be set to the greatest value, which takes safety into consideration and is not necessary if the maximum delay quantity of the first variable delay circuit 11 is exactly less than twice as much as the cycle T. If the maximum delay quantity of the first variable delay circuit 11 is more than twice as much as the cycle T due to manufacturing errors and the like, a point (delay quantity) at which the phase is stably locked is not single. As a result, there is a possibility that the desired operation is not performed. Also in this case, if the operation is started with a smaller delay quantity, the phase is not locked with the delay quantity which exceeds the cycle T but is stably locked with the delay quantity of the cycle T.

For this purpose, it is sufficient that a power on reset circuit is additionally provided and the loop filter 17 is preliminarily charged up by using a pulse generated by the power on reset circuit in such a manner that the control signal Vin reaches the potential of a power line of high potential side when turning on a power source. Similarly, the loop filter 17 may be preliminarily charged up by using a reset signal sent from the outside without the power on reset circuit provided.

2-2. Variable Delay Circuit: Part 1

Figure 5:
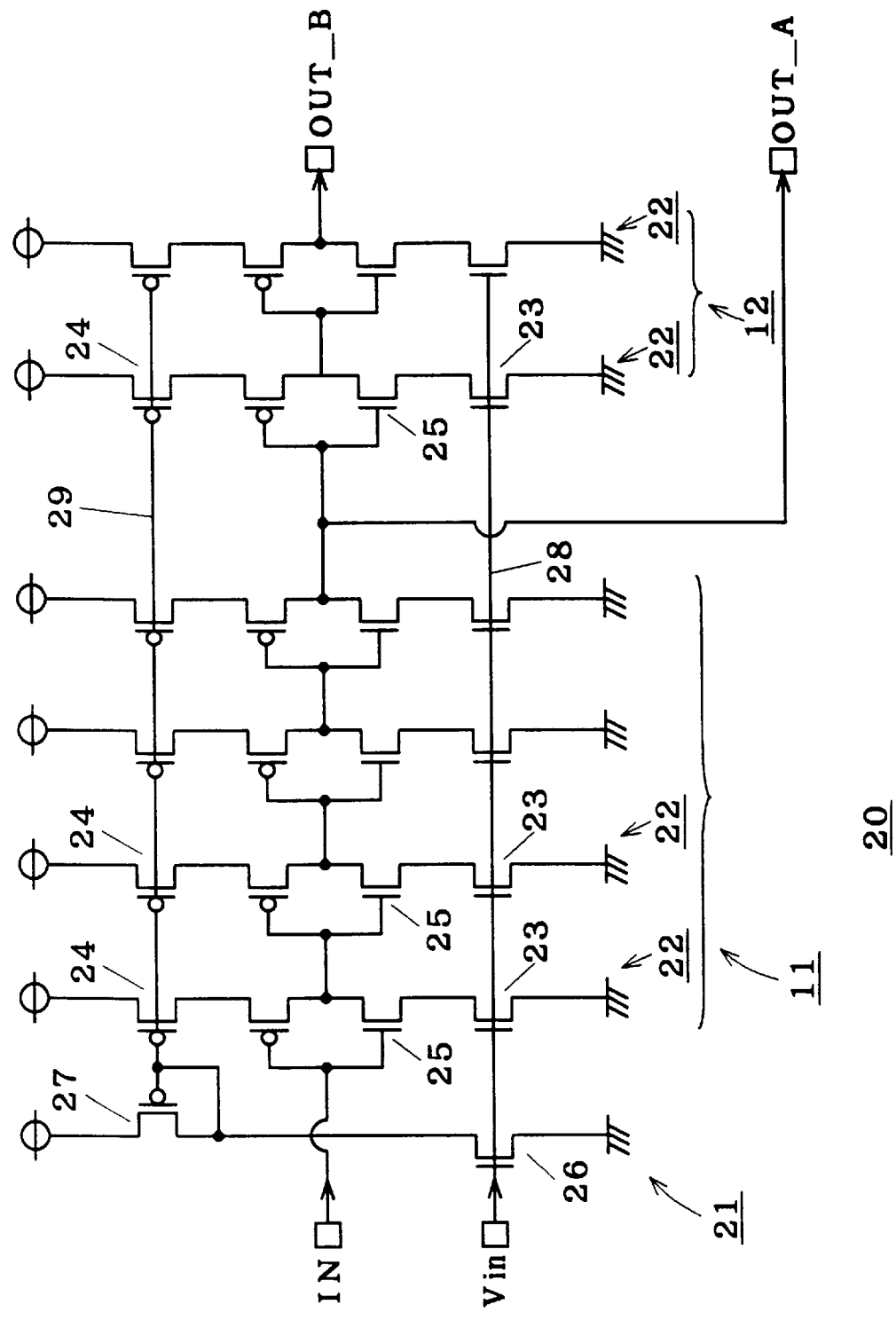
FIG. 5 is a block diagram showing a variable delay circuit according to the second embodiment of the present invention.

FIG. 5 is a circuit diagram showing the structure of a variable delay circuit which is suitable for the variable delay circuits 11 and 12 of the waveform shaping device 502.

A variable delay circuit 20 includes a bias circuit portion 21, a first variable delay circuit 11 and a second variable delay circuit 12. In the variable delay circuit 20, the first variable delay circuit 11 and the second variable delay circuit 12 are incorporated in a single device.

The bias circuit portion 21 has an NMOS transistor 26 and a PMOS transistor 27 connected between a high potential power line and a ground potential power line in series. The gate electrode and the drain electrode of the PMOS transistor 27 are short-circuited each other. The control signal Vin is inputted to the gate electrode of the NMOS transistor 26.

The variable delay circuit 20 further includes a plurality of unit delay circuits which are cascade-connected to each other. The first variable delay circuit 11 is formed by a first part from a first stage to a certain stage. The second variable delay circuit 12 is formed by a second part having the unit delay circuits which are half of them in the first part. The output clock OUT_A is obtained from a connecting portion of the first and second parts, and the output clock OUT_B is obtained from a final stage.

Each unit delay circuit has an inverter 25. The inverter 25 is formed by NMOS and PMOS transistors having drain electrodes connected to each other and gate electrodes connected to each other. Another PMOS transistor 24 is inserted between the high potential power line and the source electrode of the PMOS transistor forming the inverter 25. Similarly, another NMOS transistor 23 is inserted between the ground potential power line and the source electrode of the NMOS transistor forming the inverter 25.

The input clock IN is sent to the gate electrode on the first stage of the inverter 25. The inverters 25 are cascade-connected to each other in such a manner that the drain electrode on the last stage is connected to the gate electrode on the next stage. All the gates of the PMOS transistors 24 and 27 are connected to each other through a bias wiring 29. Similarly, all the gate electrodes of the NMOS transistors 23 and 26 are connected to each other through a bias wiring 28.

The variable delay circuit 20 operates in the following manner. In the bias circuit portion 21, a current having a magnitude corresponding to that of the control signal Vin which is a voltage signal flows from the high potential power line to the ground potential power line. The gate electrode and the drain electrode of the PMOS transistor 27 are short-circuited each other. For this reason, a bias voltage which is equivalent to the control signal Vin is applied to the gate electrode of the PMOS transistor 27 by the current which flows in the bias circuit portion 21.

The control signal Vin and the bias voltage are supplied to all the gate electrodes of the NMOS transistors 23 and the PMOS transistors 24 in common. Consequently, a current having the same magnitude as that of the current which flows in the bias circuit portion 21 flows to each unit delay circuit. In other words, the magnitude of the current which flows in all the unit delay circuits is regulated by the control signal Vin in common. The current which flows in the unit delay circuit makes a contribution as the source current of the inverter 25.

As the source current is greater, the propagation delay time of the inverter 25 is reduced. Accordingly, as the control signal Vin is greater, the delay quantity of the unit delay circuit is reduced. The delay quantity is always common to all the unit delay circuits irrespective of the control signal Vin. Consequently, the delay quantity of the second variable delay circuit 12 is always half of that of the first variable delay circuit 11. In other words, the variable delay circuit 20 can obtain the delay quantity corresponding to the control signal Vin while keeping the relationship of Formula 1.

In the variable delay circuit 20, the ratio of the numbers of the unit delay circuits having the same structure is 2:1 in the first variable delay circuit 11 and the second variable delay circuit 12. In addition, a source current having a common magnitude is supplied in such a manner that the delay time is common among all the unit delay circuits. Consequently, the relationship of Formula 1 can always be realized with precision. The bias circuit portion 21 is shared by the first variable delay circuit 11 and the second variable delay circuit 12. Consequently, the number of elements is reduced.

It is further desirable that each element and each wiring forming the variable delay circuit 20 should be arranged as shown in FIG. 5 as if the circuit diagram of FIG. 5 is a layout. By performing such arrangement, the bias wirings 28 and 29 are also provided straight so that the layout can become compact. At the same time, the factor of noises such as signal coupling can also be eliminated or relieved.

2-3. Variable Delay Circuit: Part 2

Figure 6:
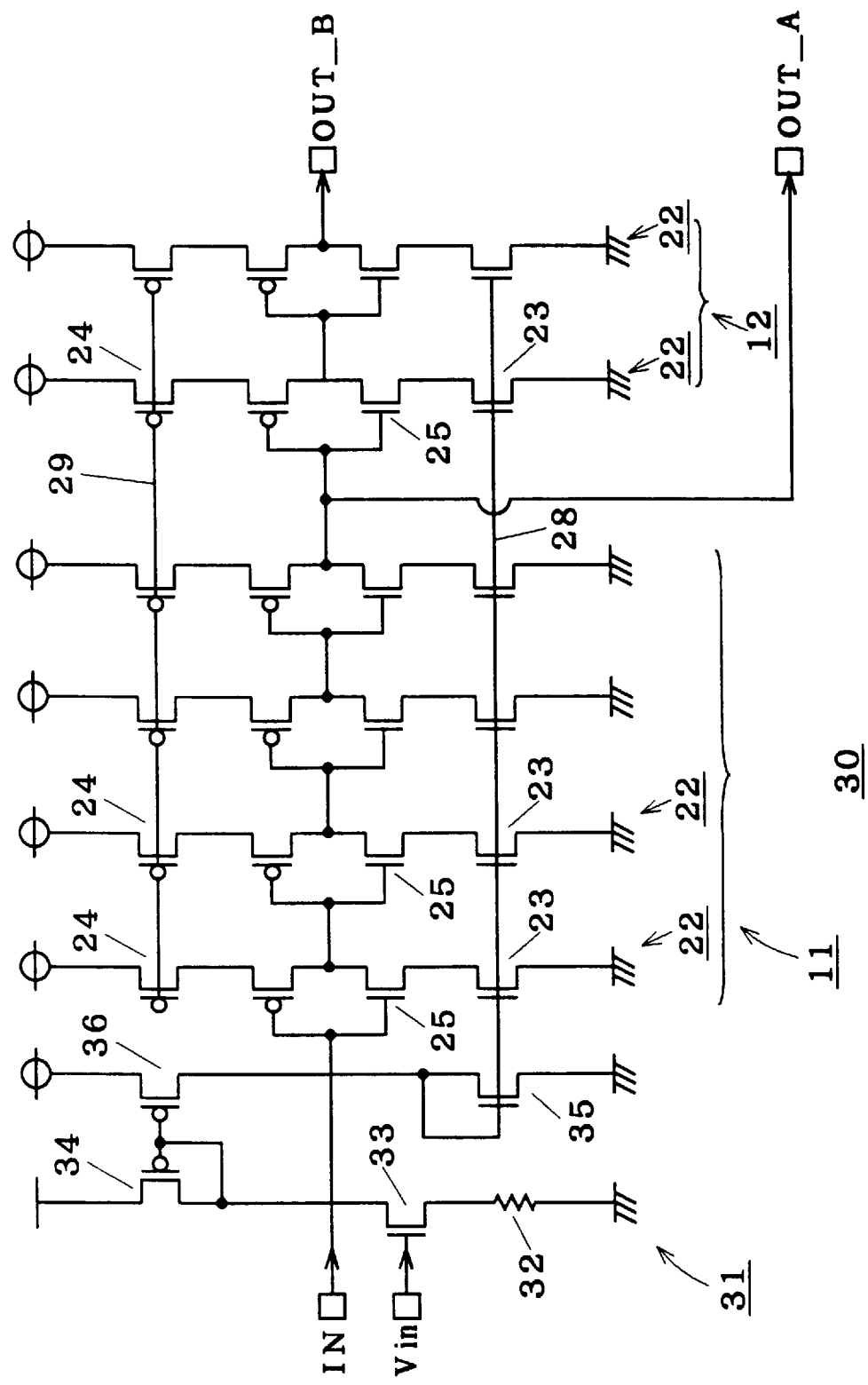
FIG. 6 is a block diagram showing another example of the variable delay circuit according to the second embodiment of the present invention.

FIG. 6 is a circuit diagram showing the structure of another variable delay circuit suitable for the use in the waveform shaping device 502. A variable delay circuit 30 characteristically differs from the variable delay circuit 20 in that a bias circuit portion 31 has a different structure. In other words, the bias circuit portion 31 has a two-stage serial circuit inserted between a high potential power line and a ground potential power line.

The serial circuit on the first stage has a PMOS transistor 34, an NMOS transistor 33 and a resistive element 32 connected in series in this order. A control signal Vin is inputted to the gate electrode of the NMOS transistor 33. The PMOS transistor 34 has gate and drain electrodes short-circuited each other.

In the serial circuit on the second stage, a PMOS transistor 36 and an NMOS transistor 35 are connected in series. The gate electrode of the PMOS transistor 36 is connected to that of the PMOS transistor 34. The NMOS transistor 35 has gate and drain electrodes short-circuited each other.

The gate electrode of the PMOS transistor 36 is connected to all the gate electrodes of PMOS transistors 24 through a bias wiring 29. Similarly, the gate electrode of the NMOS transistor 35 is connected to all the gate electrodes of NMOS transistors 23 through a bias wiring 28.

In the bias circuit portion 31, the resistive element 32 is inserted as a source resistor between the ground potential power line and the NMOS transistor 33 to which the control signal Vin is inputted. For this reason, a current having the linear relationship with the control signal Vin flows in the resistive element 32. The current on the first stage is reflected in the serial circuit on the second stage by a current mirror circuit formed by the PMOS transistors 34 and 36. Furthermore, a current which flows in the serial circuit on the second stage is reflected in each unit delay circuit by a current mirror circuit formed by the NMOS transistors 35 and 23. Thus, the variable delay circuit 30 has a structure in which a current having the same magnitude as that of a current regulated by the control signal Vin flows to each unit delay circuit. In addition, the relationship between the control signal Vin and the current is mainly defined by the resistive element 32. Consequently, linearity is excellent between the current supplied to each unit delay circuit and the control signal Vin.

While the delay quantity is decreased with an increase in the control signal Vin in the examples of the first variable delay circuit 11 and the second variable delay circuit 12 described above, a structure having the reverse relationship may be used. In this case, it is sufficient that the control portion 13 changes the control signal Vin according to a phase difference in the direction opposite to the above-mentioned examples. In general, it is ideal that the first variable delay circuit 11 and the second variable delay circuit 12 have delay quantities which are monotonously changed with the control signal Vin and that the constant ratio of the latter delay quantity to the former delay quantity which is less than 1 is kept under the same control signal Vin.

3. Third Embodiment

A waveform shaping device according to a third embodiment will be described below.

3-1. Whole Device

Figure 7:
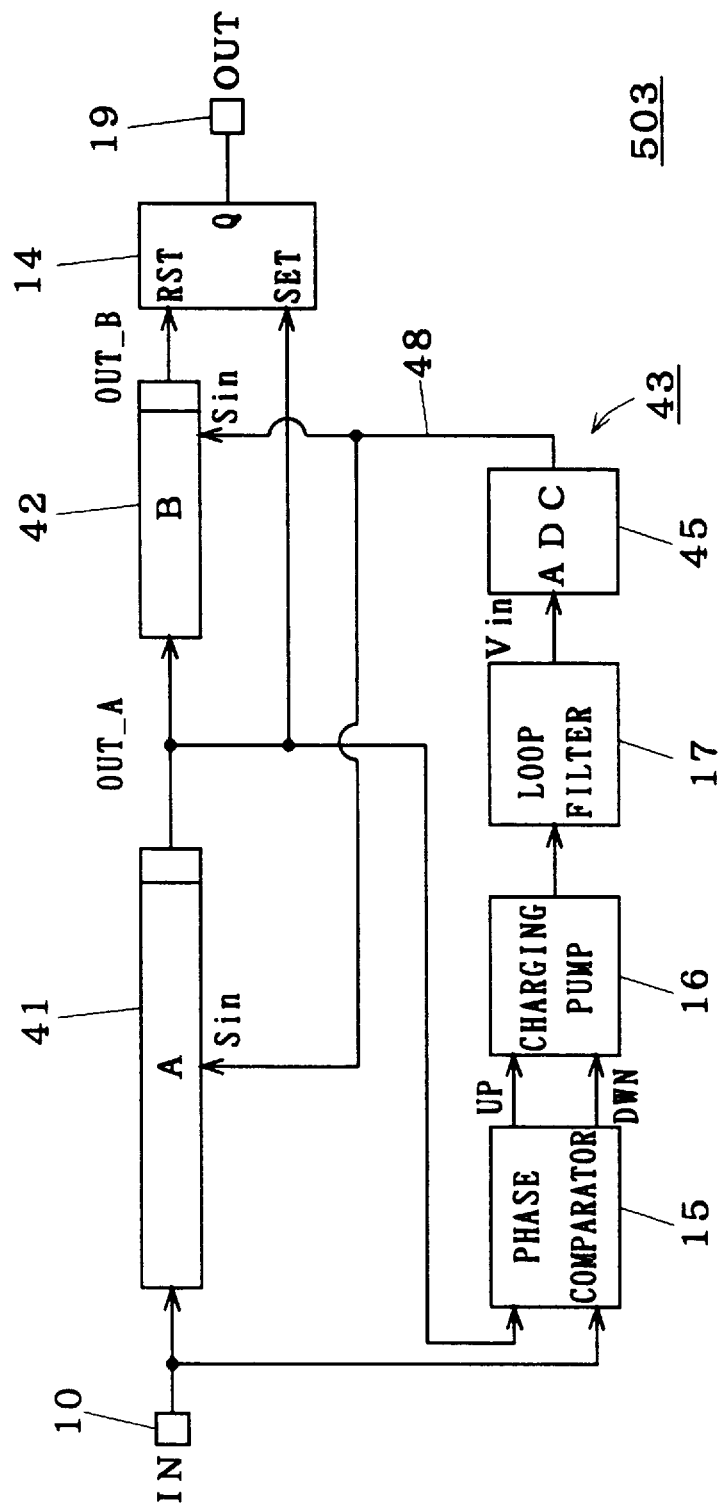
FIG. 7 is a block diagram showing a waveform shaping device according to a third embodiment of the present invention.

FIG. 7 is a block diagram showing the structure of the waveform shaping device according to the present embodiment. A waveform shaping device 503 is also formed as a duty ratio recovering device for converting the duty ratio of an input clock to 50% so as to be output, and is suitable for the waveform shaping device 2 of the clock supply apparatus 501 described above. In FIG. 7, the reference numeral 41 designates a first variable delay circuit, the reference numeral 42 designates a second variable delay circuit, the reference numeral 43 designates a control portion, the reference numeral 45 designates an AD converter, the reference numeral 48 designates a control signal line, and Sin designates a control signal.

In the waveform shaping device 503, an analog control signal Vin which is outputted from a loop filter 17 is converted into a digital control signal Sin by the AD converter 45 and the digital control signal Sin is supplied to the first variable delay circuit 41 and the second variable delay circuit 42 in common. The first variable delay circuit 41 and the second variable delay circuit 42 are formed as digital circuits for processing only digital signals. The waveform shaping device 503 is the same as the waveform shaping device 502 in that the first variable delay circuit 41 and the second variable delay circuit 42 keep the relationship of Formula 1 between their delay quantities.

3-2. Variable Delay Circuit: Part 1

Figure 8:
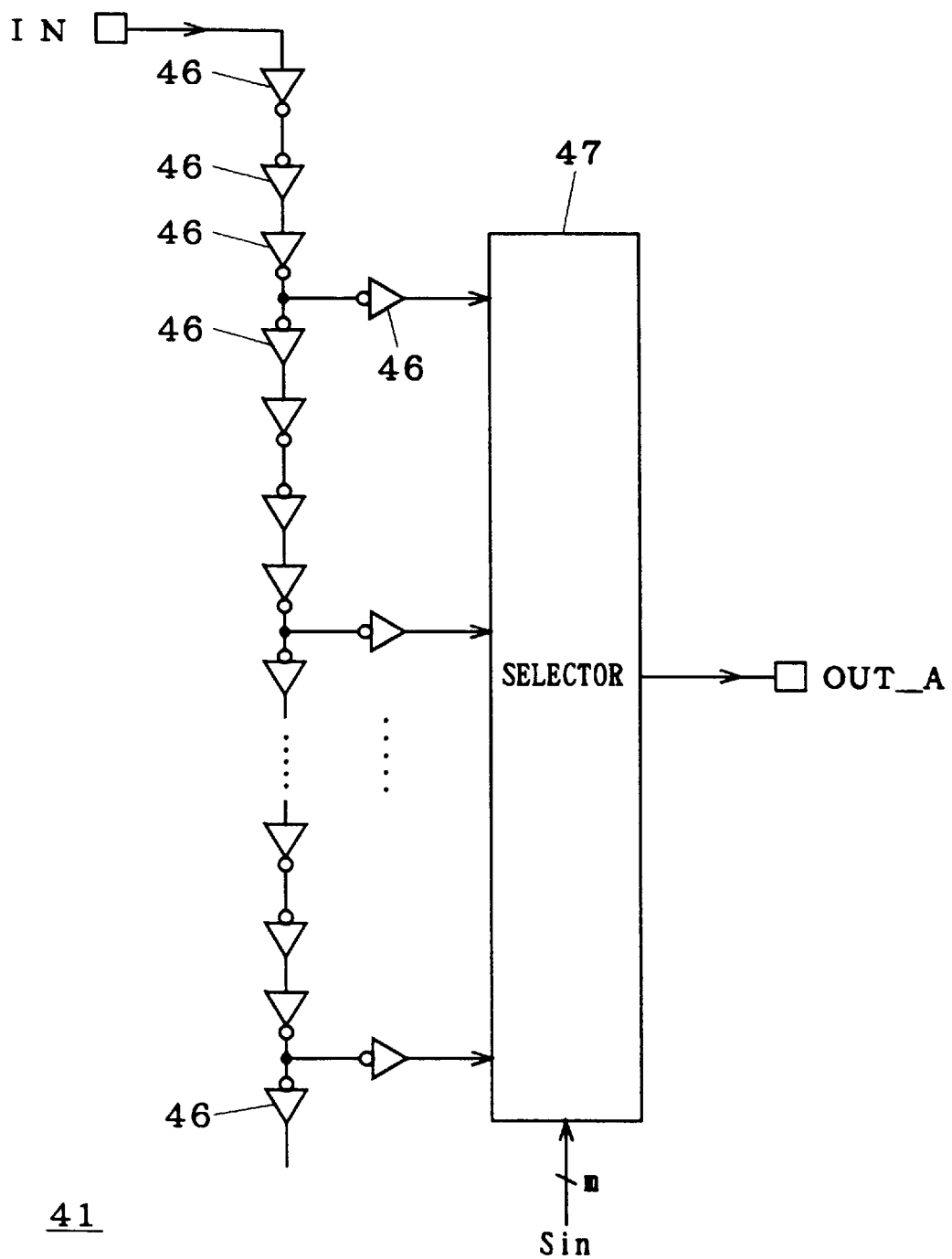
FIG. 8 is a block diagram showing a first variable delay circuit according to the third embodiment of the present invention.

FIG. 8 is a circuit diagram showing the structure of the first variable delay circuit 41. As shown in FIG. 8, the first variable delay circuit 41 is formed by a combination of a selector 47 and inverters 46. An input clock IN is sent to the first stage of the inverters 46 (each being unit delay element: a CMOS inverter circuit in this example) which are cascade-connected. Every time the input clock IN passes through the inverter 46, a delay quantity is added by the propagation delay time of the inverter 46.

In the process for fineness which has recently been performed, the propagation delay time of the inverter 46 has a small value of 0.1 to 0.2 nsec. Consequently, it is possible to obtain a resolution which is sufficient for the first variable delay circuit 41 used for the waveform shaping device 502.

Outputs are drawn and led as a signal string to the multiinput terminal of the selector 47 every constant number (an even number: 4 in the example of FIG. 8) of the inverters 46 which are cascade-connected. In the example shown in FIG. 8, these outputs are inputted to the selector 47 through one of the inverters 46 so as to be led to the first variable delay circuit 41 with the same logic (positive and negative signs are non-inverted) as that of the input clock IN.

The selector 47 selects one of clocks, which are inputted to the multiinput terminal and have delay quantities varied by a constant time, that is specified by the control signal Sin inputted as a selection signal, and outputs the selected clock as an output clock OUT_A. For example, a clock having a smaller delay quantity is selected and outputted as the numeric value of the control signal Sin is increased. Thus, the first variable delay circuit 41 includes a fixed delay circuit formed by the inverters 46, and the selector 47.

Figure 9:
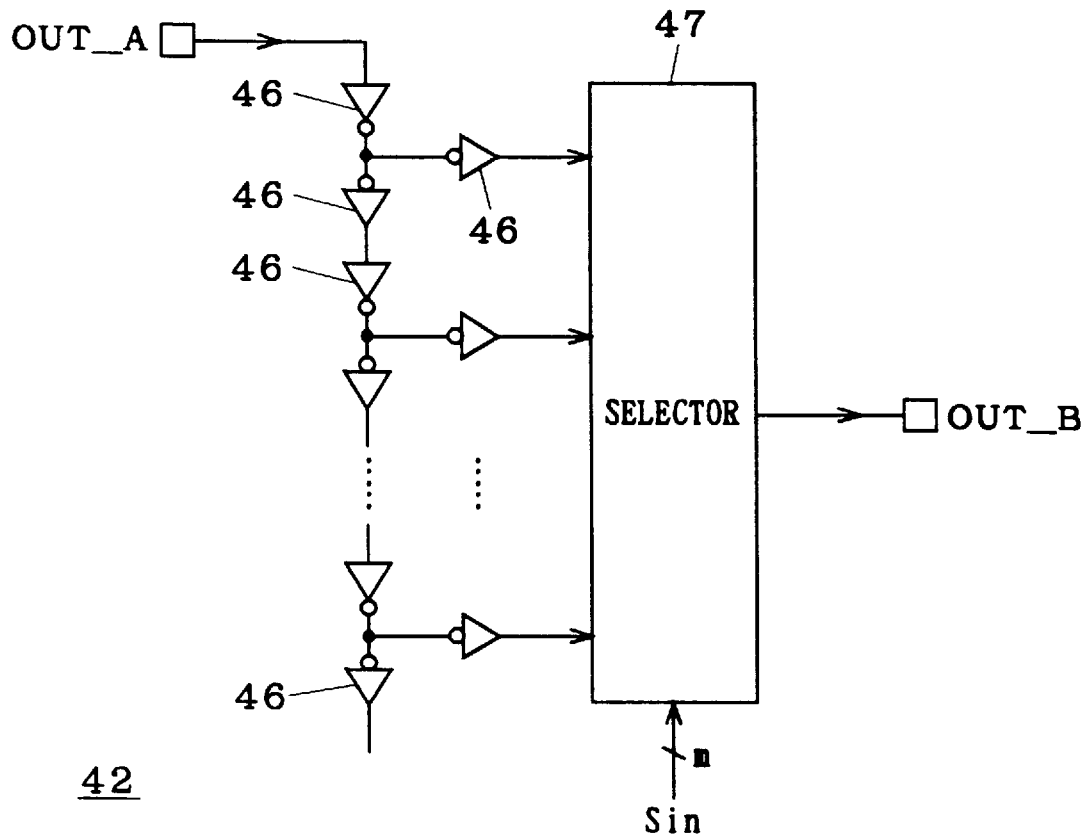
FIG. 9 is a block diagram showing a second variable delay circuit according to the third embodiment of the present invention.

FIG. 9 is a circuit diagram showing the structure of the second variable delay circuit 42. Similarly to the first variable delay circuit 41, the second variable delay circuit 42 also includes a fixed delay circuit formed by the inverters 46, and the selector 47. However, outputs are drawn to the selector 47 every half (an even number: 2 in an example of FIG. 9) the inverters 46 of the first variable delay circuit 41.

The second variable delay circuit 42 has a structure in which the delay quantity of the clock inputted to the multiinput terminal of the selector 47 is half of that of the first variable delay circuit 41. Accordingly, the delay quantities of the first variable delay circuit 41 and the second variable delay circuit 42 always meet the relationship of Formula 1 for the value of the same control signal Sin.

As described above, the first variable delay circuit 41 and the second variable delay circuit 42 of the waveform shaping device 503 are formed by digital circuits for processing only digital signals. Consequently, the relationship of Formula 1 is precisely established and excellent linearity can be obtained between the delay quantity and the control signal Vin. Since the digital signal is to be processed, the problem that jitter is caused by superposing electrical noises on a bias wiring can be solved or eased. Thus, it is possible to implement a device which is hardly influenced by the electrical noises.

In the manufacturing process, a standard cell library which is usually prepared for the digital circuit can be utilized effectively. Consequently, the manufacturing process can be simplified.

3-3. Variable Delay Circuit: Part 2

Figure 10:
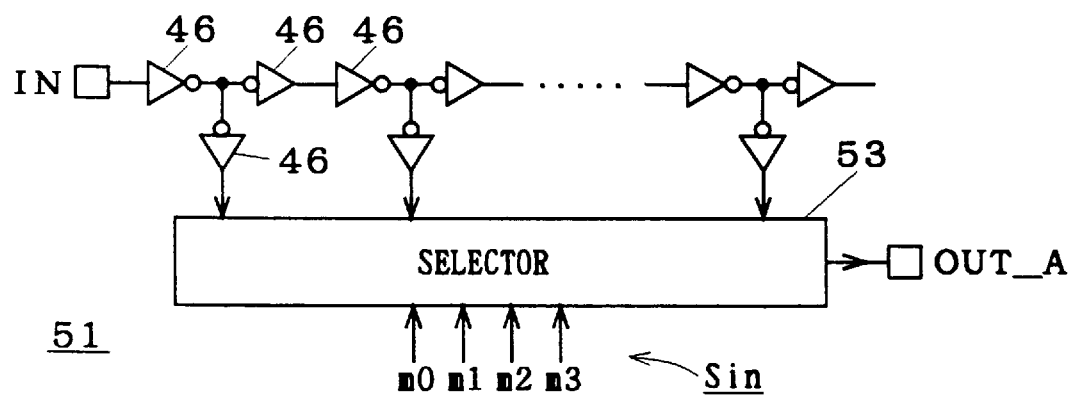
FIG. 10 is a block diagram showing another example of the first variable delay circuit according to the third embodiment of the present invention.

FIGS. 10 and 11 are circuit diagrams showing other examples of the structures of first and second variable delay circuits, respectively. First and second variable delay circuits 51 and 52 are also formed by a combination of inverters 46 and a selector 53. The first and second variable delay circuits 51 and 52 characteristically differ from the first and second variable delay circuits 41 and 42 in that the relationship in the variable delay circuit 52 between the selector 53 and the inverters 46 which are cascade-connected is identical with that in the variable delay circuit 51.

All bit signals which form a control signal Sin as a selection signal are inputted to the selector 53 of the first variable delay circuit 51. On the other hand, the most significant bit of the control signal Sin is not sent to the selector 53 of the second variable delay circuit 52 but the rest are shifted by 1 bit and sent thereto. The least significant bit of the control signal Sin is not used but discarded.

It is conditioned that the control signal Sin is sent by an AD converter 45 in conformity with binary numbers and sent as a parallel signal in the first and second variable delay circuits 51 and 52. Accordingly, the selection signal inputted to the selector 53 of the second variable delay circuit 52 corresponds to a value which is obtained by shifting, by 1 bit, the selection signal inputted to the selector 53 of the first variable delay circuit 51, that is, a value obtained by dividing the value of the selection signal by 2. Consequently, the delay quantity of the second variable delay circuit 52 is always half of that of the first variable delay circuit 51.

The first and second variable delay circuits 51 and 52 have just the same structure except for the connecting relationship between a selection signal terminal and a control signal line 48 (FIG. 7) for sending the control signal Sin. Consequently, the process for manufacturing a device can be simplified more. In particular, the efficiency on the design stage in the manufacturing process, that is, a design efficiency can be increased.

4. Fourth Embodiment

FIG. 12 is a block diagram showing an example in which the control portion 43 of the waveform shaping device 503 is formed by a digital circuit for performing only digital signal processing. In FIG. 12, the reference numeral 55 designates a D latch, the reference numeral 56 designates a first counter, the reference numeral 57 designates a second counter and the reference numeral 58 designates an inverter.

In the control portion 43, the simple D latch 55 is used in place of the phase comparator 15 provided in the waveform shaping device 502. The D latch 55 latches the value of an output clock OUT_A inputted to a data input terminal synchronously with an input clock IN sent to a clock input terminal.

Figure 13:
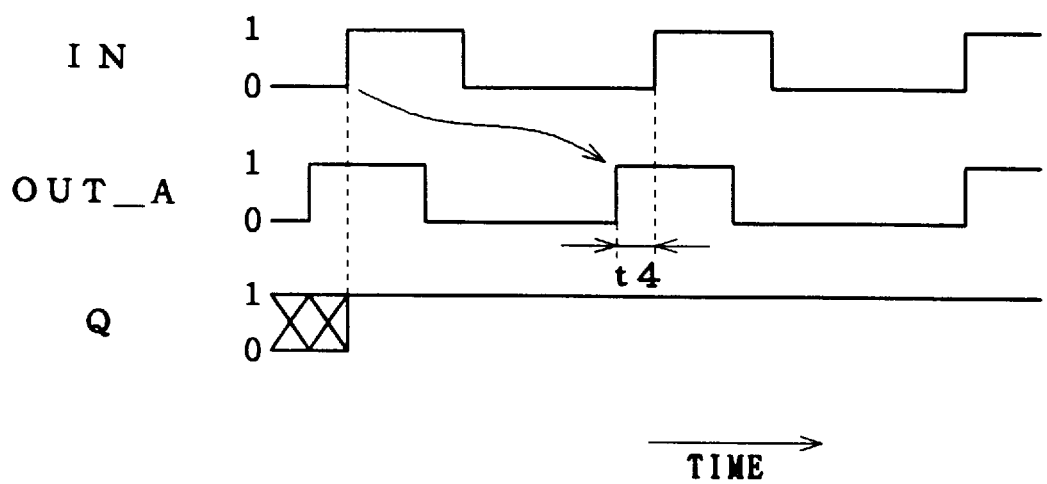
FIG. 13 is a timing chart of the waveform shaping device according to the fourth embodiment of the present invention.
Figure 14:
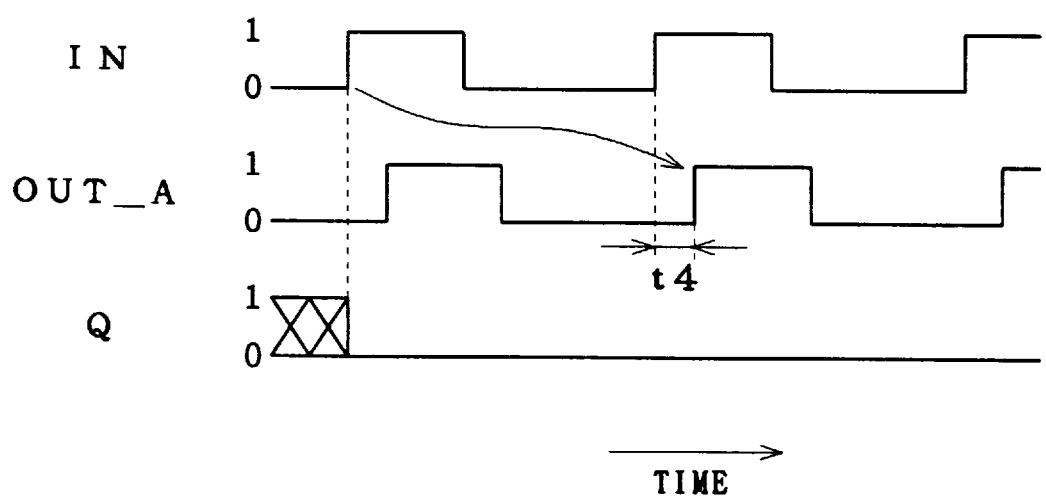
FIG. 14 is a timing chart of the waveform shaping device according to the fourth embodiment of the present invention.

FIGS. 13 and 14 are timing charts for explaining the operation of the D latch 55. As shown in FIG. 13, when the delay quantity of the output clock OUT_A for the input clock IN is smaller than a cycle T by a time t4, that is, less than the cycle T, the output of a non-inverted output terminal Q of the D latch 55 is set to a value of "1" synchronously with the leading edge of the input clock IN irrespective of the last value. It is apparent that the output of an inverted output terminal Q* is also set to a value of "0" at the same time.

As shown in FIG. 14, when the delay quantity is greater than the cycle T by the time t4, that is, exceeds the cycle T, the output of the non-inverted output terminal Q is set to a value of "0" synchronously with the leading edge of the input clock IN irrespective of the last value. In other words, when the delay quantity does not reach the cycle T, the non-inverted output terminal Q continuously outputs a value of "1". When the delay quantity exceeds the cycle T, the non-inverted output terminal Q continuously outputs a value of "0".

With reference to FIG. 12 again, the first and second counters 56 and 57 are formed as updown type counters. The first counter 56 is connected to the D latch 55 through the inverter 58 for logic adjustment in such a manner that an up terminal UP and a down terminal DWN become active when the non-inverted output terminal Q and the inverted output terminal Q* of the D latch 55 are active ("1" for the former, and "0" for the latter).

The first counter 56 continuously performs count-up synchronously with the input clock IN sent to the clock terminal during a period in which the up terminal UP is active. An active value (for example, a value of "1") is outputted from an overflow terminal OVR every overflow.

On the contrary, the first counter 56 continuously performs count-down synchronously with the input clock IN sent to the clock terminal during a period in which the down terminal DWN is active. An active value is outputted from an underflow terminal UND every underflow. In other words, the first counter 56 continuously performs count-up when the delay quantity of the first variable delay circuit 41 is less than the cycle T, and the first counter 56 continuously performs count-down when the delay quantity of the first variable delay circuit 41 exceeds the cycle T. Every constant period corresponding to a constant multiple of the cycle T, an active signal is outputted from the overflow terminal OVR or the underflow terminal UND.

The second counter 57 is connected to the first counter 56 through the inverter 58 for logic adjustment in such a manner that an up terminal UP and a down terminal DWN become active when the overflow terminal OVR and the underflow terminal UND of the first counter 56 are active. The input clock IN is inputted to the clock terminal of the second counter 57. The counted numeric value is sent as a control signal Sin to the first variable delay circuit 41 and the second variable delay circuit 42 (FIG. 7).

Accordingly, the value of the control signal Sin is increased by "1" synchronously with the input clock IN every time the first counter 56 overflows, and the value of the control signal Sin is decreased by "1" synchronously with the input clock IN every time the first counter 56 underflows. While the delay quantity of the first variable delay circuit 41 does not reach the cycle T, the control signal Sin is continuously increased by "1" every constant period. While the delay quantity exceeds the cycle T and is excessive, the control signal Sin is continuously decreased by "1" every constant period. As described above, the device shown in FIG. 12 has the same function as that of the control portion 43 of the waveform shaping device 503 (FIG. 7).

When using this device as the control portion 43, the first variable delay circuit 41 and the second variable delay circuit 42 are formed in such a manner that their delay quantities are increased as the control signal Sin becomes greater, which an be achieved easily by setting the relationship between the selector 47 and the inverter 46 so as to select a clock having a smaller delay quantity if the control signal Sin is greater in FIGS. 8 and 9, for example.

In FIG. 12, the input clock IN inputted to the D latch 55 may be replaced with the output clock OUT_A. If other device portions are not changed, the control signal Sin is increased when the delay quantity of the first variable delay circuit 41 is excessive, and the control signal Sin is decreased when the delay quantity of the first variable delay circuit 41 is insufficient. In this case, it is ideal that the relationship between the selector 47 and the inverter 46 is set in such a manner that a clock having a greater delay quantity is selected when the control signal Sin is greater in FIGS. 8 and 9, for example.

It is also possible to freely set the relationship between the delay quantity and the direction of the change of the control signal Sin by regulating the number (including a value of "0") of the inverters 58 which adjust the logic between the D latch 55 and the first counter 56.

In the device shown in FIG. 12, all elements of the control portion 43 (FIG. 7) including a loop filter 17 which is formed by an analog circuit and has the comparatively great layout area are replaced with digital circuits. Consequently, the device shown in FIG. 12 has an advantage that the layout area can be reduced to make the device small-sized. At the same time, the device shown in FIG. 12 is hardly influenced by electrical noises because the digital signal is to be processed.

5. Fifth Embodiment

Figure 15:
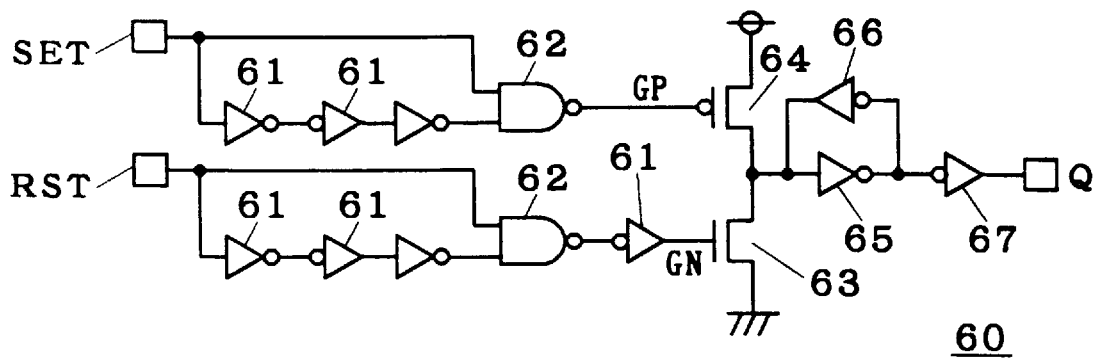
FIG. 15 is a block diagram showing an SR flip-flop according to a fifth embodiment of the present invention.

FIG. 15 is a circuit diagram showing the structure of an SR flip-flop suitable for the SR flip-flop 14 of the waveform shaping devices 502 and 503. In FIG. 15, the reference numeral 60 designates an SR flip-flop according to the present embodiment, the reference numerals 61, 65, 66 and 67 designate inverters, the reference numeral 62 designates a NAND circuit, the reference numeral 63 designates an NMOS transistor, the reference numeral 64 designates a PMOS transistor, GN designates a gate voltage inputted to the gate electrode of the NMOS transistor 63, and GP designates a gate voltage inputted to the gate electrode of the PMOS transistor 64.

The inverter 66 is set to have smaller driving force (that is, a higher output resistance) than that of the MOS transistors 63 and 64. In other words, the outputs of the MOS transistors 63 and 64 precede the output of the inverter 66. In the SR flip-flop 60, the gate electrodes of the MOS transistors 63 and 64 which are connected in series between a high potential power line and a ground voltage power line are connected to a set terminal SET and a reset terminal RST through a one-shot pulse generating circuit formed by the inverter 61 and the NAND circuit 62, respectively. The connecting portion of the MOS transistors 63 and 64 is connected to the inverters 65 and 66 forming a memory. A signal held by the memory is outputted to a non-inverted output terminal Q through the inverter 67.

Figure 16:
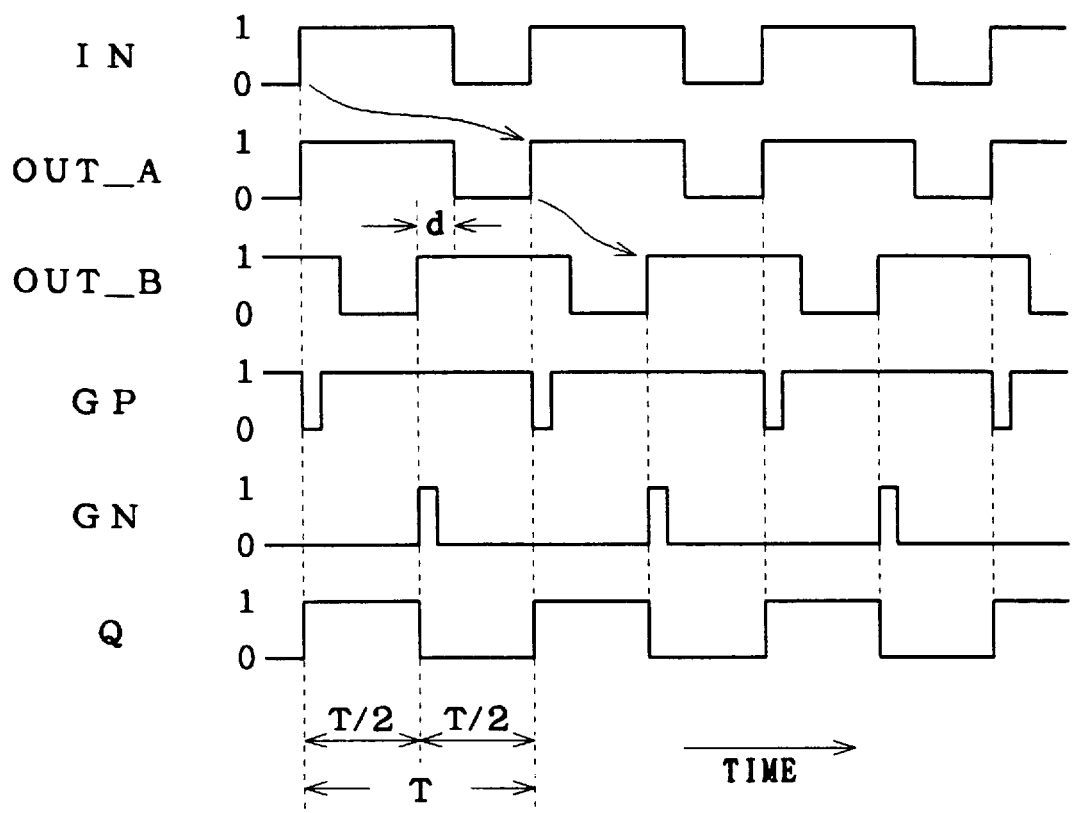
FIG. 16 is a timing chart of a waveform shaping device according to the fifth embodiment of the present invention.

FIG. 16 is a timing chart for explaining the operation of the waveform shaping device 502 in which the SR flip-flop 60 is incorporated as the SR flip-flop 14. FIG. 16 shows the operation performed when the first variable delay circuit 11 provided in the waveform shaping device 502 is in the stable locking state.

As shown in FIG. 16, when the duty ratio of an input clock IN exceeds 50%, both the set terminal SET and the reset terminal RST of the SR flip-flop 14 have a value of "1" over a period d for each cycle T. Similarly, there is a case where the value of "1" is simultaneously inputted to two terminals of the SR flip-flop 14 for a transient period to move to the stable locking state even though the duty ratio of the input clock IN is less than 50%.

In such a case, the output of an ordinary SR flip-flop is undefined. Accordingly, the ordinary SR flip-flop is not suitable for the SR flip-flop 14 of the waveform shaping device 502. For this reason, a reset priority SR flip-flop is used for the SR flip-flop 14 of the waveform shaping device 502 as described in the second embodiment. On the other hand, the SR flip-flop 60 according to the present embodiment solves the problems caused by the fact that two inputs have a value of "1" by adding a one-shot pulse circuit. Consequently, the SR flip-flop 60 is suitable for the SR flip-flop 14.

As shown in FIG. 16, a one-shot pulse having a value of "0" is inputted to the gate electrode of the PMOS transistor 64 synchronously with the leading edge of the output clock OUT_A inputted to the set terminal SET. By the one-shot pulse having a gate voltage GP, the PMOS transistor 64 is turned on for a moment. As a result, the value held by the memory which is formed by the inverters 65 and 66 is updated and a value of "1" is held by the non-inverted output terminal Q.

An output clock OUT_B inputted to the reset terminal RST rises after T/2 since the leading edge of the input clock IN. A one-shot pulse having a value of "1" is inputted to the gate electrode of the NMOS transistor 63 synchronously with the leading edge of the output clock OUT_B. By the one-shot pulse having a gate voltage GN, the NMOS transistor 63 is turned on for a moment. As a result, the value held by the memory which is formed by the inverters 65 and 66 is updated and a value of "0" is held by the non-inverted output terminal Q. Subsequently, the same operation is repeated. As a result, the values "1" and "0" are alternately outputted to the non-inverted output terminal Q every T/2. Thus, the SR flip-flop 60 operates without hindrance even though the value of "1" is simultaneously inputted to the two input terminals. Consequently, the SR flip-flop 60 is suitable for the SR flip-flop 14 of the waveform shaping device 502. Furthermore, the SR flip-flop 60 also has advantages that the number of elements is comparatively small and operation is performed at a higher speed.

6. Sixth Embodiment

Figure 17:
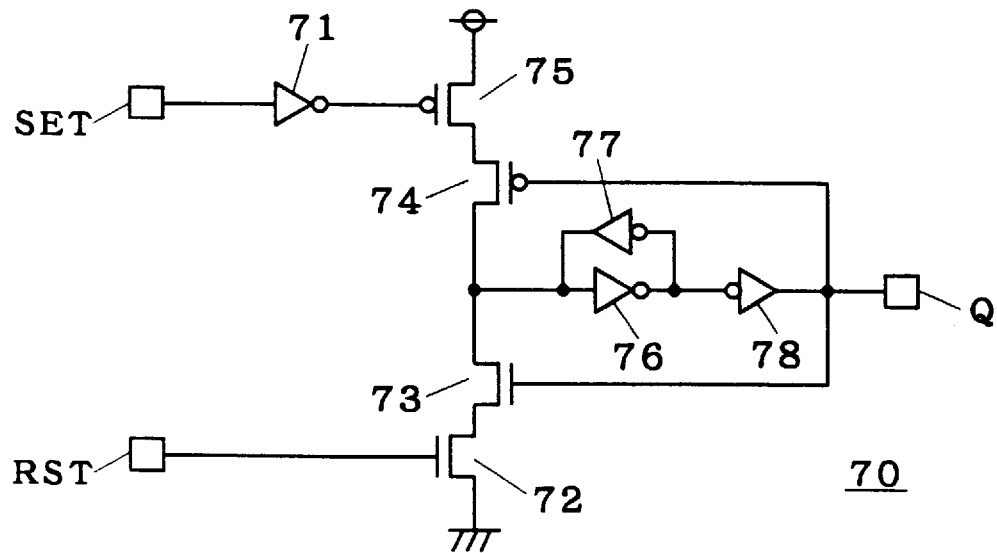
FIG. 17 is a block diagram showing an SR flip-flop according to a sixth embodiment of the present invention.

FIG. 17 is a circuit diagram showing the structure of another SR flip-flop suitable for the SR flip-flop 14 of the waveform shaping devices 502 and 503. In FIG. 17, the reference numeral 70 designates an SR flip-flop according to the present embodiment, the reference numerals 71, 76, 77 and 78 designate inverters, the reference numerals 72 and 73 designates NMOS transistors, and the reference numerals 74 and 75 designate PMOS transistors. The inverter 77 is set to have smaller driving force than that of the MOS transistors 72 to 75.

In the SR flip-flop 70, the MOS transistors 75 to 72 are connected between a high potential power line and a ground potential power line in series in this order. A set terminal SET is connected to the gate electrode of the PMOS transistor 75 through the inverter 71, and a reset terminal RST is connected to the gate electrode of the NMOS transistor 72.

The connecting portion of the MOS transistors 73 and 74 is connected to the inverters 76 and 77 forming a memory. A signal held by the memory is outputted to a non-inverted output terminal Q through the inverter 78. Furthermore, the output signal of the non-inverted output terminal Q is fed back to the gate electrodes of the MOS transistors 73 and 74 in common.

The SR flip-flop 70 operates in the following manner. It is assumed that the non-inverted output terminal Q has a value of "0" at the beginning. At this time, the PMOS transistor 74 connected to the non-inverted output terminal Q is on and the NMOS transistor 73 is off. At the same time that a pulse having a value of "1" is inputted to the set terminal SET, the signal of the connecting portion of the MOS transistors 73 and 74, that is, a signal inputted to the memory is changed to have a value of "1". As a result, the value of the non-inverted output terminal Q is also changed to "1".

Once the value of the non-inverted output terminal Q is set to "1", the PMOS transistor 74 is turned off and the NMOS transistor 73 is turned on. Consequently, the value of the non-inverted output terminal Q is not changed even though a pulse having a value of "1" is then inputted to the set terminal SET. In this case, when the pulse having a value of "1" is inputted to the reset terminal RST, the NMOS transistor 72 is turned on so that a value held by the memory is inverted. As a result, the value of the non-inverted output terminal Q is also inverted to "0".

Once the value of the non-inverted output terminal Q is set to "0", the PMOS transistor 74 is turned on and the NMOS transistor 73 is turned off. Consequently, the value of the non-inverted output terminal Q is not changed even though the pulse having a value of "1" is then inputted to the reset terminal RST. As described above, the SR flip-flop 70 functions as an SR flip-flop which is set at the leading edge of a pulse inputted to the set terminal SET and is reset at the leading edge of a pulse inputted to the reset terminal RST.

When the value of "1" is simultaneously inputted to the set terminal SET and the reset terminal RST, the value of the non-inverted output terminal Q is logically inverted and transmitted to the input of the memory. Consequently, oscillation is performed with values of "1", "0", "1", "0", . . . in a cycle which is about twice as much as the delay time for three elements inserted in a feedback loop. At this time, the SR flip-flop 70 operates as if it is a kind of asynchronous T flip-flop. In other words, the SR flip-flop 70 is a form of a general purpose asynchronous JK flip-flop.

Figure 18:
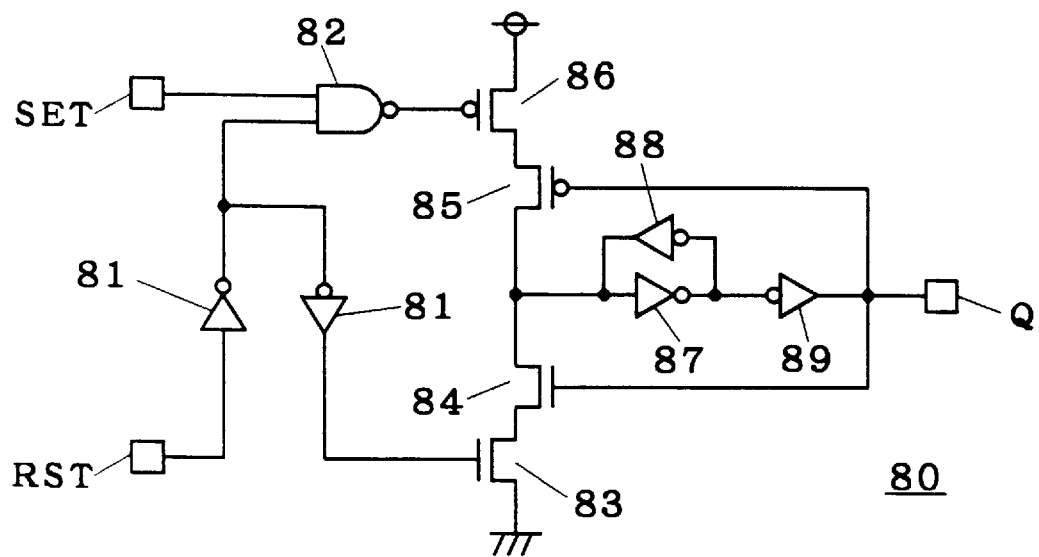
FIG. 18 is a block diagram showing the SR flip-flop according to the sixth embodiment of the present invention.

The SR flip-flop 70 can be changed to a reset priority SR flip-flop by adding an element thereto. FIG. 18 shows an example. In an SR flip-flop 80 shown in FIG. 18, the inverter 71 of the SR flip-flop 70 is replaced with a NAND circuit 82, and a reset terminal RST is connected to one of two inputs of the NAND circuit 82 through an inverter 81. The output of the inverter 81 connected to the reset terminal RST is connected to the gate electrode of an NMOS transistor 83 through another inverter 81.

Thus, it is possible to obtain the reset priority SR flip-flop by adding a simple logic circuit to the SR flip-flop 70.

7. Seventh Embodiment

Figure 19:
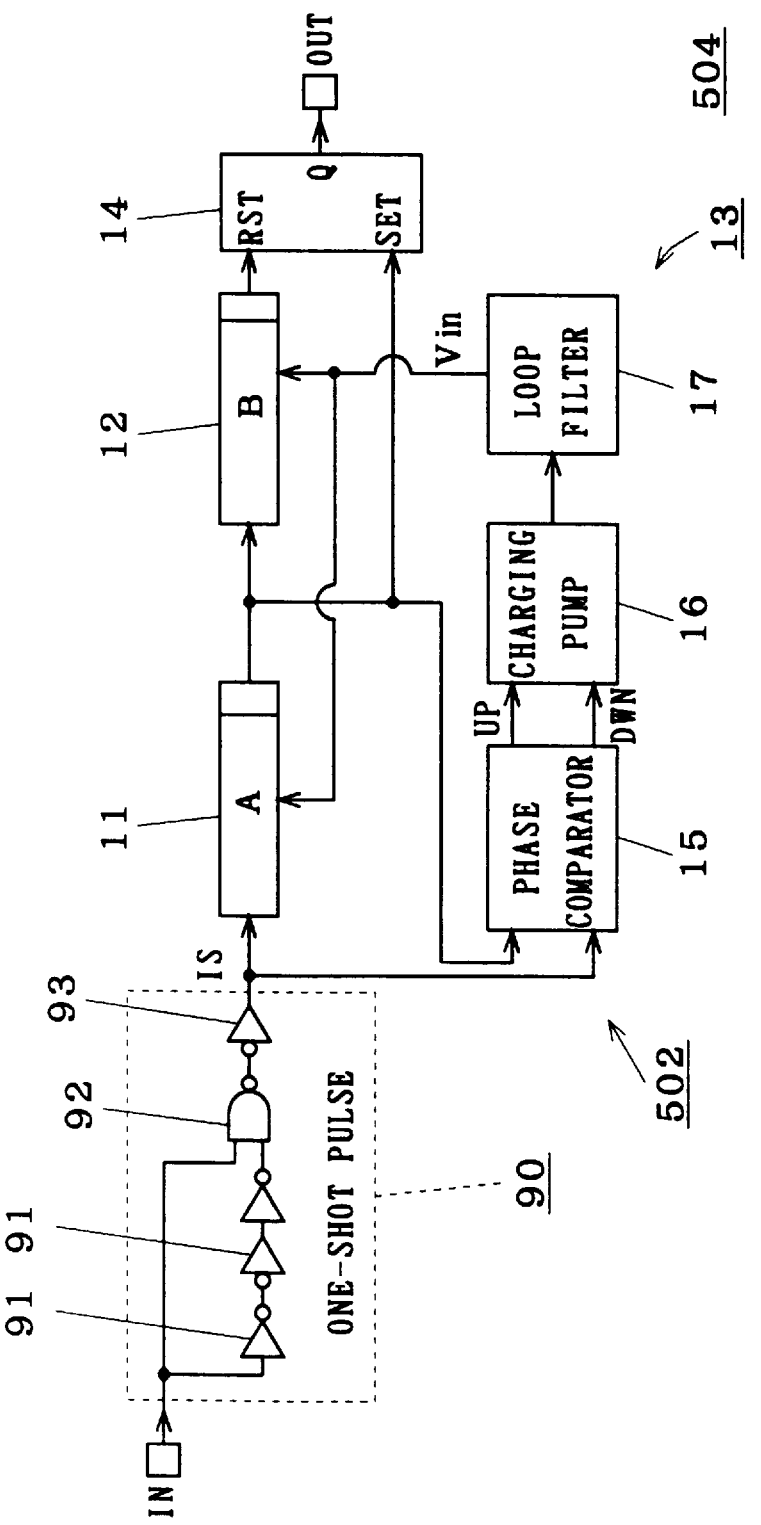
FIG. 19 is a block diagram showing a waveform shaping device according to a seventh embodiment of the present invention.

FIG. 19 is a block diagram showing the structure of a waveform shaping device according to a seventh embodiment. A waveform shaping device 504 has a one-shot pulse circuit 90 inserted between an input terminal for receiving an input clock IN and a waveform shaping device 502.

The one-shot pulse circuit 90 is formed by a combination of inverters 91 and 93 and a NAND circuit 92 as shown in FIG. 19. In other words, the one-shot pulse circuit 90 has the same structure as that of the one-shot pulse circuit shown in FIG. 15. By the operation of the one-shot pulse circuit 90, an input signal IS sent to a first variable delay circuit 11 and a phase comparator 15 is not the input clock IN itself but a one-shot pulse which is outputted synchronously with the input clock IN and has a sufficiently small duty ratio.

Figure 20:
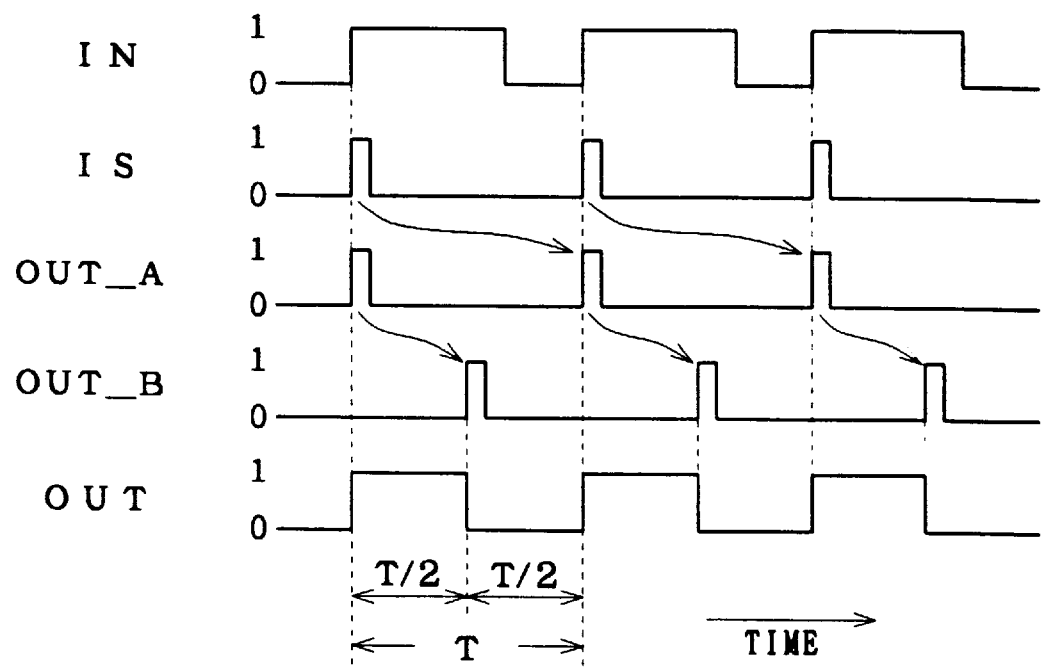
FIG. 20 is a timing chart of the waveform shaping device according to the seventh embodiment of the present invention.

FIG. 20 is a timing chart for explaining the operation of the waveform shaping device 504. The input signal IS is changed to a one-shot pulse which rises synchronously with the leading edge of the input clock IN and has a small duty ratio irrespective of the duty ratio of the input clock IN. As a result, an output clock OUT_A is obtained by delaying the input signal IS.

Similarly, an output clock OUT_B is obtained by further delaying the output clock OUT_A. FIG. 20 illustrates the stable locking state. Consequently, the output clock OUT_A is delayed from the input signal IS by a cycle T, and the output clock OUT_B is delayed by another T/2. Since the output clocks OUT_A and OUT_B keep the same waveform as that of the input signal IS, their duty ratios are sufficiently small.

Accordingly, bad effects produced by the fact that a set terminal SET and a reset terminal RST of an SR flip-flop 14 are set to have a value of "1" are eliminated. In other words, it is possible to use an ordinary and inexpensive SR flip-flop as the SR flip-flop 14 without using a reset priority SR flip-flop.

In the case where two inputs of the SR flip-flop 14 of the waveform shaping device 502 are not high-active (they operate at the leading edge to a value of "1") but low-active, it is sufficient that the one-shot pulse circuit outputs a one-shot pulse which is obtained by inverting the logic of the input clock IN. For example, it is ideal that a two-stage inverter is inserted in place of the inverter 93 in FIG. 19.

8. Eighth Embodiment

Figure 21:
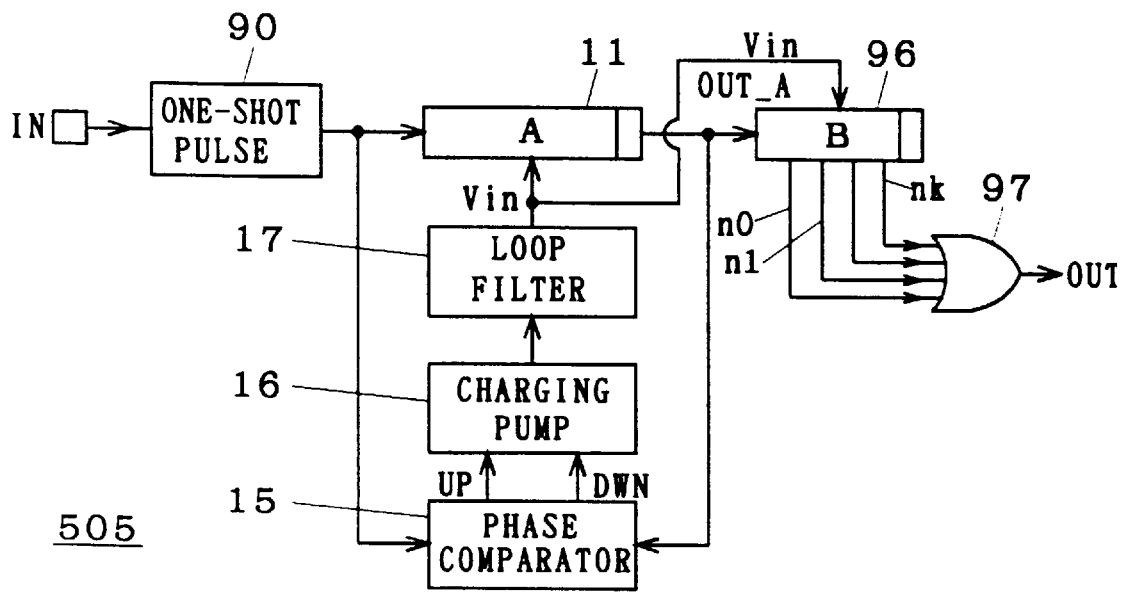
FIG. 21 is a block diagram showing a waveform shaping device according to an eighth embodiment of the present invention.

FIG. 21 is a block diagram showing the structure of a waveform shaping device according to an eighth embodiment. A waveform shaping device 505 is formed as a duty ratio recovering device, and has a structure in which an output clock OUT having a duty ratio of 50% can be obtained without using the SR flip-flop 14.

In FIG. 21, the reference numeral 96 designates a second variable delay circuit of a multioutput type, n0, n1, . . . , nk designate a plurality of output signals of the second variable delay circuit 96, and the reference numeral 97 designates an OR circuit of a multiinput type. In the waveform shaping device 505, the second variable delay circuit 12 of the waveform shaping device 504 is replaced with the second variable delay circuit 96. In addition, the SR flip-flop 14 is replaced with the OR circuit 97. The outputs n0, n1, . . . , nk of the second variable delay circuit 96 are inputted to the multiinput terminal of the OR circuit 97. The output signal of the OR circuit 97 is outputted as an output clock OUT to the outside.

Figure 22:
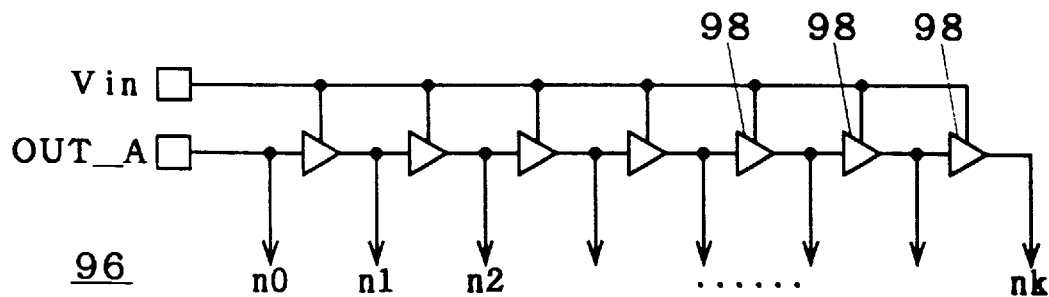
FIG. 22 is a block diagram showing a second variable delay circuit according to the eighth embodiment of the present invention.

FIG. 22 is a circuit diagram showing the structure of the second variable delay circuit 96. The second variable delay circuit 96 is provided with a lot of unit delay circuits 98 which are cascade-connected. An output clock OUT_A is inputted to the unit delay circuit 98 on a first stage. The output clock OUT_A is outputted as the output signal n0, and the outputs of the unit delay circuits 98 provided from the next stage to a final stage are outputted as the output signals n1, n2, . . . , nk. The delay quantity of the output nk on the final stage for the output clock OUT_A is set half of that of a first variable delay circuit 11.

Figure 23:
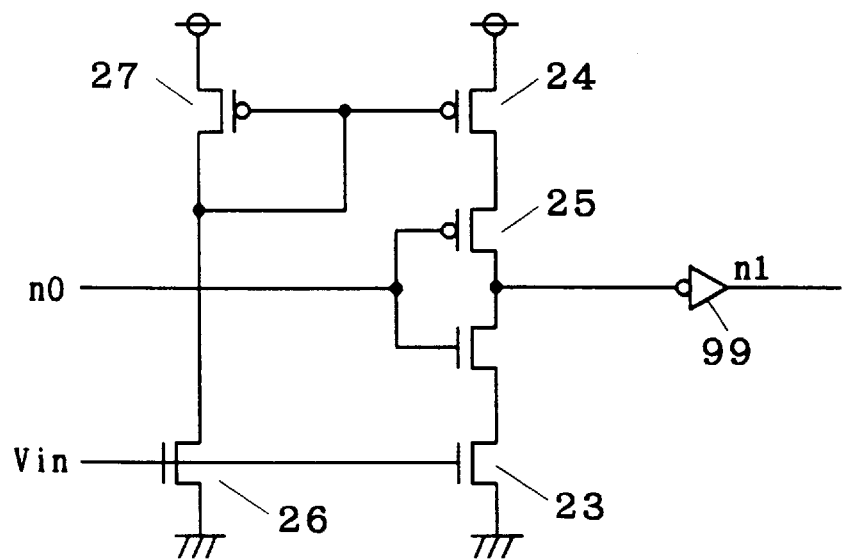
FIG. 23 is a block diagram showing an inverter according to the eighth embodiment of the present invention.

FIG. 23 is a circuit diagram showing the structure of the unit delay circuit 98. One of the unit delay circuits of the variable delay circuit 20 (FIG. 5) is combined with a bias circuit portion 21 in the unit delay circuit 98. Furthermore, an inverter 99 is connected to the output side in order to cause the logic of an input signal (for example, n0) to be coincident with that of an output signal (for example, n1).

Figure 24:
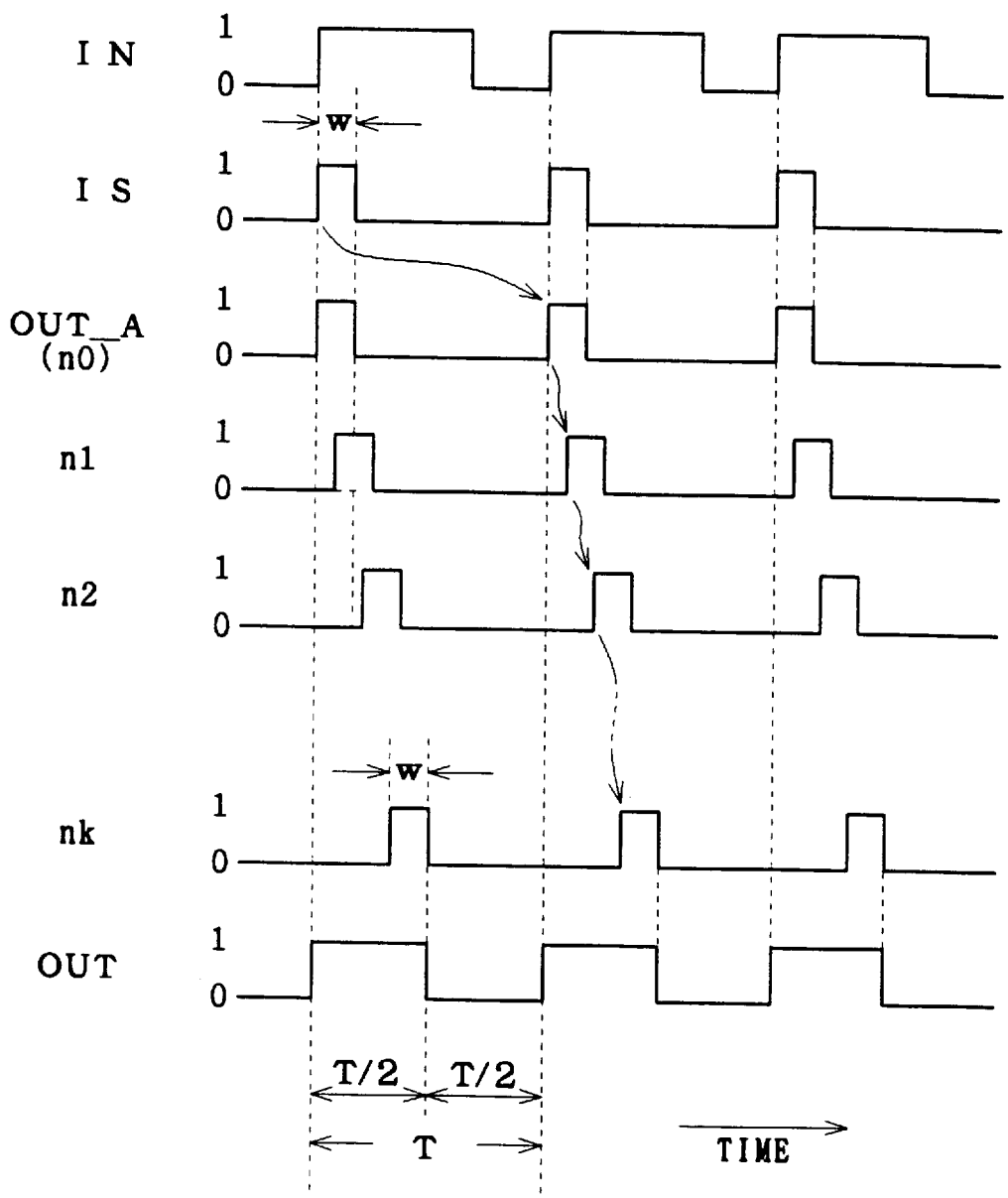
FIG. 24 is a timing chart of the waveform shaping device according to the eighth embodiment of the present invention.

FIG. 24 is a timing chart for explaining the operation of the waveform shaping device 505. FIG. 24 shows the signal waveform of each portion obtained when the first variable delay circuit 11 is in the stable locking state. By the operation of a one-shot pulse circuit 90, an input signal IS which rises synchronously with the input clock IN and has a sufficiently small pulse width w is inputted to the first variable delay circuit 11 and a phase comparator 15. Since the first variable delay circuit 11 is in the locking state, the phase of the output clock OUT_A is apparently (equivalently) coincident with that of the input signal IS.

The output signals n1, n2, . . . , nk of the second variable delay circuit 96 are sequentially delayed by a constant time. It is desirable that the pulse width w should be set as small as possible. Actually, the pulse width w is set to the range in which the delay quantity of the unit delay circuit on a stage is always smaller than the pulse width w including the transient operation performed before locking. For this reason, the output clock OUT obtained as OR of the output signals n1, n2, . . . , nk has a value of "1" from the leading edge of the output clock OUT_A to the trailing edge of the output signal nk on the final stage.

Since the delay quantity of the output signal nk on the final stage is set half of that of the first variable delay circuit 11, the delay quantity of the output signal nk on the final stage is T/2 in the state where the first variable delay circuit 11 is locked. For this reason, the output clock OUT has a value of "1" over a period of T/2. In other words, the output clock OUT has a duty ratio of 50%.

If the pulse width w is not much smaller than the cycle T, the duty ratio is a little shifted from 50% depending on the pulse width w. However, the number of the output signals n1, n2, . . . , nk is set fully great. Accordingly, the pulse width w can also be set smaller. For this reason, the shift of the duty ratio of the output clock OUT can be ignored in the form of ordinary use.

In order to compensate for the slight shift, it is sufficient that the relationship between the pulse width w of the one-shot pulse circuit 90 and the number of stages of the unit delay circuit of the second variable delay circuit 96 is adjusted in such a manner that the delay quantity of the output signal nk for the output clock OUT_A which is obtained during locking is equal to (T/2−w).

9. Ninth Embodiment

Figure 25:
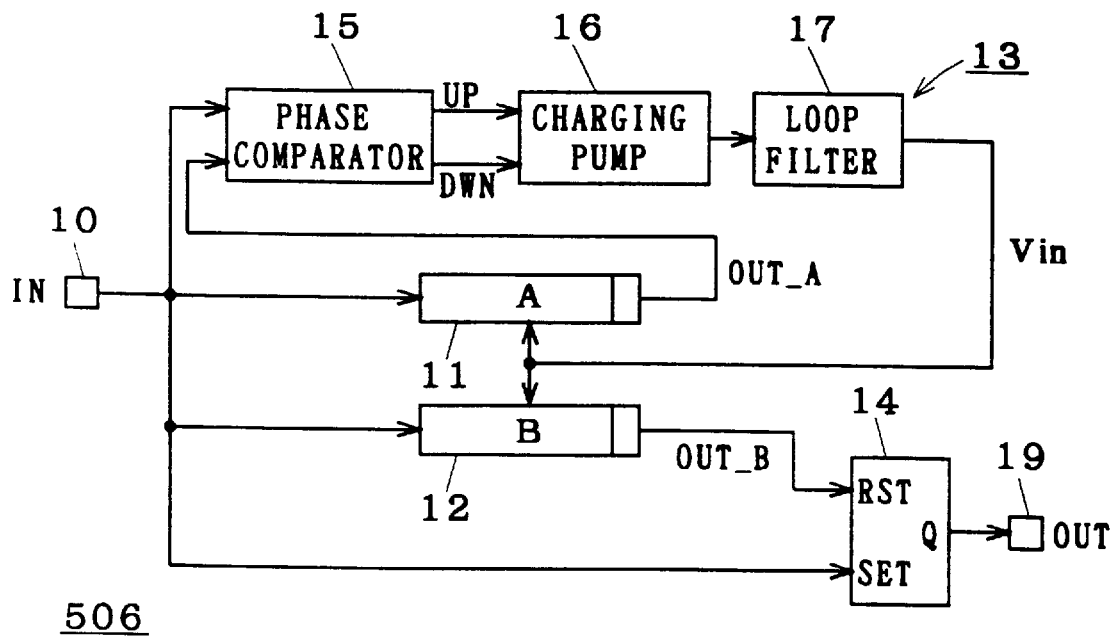
FIG. 25 is a block diagram showing a waveform shaping device according to a ninth embodiment of the present invention.

FIG. 25 is a block diagram showing the structure of a waveform shaping device according to a ninth embodiment. A waveform shaping device 506 is also formed as a duty ratio recovering device. The waveform shaping device 506 characteristically differs from the waveform shaping device 502 (FIG. 1) in that an input clock IN is directly inputted to a second variable delay circuit 12 in place of an output clock OUT_A.

Figure 26:
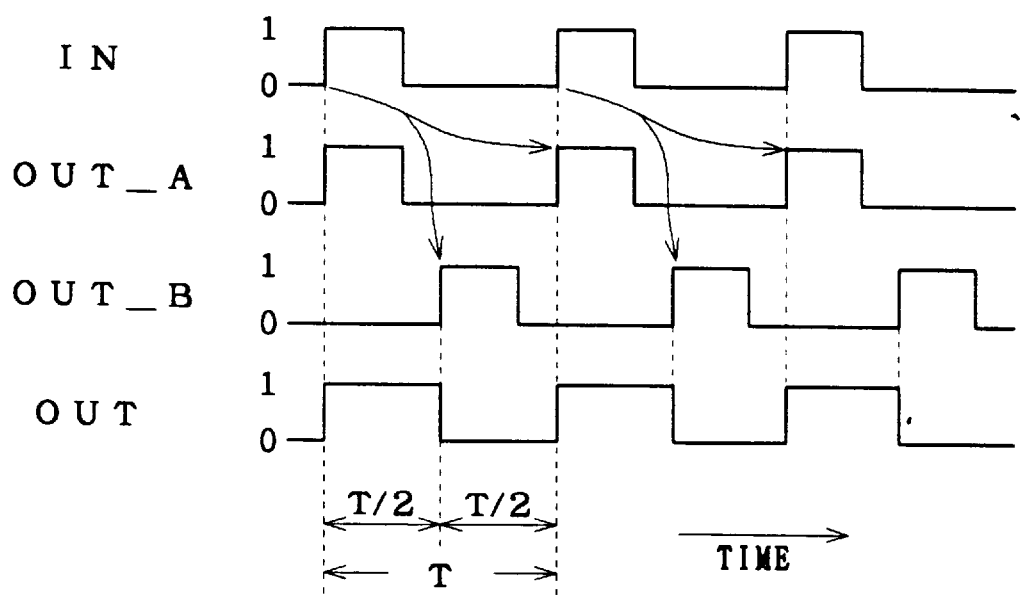
FIG. 26 is a timing chart of the waveform shaping device according to the ninth embodiment of the present invention.

FIG. 26 is a timing chart for explaining the operation of the waveform shaping device 506 as an example in which a first variable delay circuit 11 is locked. Since the first variable delay circuit 11 is locked, the output clock OUT_A is delayed from the input clock IN by a cycle T. An output clock OUT_B is delayed from the input clock IN by half of the delay time of the first variable delay circuit 11, that is, T/2.

In an SR flip-flop 14, the value of a reset terminal RST rises after T/2 since the value of a set terminal SET has risen. For this reason, a clock having a duty ratio of 50% is outputted as an output clock OUT from a non-inverted output terminal Q of the SR flip-flop 14.

As described above, the waveform shaping device 506 functions as the duty ratio recovering device in the same manner as the waveform shaping device 502. In addition, the delay of the output clock OUT from the input clock IN is generated only in the SR flip-flop 14. Consequently, the waveform shaping device 506 has an advantage that a delay quantity is smaller than that of the waveform shaping device 502 having the delay quantity which exceeds the cycle T.

Consequently, in the case where the supply of the input clock IN from the outside is stopped in order to reduce the consumed power, the device can be halted immediately. In the waveform shaping device 506, a control portion 13 and the first variable delay circuit 11 serve to measure the cycle T of the input clock IN.

10. Tenth Embodiment

In each waveform shaping device as a duty ratio recovering device described above, the delay quantity of the second variable delay circuit is set half of that of the first variable delay circuit. Consequently, the clock having a duty ratio of 50% is obtained as the output clock OUT irrespective of the duty ratio of the input clock IN. In these duty ratio recovering devices, if the delay quantity of the second variable delay circuit is set to 60% of that of the first variable delay circuit, an output clock OUT having a duty ratio of 60% is obtained.

For example, the delay quantity can easily be adjusted by regulating the number of the unit delay circuits in the variable delay circuit 20 (FIG. 5). In the examples of the variable delay circuits 41 and 42 (FIGS. 8 and 9), the delay quantity can be adjusted by regulating the ratio of the numbers of the inverters 46. In the examples of the variable delay circuits 51 and 52 (FIGS. 10 and 11), it is sufficient that the relationship between the selection signal of the selector 53 and the control signal Sin, for example, a bit shift quantity is adjusted.

In the case where the object device 5 (FIG. 2) is optimized with a clock duty ratio which is not 50%, the operating speed of the object device 5 can be increased to the maximum by setting the duty ratio of the output clock OUT to an optimal value. The waveform shaping devices described in the embodiments have advantages that the ratio of the delay quantity of the first variable delay circuit to that of the second variable delay circuit can easily be set to values other than 50% and the performance of the object device 5 can be brought out to the maximum.

11. Eleventh Embodiment

A waveform shaping device according to an eleventh embodiment will be described below.

11-1. Whole Device

Figure 27:
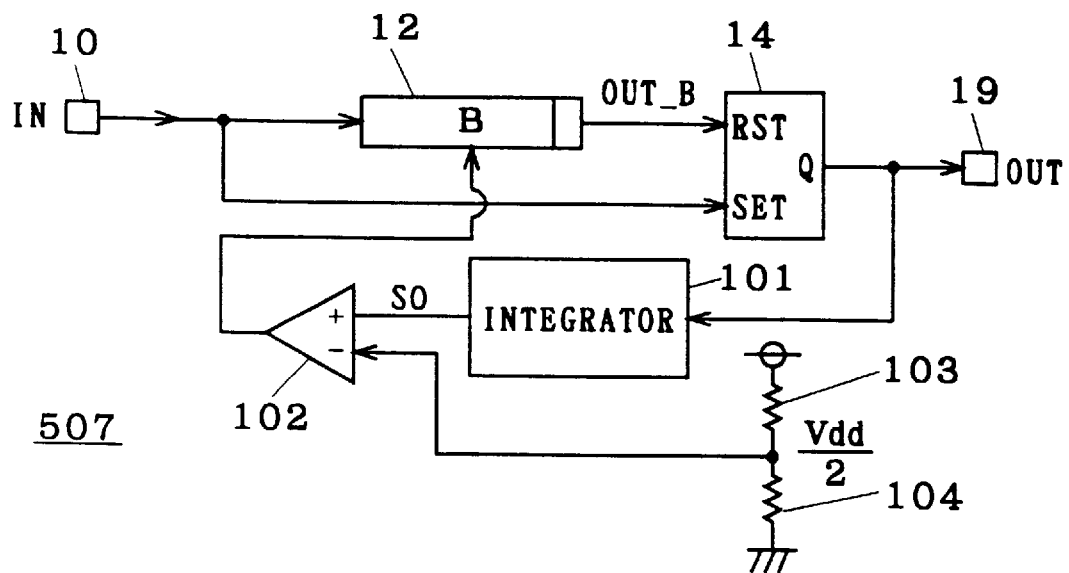
FIG. 27 is a block diagram showing a waveform shaping device according to an eleventh embodiment of the present invention.

FIG. 27 is a block diagram showing the structure of the waveform shaping device according to the eleventh embodiment. A waveform shaping device 507 is also formed as a duty ratio recovering device which obtains a clock having a duty ratio of 50%. In FIG. 27, the reference numeral 101 designates an integrator, the reference numeral 102 designates a differential amplifier, the reference numerals 103 and 104 designate resistive elements, and S0 designates an output signal of the integrator 101. The maximum variable delay quantity of a second variable delay circuit 12 is set less than one cycle of an input clock IN.

The input clock IN is inputted to the second variable delay circuit 12 and a set terminal SET of an SR flip-flop 14. An output clock OUT_B is inputted to a reset terminal RST of the SR flip-flop 14. The signal of a non-inverted output terminal Q of the SR flip-flop 14 is outputted as an output clock OUT to the outside and is also inputted to the integrator 101. The output signal S0 of the integrator 101 is inputted to the non-inverted input terminal of the differential amplifier 102.

A potential of the connecting portion of the resistive elements 103 and 104 which are connected between a high potential (Vdd) power line and a ground potential power line in series and have resistance values that are equal to each other, that is, a midpoint potential (Vdd/2) is inputted as a reference potential to the inverted input terminal of the differential amplifier 102. In other words, the resistive elements 103 and 104 function as a circuit for generating the reference potential. The differential amplifier 102 outputs, as a control signal Vin, a voltage signal having a magnitude which is proportional to the difference between two input signals. The control signal Vin is inputted to the second variable delay circuit 12. The time constant of the integrator 101 is set much greater than a cycle T.

Figure 28:
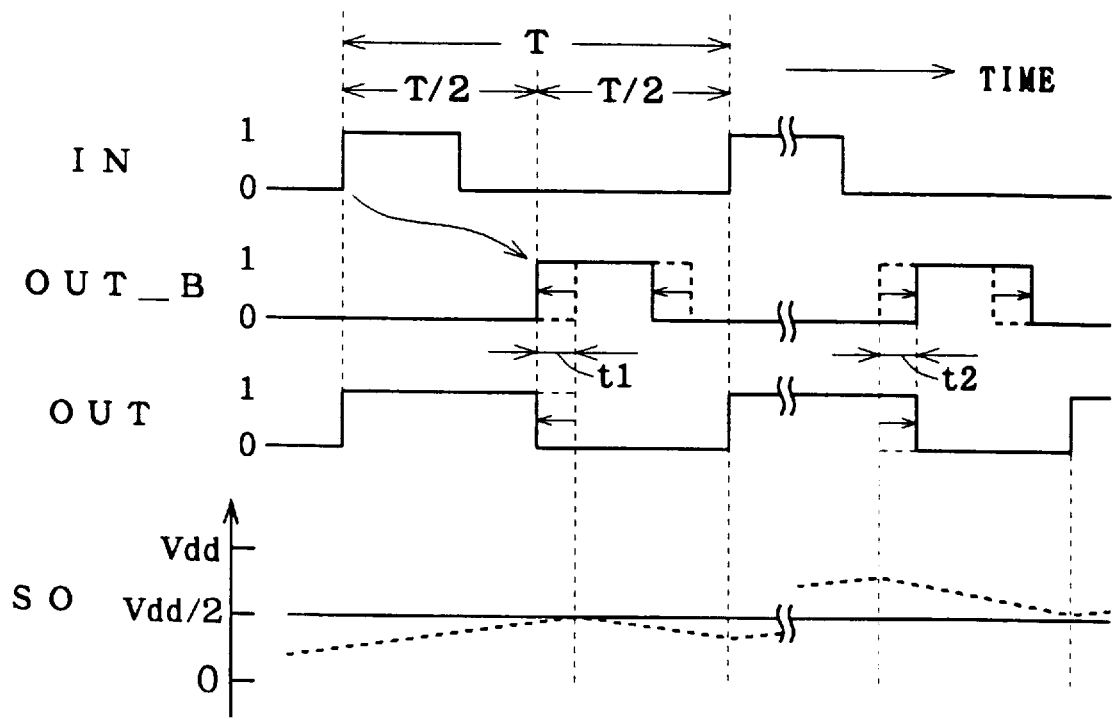
FIG. 28 is a timing chart of the waveform shaping device according to the eleventh embodiment of the present invention.

FIG. 28 is a timing chart for explaining the operation of the waveform shaping device 507. As shown in FIG. 28, it is assumed that the output clock OUT_B is delayed from the input clock IN by another time t1 in addition to the cycle T. At this time, the output signal S0 has a value which is lower than the reference potential (=Vdd/2). Since the output clock OUT_B is delayed from the input clock IN more than the cycle T, the duty ratio of the output clock OUT becomes higher than 50%. As a result, the output signal S0 gradually approaches the reference potential by the operation of the integrator 101. At the same time, the delay quantity of the second variable delay circuit 12 is gradually reduced. In other words, the duty ratio of the output clock OUT approaches 50%.

On the contrary, it is assumed that the output clock OUT_B is delayed from the input clock IN less than the cycle T by the time t1. At this time, the output signal S0 has a value which is higher than the reference potential. Since the output clock OUT_B is delayed from the input clock IN less than the cycle T, the duty ratio of the output clock OUT becomes lower than 50%. As a result, the output signal S0 gradually approaches the reference potential by the operation of the integrator 101. At the same time, the delay quantity of the second variable delay circuit 12 is gradually increased. In other words, the duty ratio of the output clock OUT approaches 50%.

When the duty ratio of the output clock OUT reaches 50%, the output signal S0 becomes zero. Consequently, the duty ratio of the output clock OUT is not varied any longer. Finally, the duty ratio of the output clock OUT is stably set to a value of 50%. Thus, the waveform shaping device 507 functions as a duty ratio recovering device for outputting the output clock OUT having a duty ratio of 50% irrespective of the duty ratio of the input clock IN.

In the waveform shaping device 507, the output clock OUT which is finally outputted to the outside is monitored to obtain a duty ratio of 50%. Consequently, even though the driving force for outputting a value of "1" is not caused to be exactly coincident with the driving force for outputting a value of "0" including the SR flip-flop 14 provided on a final stage, it is possible to compensate for the disturbance of the waveform caused by their bias and to precisely set the duty ratio of the output clock OUT to 50%. In other words, the device can be manufactured easily.

In the waveform shaping device 507, the output clock OUT having desired various duty ratios can be obtained by regulating the ratio of the resistance value of the resistive element 103 to that of the resistive element 104. More specifically, the waveform shaping device 507 also has an advantage that it is especially easy to regulate the duty ratio.

11-2. Integrator

Figure 29:
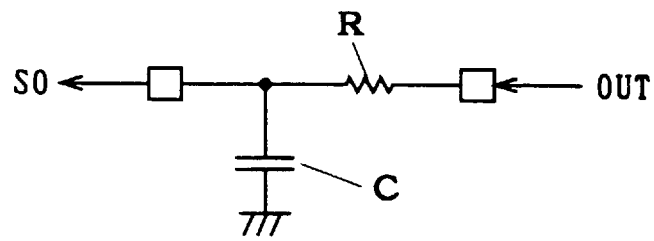
FIG. 29 is a block diagram showing an integrator according to the eleventh embodiment of the present invention.

Some examples of an integrator suitable for the integrator 101 of the waveform shaping device 507 will be described below. As shown in FIG. 29, a RC filter which has been known well can be used for the integrator 101. The RC filter has advantages that a structure is simple and the manufacturing cost is low.

Figure 30:
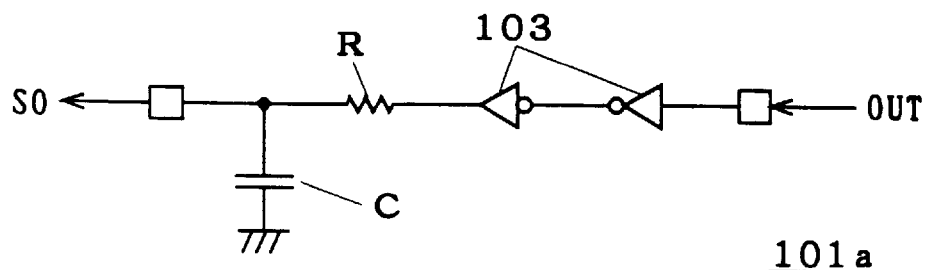
FIG. 30 is a block diagram showing another example of the integrator according to the eleventh embodiment of the present invention.

An integrator 101*a* shown in FIG. 30 has two inverters 103 connected to the input side of the RC filter. An output clock OUT is inputted to the input terminal of the inverter 103 and is not directly inputted to the RC filter. Consequently, it is possible to eliminate the influence of the output clock OUT on the waveform caused by the RC filter.

Figure 31:
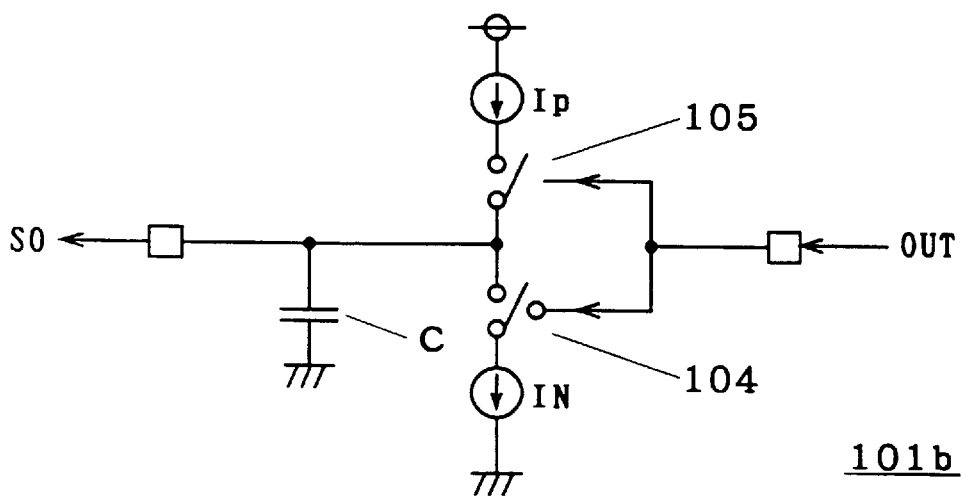
FIG. 31 is a block diagram showing yet another example of the integrator according to the eleventh embodiment of the present invention.

A charging pump for generating a current packet is applied to an integrator 101*b* shown in FIG. 31. In FIG. 31, the reference numerals 104 and 105 designate switching elements, C designates a capacity element, and IN and IP designate current sources. When an output clock OUT to be inputted has a value of "1", the current source IP is turned on and the current source IN is turned off. On the contrary, when the output clock OUT to be inputted has a value of "0", the current source IN is turned on and the current source IP is turned off. Accordingly, the value of the output clock OUT is integrated by the capacity element C. An integral value is reflected in a voltage held by the capacity element C.

Figure 32:
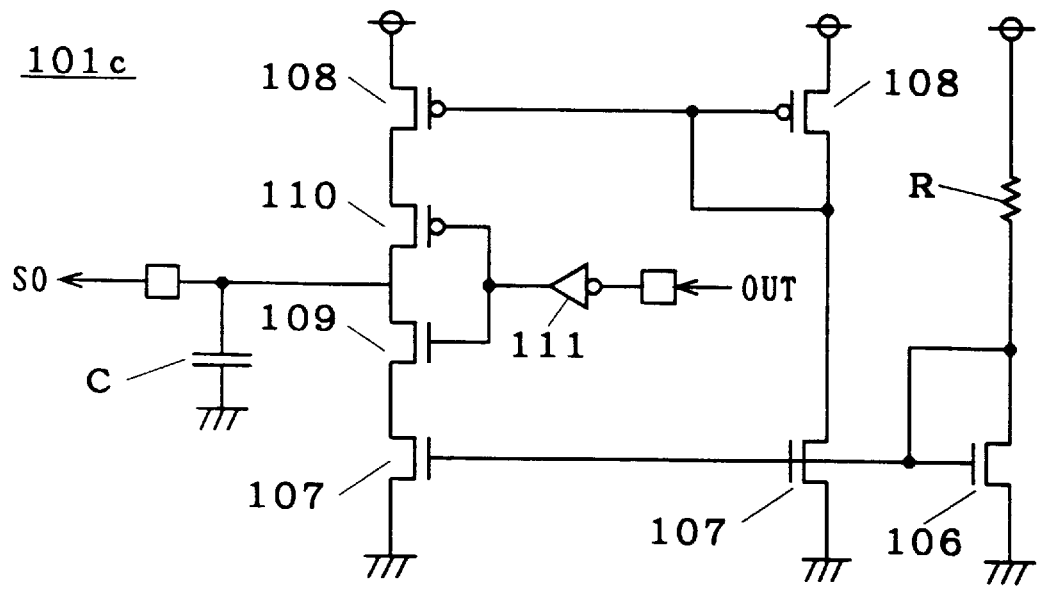
FIG. 32 is a block diagram showing a further example of the integrator according to the eleventh embodiment of the present invention.

An integrator 101*c* shown in FIG. 32 is a form of the integrator 101 suitable for making the intensities of the currents of the current sources IN and IP equal to each other. In FIG. 32, the reference numerals 106, 107 and 109 designate NMOS transistors, the reference numerals 108 and 110 designate PMOS transistors, the reference numeral 111 designates an inverter, and R designates a resistive element.

The MOS transistors 109 and 110 correspond to the switching elements 104 and 105, respectively. The MOS transistors 107 and 108 correspond to the current sources IN and IP, respectively. A bias circuit of the MOS transistors 107 and 108 is formed by the MOS transistors 106, 107 and 108 and the resistive element R.

More specifically, the magnitude of a current which flows in a serial circuit formed by the resistive element R and the MOS transistor 106 is precisely determined by the resistance value of the resistive element R. A current having the same magnitude as that of a current which flows in the resistive element R flows in the MOS transistors 107 and 108 through a current mirror circuit formed by the MOS transistors 106 and 107 and a current mirror circuit formed by two MOS transistors 108.

In other words, the current values of the MOS transistors 107 and 108 which act as current sources are precisely determined by the resistance value of the resistive element R. In addition, the current values of the MOS transistors 107 and 108 which act as the current sources can be reduced as much as possible by increasing the resistance value of the resistive element R. Accordingly, the capacity of the capacity element C is reduced so that the layout area can be kept smaller and the time constant can be set higher.

12. Twelfth Embodiment

Figure 33:
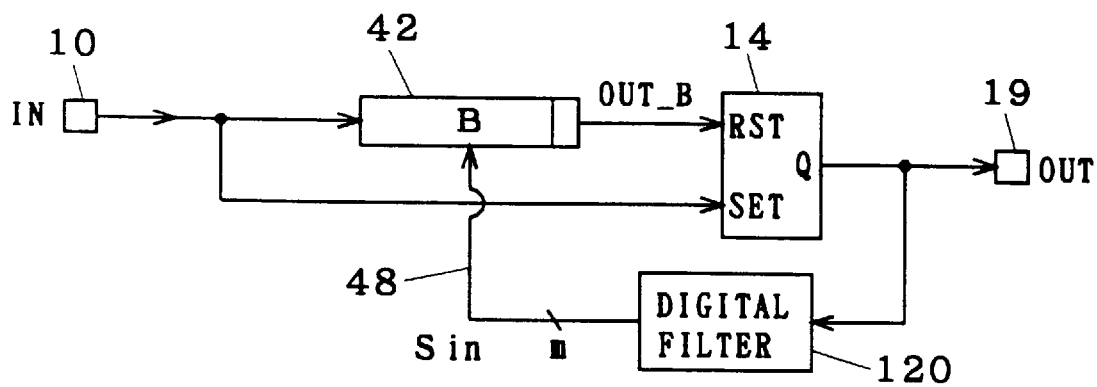
FIG. 33 is a block diagram showing a waveform shaping device according to a twelfth embodiment of the present invention.

FIG. 33 is a block diagram showing the structure of a waveform shaping device according to a twelfth embodiment. A waveform shaping device 508 is formed as a duty ratio recovering device which obtains a clock having a duty ratio of 50%, and corresponds to the waveform shaping device 507 formed by a digital circuit. In FIG. 33, the reference numeral 120 designates a digital filter. The maximum variable delay quantity of a variable delay circuit 42 is set less than one cycle of an input clock IN.

The input clock IN is inputted to the variable delay circuit 42 and a set terminal SET of an SR flip-flop 14, and an output clock OUT_B is inputted to a reset terminal RST of the SR flip-flop 14. The signal of a non-inverted output terminal Q of the SR flip-flop 14 is outputted as an output clock OUT to the outside and is simultaneously inputted to the digital filter 120. A control signal Sin outputted from the digital filter 120 is inputted to the variable delay circuit 42.

Figure 34:
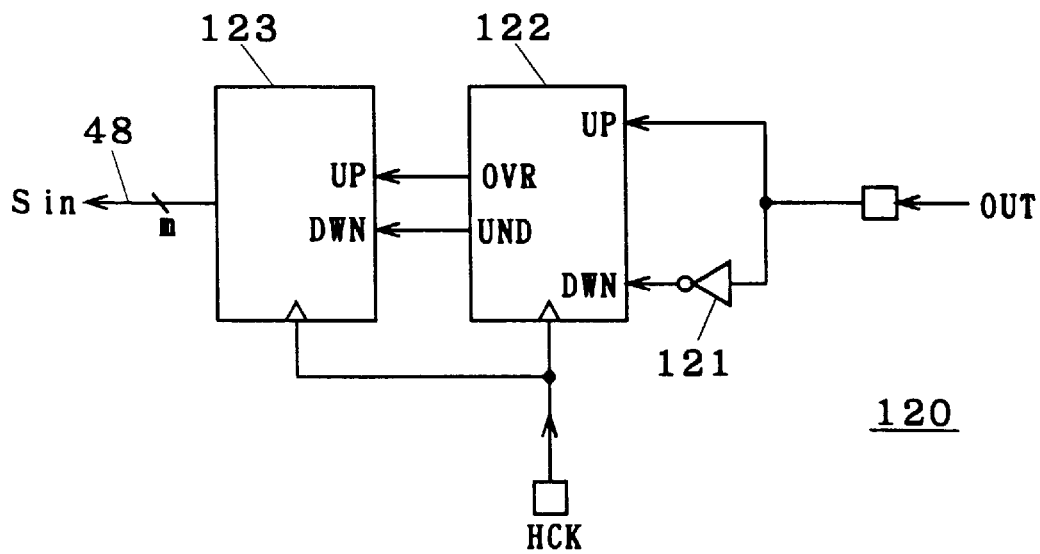
FIG. 34 is a block diagram showing a digital filter according to the twelfth embodiment of the present invention.

FIG. 34 is a circuit diagram showing the structure of the digital filter 120. In FIG. 34, the reference numeral 121 designates an inverter, the reference numerals 122 and 123 designate first and second counters of an updown type, and HCK designates a high speed clock whose cycle is much smaller than that of the input clock IN.

The output clock OUT is directly inputted to an up terminal UP of the first counter 122 on a first stage, and is inputted to a down terminal DWN through the inverter 121. An overflow terminal OVR and an underflow terminal UND of the first counter 122 are connected to an up terminal UP and a down terminal DWN of the second counter 123, respectively. The high speed clock HCK is inputted to clock terminals of the counters 122 and 123. The count value of the second counter 123 on a second stage is outputted as the control signal Sin.

Accordingly, when the output clock OUT has a value of "1", the first counter 122 repeatedly outputs the value of "1" from the overflow terminal OVR in a cycle which is equivalent to a constant multiple of the high speed clock HCK. On the contrary, when the output clock OUT has a value of "0", the first counter 122 repeatedly outputs the value of "1" from the underflow terminal UND.

As a result, when the duty ratio of the output clock OUT is more than 50%, the value of the control signal Sin is increased. When the duty ratio of the output clock OUT is less than 50%, the value of the control signal Sin is decreased. When the duty ratio of the output clock OUT is 50%, the value of the control signal Sin is not varied.

In the waveform shaping device 508, consequently, the delay quantity of the variable delay circuit 42 is controlled in such a manner that the duty ratio of the output clock OUT converges on 50%. Thus, the waveform shaping device 508 functions as a duty ratio recovering device which outputs the output clock OUT having a duty ratio of 50% irrespective of the duty ratio of the input clock IN.

In the waveform shaping device 508, the output clock OUT which is finally outputted to the outside is monitored to obtain a duty ratio of 50% in the same manner as in the waveform shaping device 507. Consequently, it is possible to compensate for the influence of the bias of driving force and to precisely obtain a clock having a duty ratio of 50% as the output clock OUT including the SR flip-flop 14 provided on a final stage.

Furthermore, all device portions are formed by digital circuits. Consequently, the layout area can be reduced and the device can easily be designed by a standard cell.

Figure 35:
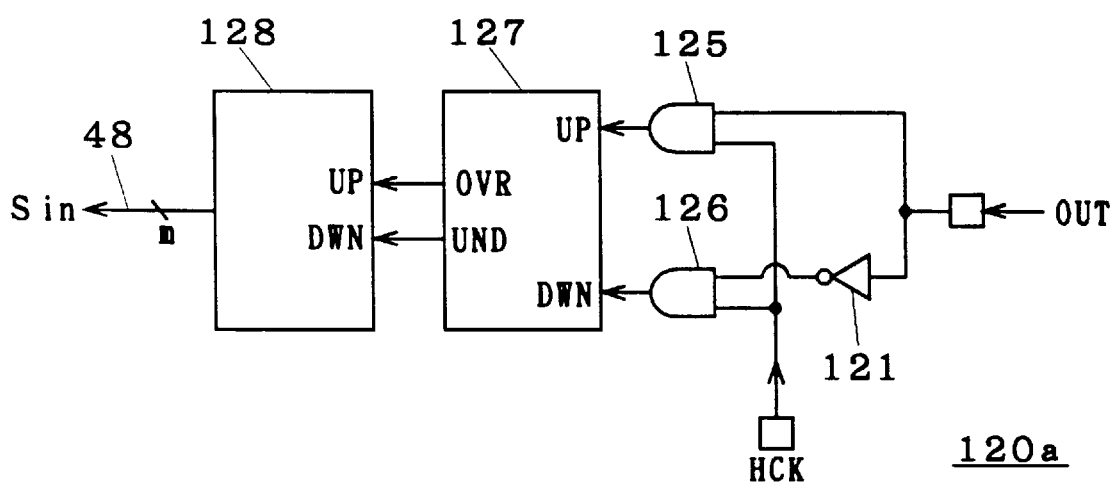
FIG. 35 is a block diagram showing another example of the digital filter according to the twelfth embodiment of the present invention.

FIG. 35 is a circuit diagram showing an example of another digital filter suitable for the waveform shaping device 508. In FIG. 35, the reference numerals 125 and 126 designate AND circuits, and the reference numerals 127 and 128 designate asynchronous counters of an updown type.

A logical AND of an output clock OUT and a high speed clock HCK is inputted to an up terminal UP of the first counter 127. A logical AND of the inverted signal of the output clock OUT and the high speed clock HCK is inputted to a down terminal DWN of the first counter 127. An overflow terminal OVR and an underflow terminal UND of the first counter 127 are connected to an up terminal UP and a down terminal DWN of the second counter 128, respectively. The count value of the second counter 128 is outputted as a control signal Sin.

Accordingly, when the output clock OUT has a value of "1", the first counter 127 counts up the high speed clock HCK inputted to the up terminal UP and repeatedly outputs the value of "1" from the overflow terminal OVR in a cycle which is equivalent to a constant multiple of the high speed clock HCK. On the contrary, when the output clock OUT has a value of "0", the first counter 127 counts down the high speed clock HCK inputted to the down terminal DWN and repeatedly outputs the value of "1" from the underflow terminal UND.

As a result, when the duty ratio of the output clock OUT is more than 50%, the value of the control signal Sin is increased. When the duty ratio of the output clock OUT is less than 50%, the value of the control signal Sin is decreased. When the duty ratio of the output clock OUT is 50%, the value of the control signal Sin is not varied.

In the waveform shaping device 508 using a digital filter 120a, consequently, the delay quantity of the variable delay circuit 42 is controlled in such a manner that the duty ratio of the output clock OUT converges on 50%. Thus, the waveform shaping device 508 functions as a duty ratio recovering device which outputs the output clock OUT having a duty ratio of 50%. An inexpensive asynchronous counter is used for the digital filter 120a. Consequently, the manufacturing cost can be reduced.

13. Thirteenth Embodiment

FIG. 36 is a block diagram showing the structure of a waveform shaping device according to a thirteenth embodiment. A waveform shaping device 509 is formed as a PWM (Pulse Width Modulation) device.

In FIG. 36, Vr designates an input signal sent from the outside, and the reference numeral 130 designates an input terminal to which the input signal Vr is sent. The input terminal 130 is connected to the inverted input terminal of a differential amplifier 102. In other words, the waveform shaping device 509 has a structure in which the reference voltage generating portion formed by the resistive elements 103 and 104 is removed from the waveform shaping device 507 (FIG. 27) and a voltage signal having an optional magnitude can be inputted from the outside to the inverted input terminal of the differential amplifier 102.

The time constant of an integrator 101 is set in such a manner that the relationship of:

cycle T<time constant<cycle of Vr is kept among the cycle T of an input clock IN, the time constant of the integrator 101 and the cycle of the input signal Vr. In this case, a variable delay circuit 42 is kept in the locking state even though the input signal Vr is varied. Consequently, the cycle of an output clock OUT is kept fixed to the cycle T of the input clock IN. In addition, when the input signal Vr is high, the duty ratio of the output clock OUT is increased. On the contrary, when the input signal Vr is low, the duty ratio of the output clock OUT is decreased.

More specifically, it is possible to obtain a PWM output as the output clock OUT in response to the input signal Vr without depending on the duty ratio of the input clock IN. In addition, the linear relationship is kept between the magnitude of the input signal Vr and the duty ratio of the output clock OUT. Thus, a PWM device having excellent characteristics can be implemented.

14. Fourteenth Embodiment

FIG. 37 is a block diagram showing the structure of a waveform shaping device according to a fourteenth embodiment. A waveform shaping device 510 is also formed as a PWM device.

In FIG. 37, the reference numeral 132 designates an offset generating portion. The offset generating portion 132 is inserted between a loop filter 17 and a second variable delay circuit 12, and serves to overlap an offset signal having a magnitude corresponding to an input signal Vr which is sent from the outside through an input terminal 130 with a control signal Vin. More specifically, the waveform shaping device 510 has a structure in which an offset signal having an optional magnitude that is sent from the outside can be superposed on the control signal Vin supplied to the second variable delay circuit 12 in the waveform shaping device 506 (FIG. 25).

Even though the input signal Vr is changed, the operation of a first variable delay circuit 11 is not influenced so that the first variable delay circuit 11 is kept in the locking state. Accordingly, when inputting the input signal Vr which is changed so as to keep the relationship of cycle T<cycle of Vr, between the cycle T of an input clock IN and the cycle of the input signal Vr, only the duty ratio of an output clock OUT is changed with the cycle of the output clock OUT fixed to the cycle T of the input clock IN. In other words, the waveform shaping device 510 functions as the PWM device.

The offset generating portion 132 is an adder which adds the input signals Vin and Vr and outputs the result of addition, and can easily be formed by using an operational amplifier, for example. By keeping the input signal Vr a constant value which is not changed with the time, the waveform shaping device 510 can also function as the device described in the tenth embodiment, that is, the duty ratio recovering device which outputs the output clock OUT having a desired optional duty ratio.

Furthermore, the waveform shaping device 510 can perform PWM of the input signal Vr having a high frequency without restricting the cycle of the input signal Vr in relation to the integral time constant of the device.

15. Fifteenth Embodiment

FIG. 38 is a block diagram showing the structure of a waveform shaping device according to a fifteenth embodiment. A waveform shaping device 511 is formed so as to implement the functions of a duty ratio recovering device and a frequency multiplier.

In FIG. 38, the reference numerals 134, 135 and 136 designate second, third and fourth variable delay circuits, the reference numerals 137 and 138 designate SR flip-flops, the reference numeral 139 designates an OR circuit, the reference numerals 141, 142 and 143 designate output terminals, OUT_B1, OUT_B2 and OUT_B3 designate output signals of the second, third and fourth variable delay circuits 134, 135 and 136 respectively, and P1, P2 and DBL designate output signals of the SR flip-flops 137 and 138 and the OR circuit 139 respectively.

More specifically, the waveform shaping device 511 is formed by adding the third and fourth variable delay circuits 135 and 136, the SR flip-flop 138 and the OR circuit 139 to the waveform shaping device 506 (FIG. 25). However, the second variable delay circuit 134 is not the same as the second variable delay circuit 12 of the waveform shaping device 506 (FIG. 25). The delay quantities of the second to fourth variable delay circuits 134 to 136 are set ¼ of the delay quantity of a first variable delay circuit 11 under the same control signal Vin.

The output clock OUT_B1 is inputted as an input signal to the third variable delay circuit 135, and the output clock OUT_B2 is inputted to the fourth variable delay circuit 136. More specifically, the second to fourth variable delay circuits 134 to 136 are cascade-connected. The control signal Vin outputted as a control signal from a loop filter 17 is inputted to the second to fourth variable delay circuits 134 to 136 in common.

The output clock OUT_B2 is inputted to a set terminal SET of the SR flip-flop 138. The output clock OUT_B3 is inputted to a reset terminal RST of the SR flip-flop 138. The outputs P1 and P2 of non-inverted output terminals Q of the SR flip-flops 137 and 138 are outputted to the outside through the output terminals 141 and 143 and are inputted to the two input terminals of the OR circuit 139, respectively. The output signal DBL of the OR circuit 139 is sent to the outside through the output terminal 142.

Figure 39:
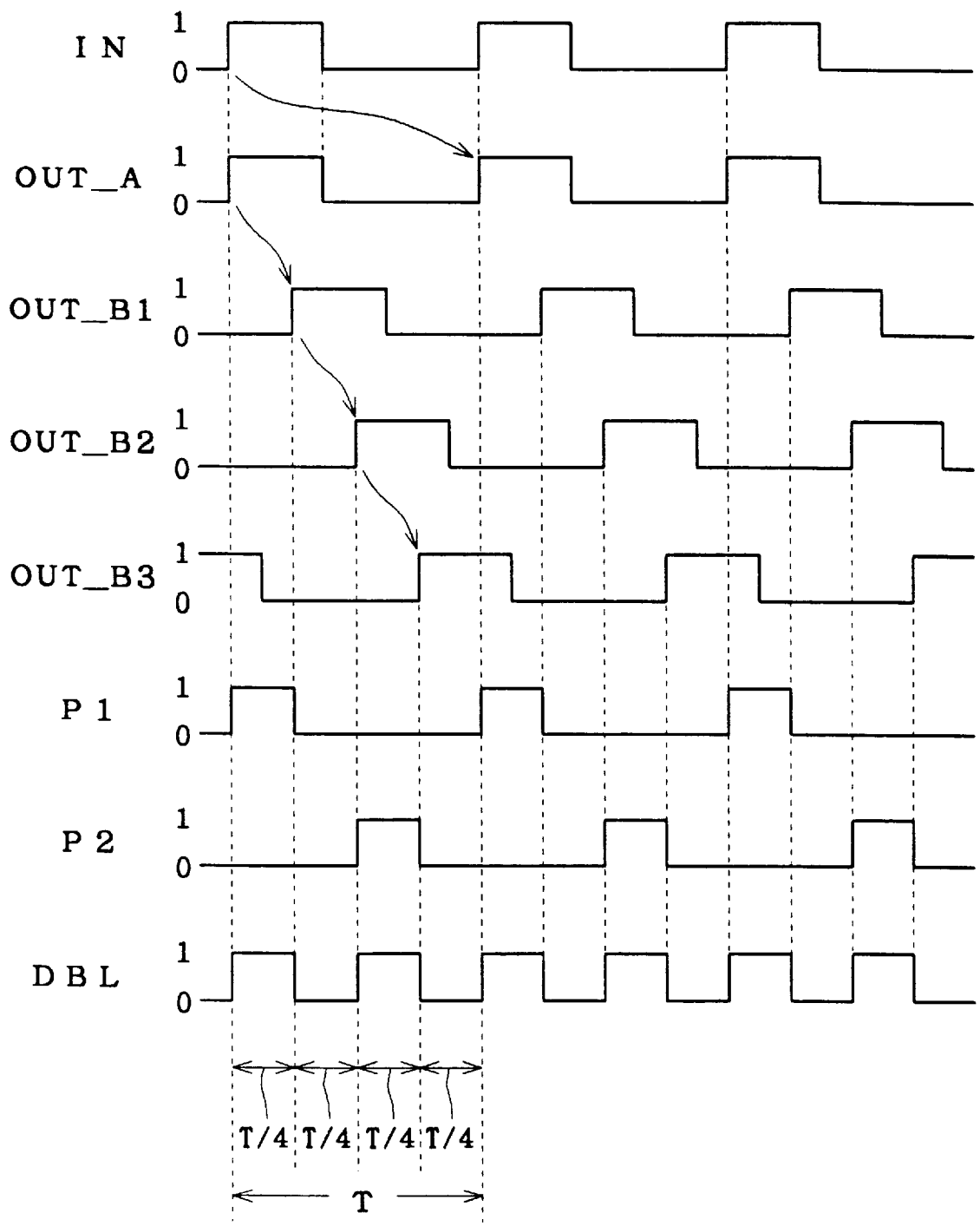
FIG. 39 is a timing chart of the waveform shaping device according to the fifteenth embodiment of the present invention.

FIG. 39 is a timing chart for explaining the operation of the waveform shaping device 511 as an example in which the first variable delay circuit 11 is in the locking state. Since the first variable delay circuit 11 is in the locking state, the output clock OUT_A is delayed from an input clock IN by a cycle T and a phase difference therebetween is apparently zero. In this case, the output clocks OUT_B1 to OUT_B3 are sequentially delayed from the input clock IN by T/4.

The SR flip-flop 137 is set at the leading edge of the output clock OUT_A and is reset at the leading edge of the output clock OUT_B1. Accordingly, the output signal P1 is obtained as a clock which has the same phase as that of the output clock OUT_A, that is, of the input clock IN and has a duty ratio of ¼.

The SR flip-flop 138 is set at the leading edge of the output clock OUT_B2 and is reset at the leading edge of the output clock OUT_B3. Accordingly, the output signal P2 is obtained as a clock which has a phase delayed from the output clock OUT_A (or the input clock IN) by T/2 and has a duty ratio of ¼.

The OR circuit 139 calculates and outputs a logical OR of the output signals P1 and P2. For this reason, the output signal DBL is obtained as a clock signal having a cycle of T/2 and a duty ratio of 50%.

Thus, the waveform shaping device 511 generates a 2-phase clock having phases which are the same as and opposite to the phase of the input clock IN, and a clock having a doubled frequency. In addition, the duty ratios of these clocks have constant values irrespective of the input clock IN. Accordingly, when the object device 5 (FIG. 2) requires a clock having a plurality of phases or a plurality of frequencies, the waveform shaping device 511 is useful.

By extending the waveform shaping device 511 to set the ratio of the delay quantities of the variable delay circuits to a value other than ¼ and set the number of the cascade-connected variable delay circuits to a value which is more than three, it is possible to easily generate a polyphase clock having more phases or perform multiplication of the clock in which a frequency is set three times as much, four times as much, and the like.

In general, it is sufficient that the number of stages on and after the third variable delay circuit 135 is N (=an even number), the SR flip-flop has the set terminal SET and the reset terminal RST connected to input and output sides respectively every other circuit including the second variable delay circuit 134, and the OR circuit 139 for calculating and outputting a logical OR of the outputs of the non-inverted output terminals Q of all the SR flip-flops is provided. Furthermore, it is ideal that respective delay quantities on and after the second variable delay circuit 134 are set to 1/(N+2) of the delay quantity of the first variable delay circuit 11. In this case, the number M of the SR flip-flops connected to circuits on and after the third variable delay circuit 135 is half of N, that is, M=N/2.

Consequently, the OR circuit 139 outputs a clock whose frequency is (N+2)/2 times, that is, (M+1) times as much as the frequency of the input clock IN and which has a duty ratio of 50%. In an example shown in FIG. 38, N has a minimum value, that is, N=2.

16. Sixteenth Embodiment

Figure 40:
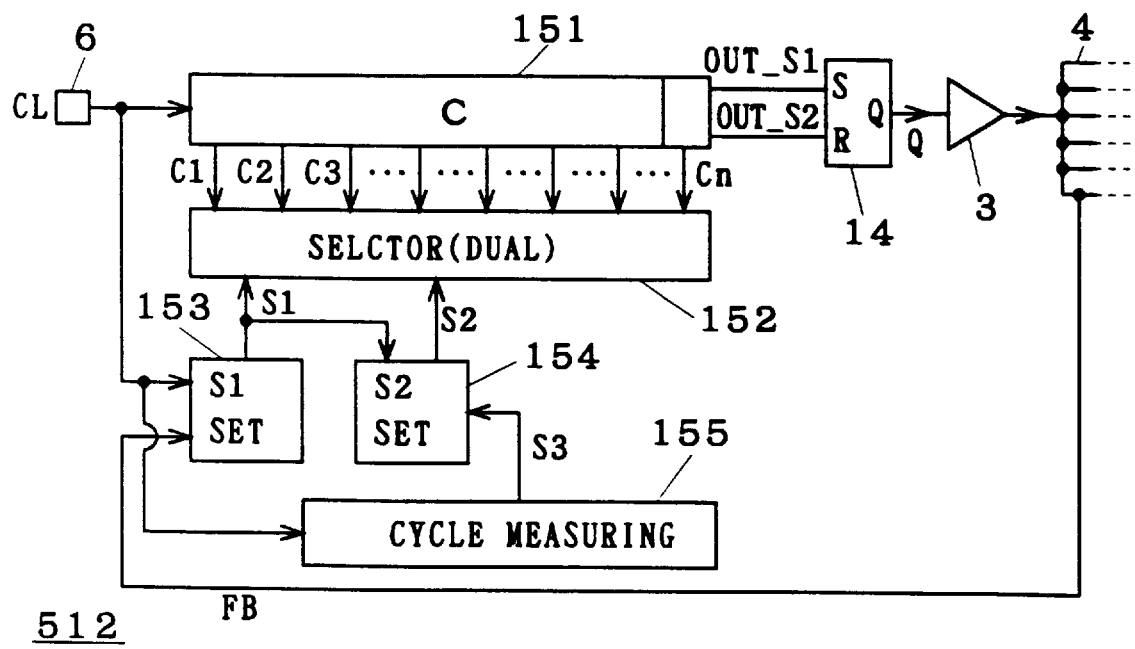
FIG. 40 is a block diagram showing a waveform shaping device according to a sixteenth embodiment of the present invention.

FIG. 40 is a block diagram showing the structure of a clock supply apparatus according to a sixteenth embodiment. A clock supply apparatus 512 is formed so as to have the same function as that of the clock supply apparatus 501 (FIG. 2) in which a DLL device is combined with a duty ratio recovering device.

In FIG. 40, the reference numeral 151 designates a delay circuit, the reference numeral 152 designates a selector, the reference numeral 153 designates a first selection signal generating portion, the reference numeral 154 designates a second selection signal generating portion, the reference numeral 155 designates a cycle measuring portion, c1 to cn designate output signals of the delay circuit 151, S1 designates a first selection signal, S2 designates a second selection signal, S3 designates a third selection signal, and OUT_S1 and OUT_S2 designate output signals of the selector 152.

The delay circuit 151 sequentially delays an input clock CL by a constant time and outputs the output signals c1, c2, ..., cn. The delay quantity of the delay circuit 151 is not variable and is formed by inverters which are cascade-connected in multiple stages, for example.

The selector 152 is formed as a dual selector to select one of the output signals c1, c2, ... cn in response to the first selection signal S1 and output the output signal OUT_S1 and to select one of the output signals c1, c2, ..., cn in response to the second selection signal S2 and output the output signal OUT_S2. In other words, a variable delay circuit is formed by the delay circuit 151 and the selector 152. As the selection signals S1 and S2 have greater values, an output signal having a larger delay quantity is selected.

The cycle measuring portion 155 measures the cycle of the input clock CL and outputs, as the third selection signal S3, a value which is equivalent to half of the cycle. The first selection signal generating portion 153 outputs the first selection signal S1 according to a phase difference between the input clock CL and a feedback clock FB. In other words, the first selection signal generating portion 153 outputs the first selection signal S1 in such a manner that the phase difference between the input clock CL and the feedback clock FB is set to a value of zero equivalently and stably. Furthermore, the second selection signal generating portion 154 adds the third selection signal S3 to the first selection signal S1, and outputs the second selection signal S2.

Thus, the DLL device is formed by the delay circuit 151, the selector 152 and the first selection signal generating portion 153. The delay quantity is regulated in such a manner that the phase difference between the input clock CL and the feedback clock FB is equivalently zero. Furthermore, the duty ratio recovering device which converts the optional duty ratio of the input clock IN to 50% is formed by the cycle measuring portion 155 and the second selection signal generating portion 154.

Figure 41:
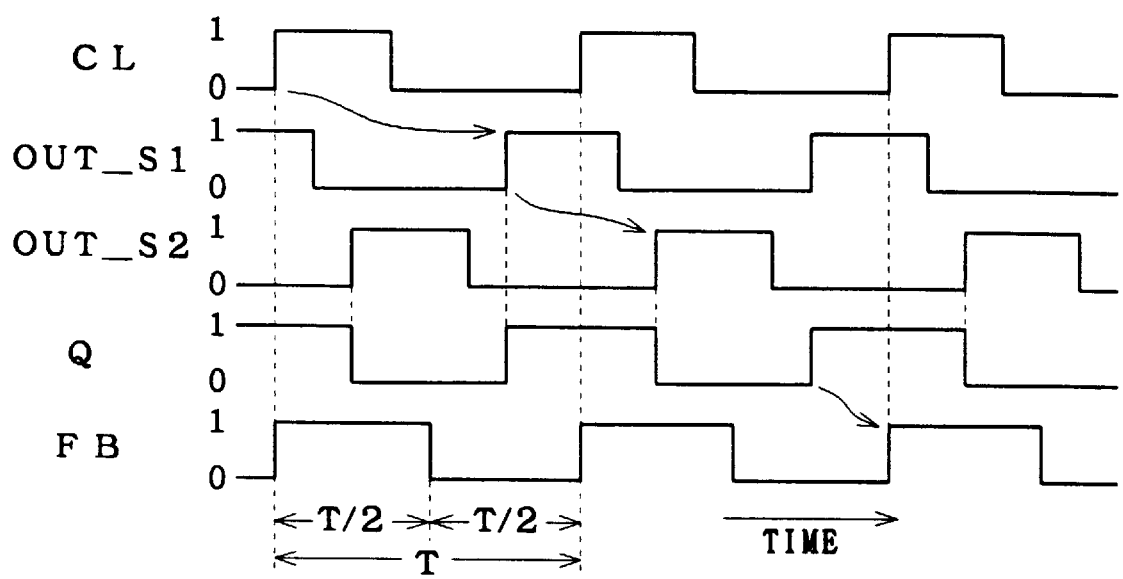
FIG. 41 is a timing chart of the waveform shaping device according to the sixteenth embodiment of the present invention.

FIG. 41 is a timing chart for explaining the operation of the clock supply apparatus 512 as an example in which the phase difference is set to a value of zero stably. In FIG. 41, T designates a cycle of the input clock CL. The output signal OUT_S1 is delayed from the input clock CL by a constant delay quantity corresponding to the value of the first selection signal S1. Furthermore, the output signal OUT_S2 is delayed from the output signal OUT_S1 by T/2 corresponding to the third selection signal S3.

An SR flip-flop 14 is set by the output signal OUT_S1 and is reset by the output signal OUT_S2. As a result, a clock signal Q having a duty ratio of 50% is outputted from a non-inverted output terminal Q of the SR flip-flop 14 synchronously with the output signal OUT_S1.

The output signal Q is further delayed by a clock driver 3, a clock wiring 4 and the like before it is sent as the feedback clock FB. However, the delay quantity given from the input clock CL to the output signal OUT_S1 is regulated in such a manner that the apparent phase difference between the input clock CL and the feedback clock FB is set to zero by the operation of the DLL device.

Thus, the clock supply apparatus 512 generates a clock having no phase difference from the input clock CL and having a duty ratio of 50% irrespective of the duty ratio of the input clock CL.

Figure 42:
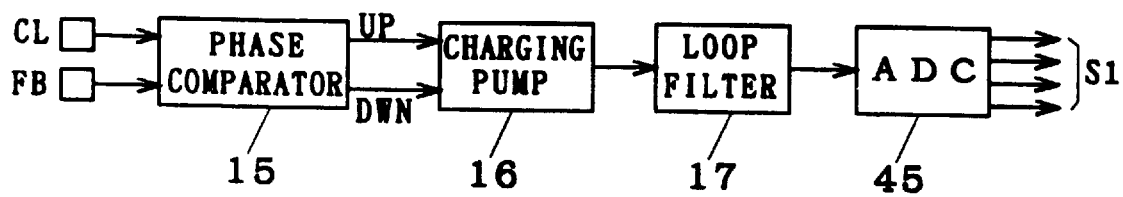
FIG. 42 is a block diagram showing a first control signal generating portion according to the sixteenth embodiment of the present invention.

FIG. 42 is a block diagram showing a preferred example of the structure of the first selection signal generating portion 153. As shown in FIG. 42, the first selection signal generating portion 153 can have the same structure as that of the control portion 43 of the waveform shaping device 503 (FIG. 7).

Figure 43:
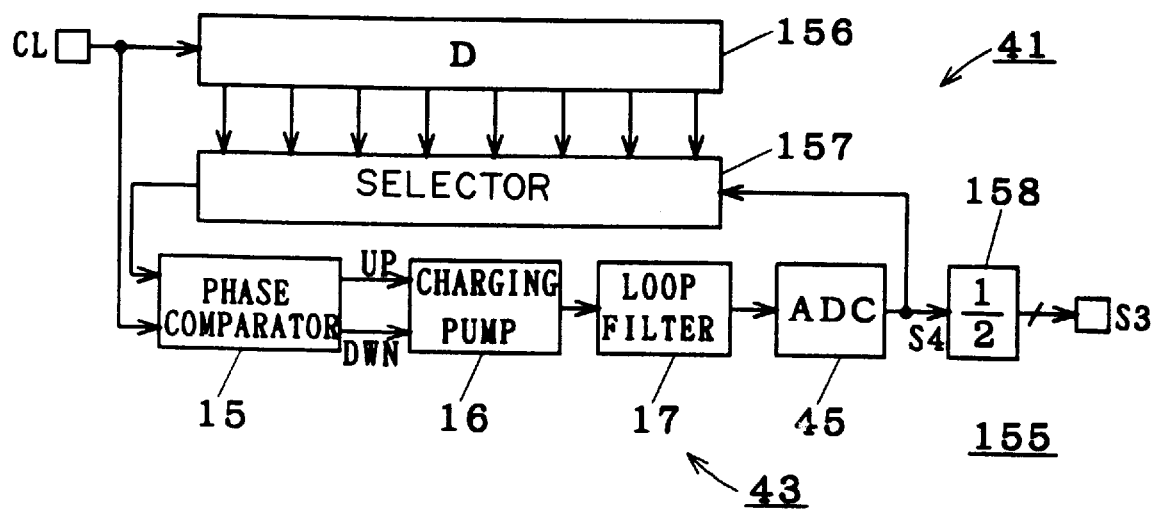
FIG. 43 is a block diagram showing a cycle measuring portion according to the sixteenth embodiment of the present invention.

FIG. 43 is a block diagram showing a preferred example of the structure of the cycle measuring portion 155. In FIG. 43, the reference numeral 156 designates a delay circuit, the reference numeral 157 designates a selector, the reference numeral 158 designates a divider, and S4 designates a fourth selection signal. The delay circuit 156 has the same structure as that of the delay circuit 151. In addition, the delay quantities of a lot of output signals are also coincident with each other in the delay circuits 156 and 151. In the selectors 157 and 152, the relationship of response between the selection signal and a signal selected according to the selection signal is set identical.

The selector 157 selects one of the output signals sent from the delay circuit 156 in response to the fourth selection signal S4 outputted from an AD converter 45, and outputs the selected signal to a phase comparator 15. In other words, the variable delay circuit 41 (FIG. 7) is substantially formed by the delay circuit 156 and the selector 157. The cycle measuring portion 155 is formed by adding the divider 158 to the variable delay circuit 41 and the control portion 43 (FIG. 7).

Accordingly, the third selection signal S3 is generated as a selection signal for selecting a signal having a delay quantity of T/2 from the output signals of the delay circuit 156. In other words, this means that the third selection signal S3 is generated as a selection signal for selecting the signal having a delay quantity of T/2 from the output signals c1 to cn of the delay circuit 151.

Figure 44:
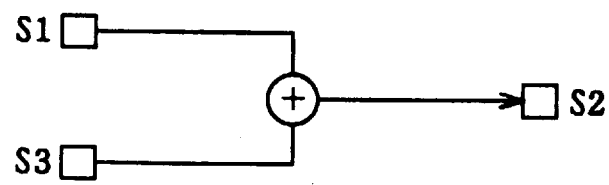
FIG. 44 is a block diagram showing a second control signal generating portion according to the sixteenth embodiment of the present invention.

FIG. 44 is a block diagram showing an example of the structure of the second selection signal generating portion 154. As shown in FIG. 44, the second selection signal generating portion 154 can add the selection signals S1 and S3 as binary numbers by using a digital adder, and can output the selection signal S2.

Since the second selection signal S2 is obtained by adding the third selection signal S3 to the first selection signal S1, a signal delayed from the output signal OUT_S1 by T/2 is selected and output as the output signal OUT_S2.

In the clock supply apparatus 512, the delay circuit 151 is shared by the DLL device and the duty ratio recovering device. Consequently, the number of elements is decreased so that the scale of the apparatus can be reduced. In addition, all device portions are formed by digital circuits for performing processing by only digital signals. Consequently, the clock supply apparatus 512 is hardly influenced by electrical noises and can operate stably.

The cycle measuring portion 155 has device portions similar to the delay circuit 151, the selector 152 and the first control signal generating portion 153. The corresponding portions can have the same structures. Consequently, the design resources can be shared so that the manufacturing process can be simplified and the manufacturing cost can be reduced.

While the example in which the dual selector 152 is used has been described above, two ordinary selectors may be prepared to be connected to the single delay circuit 151.

17. Seventeenth Embodiment

Figure 45:
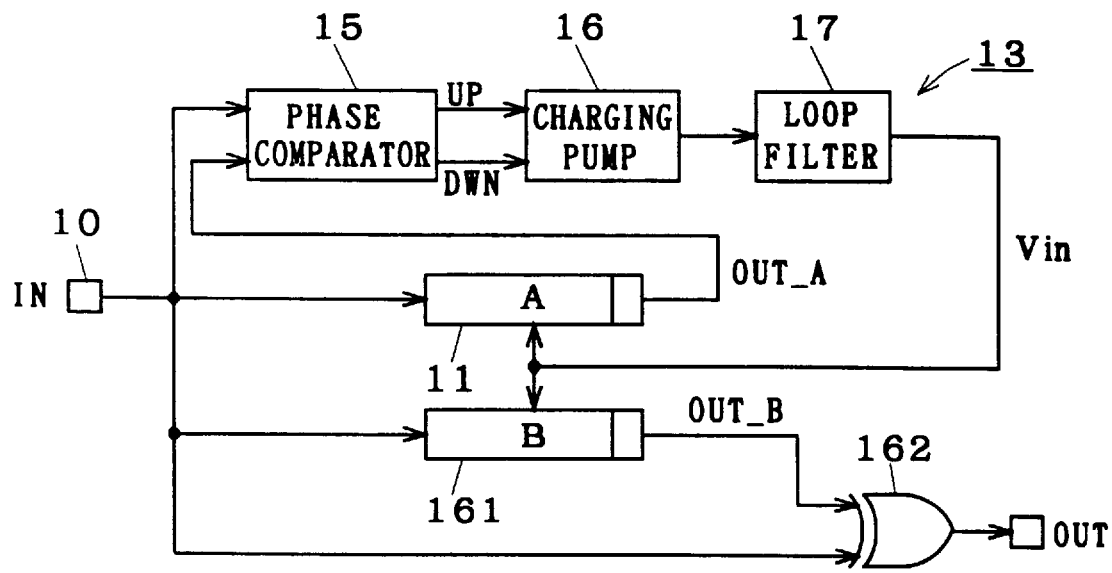
FIG. 45 is a block diagram showing a waveform shaping device according a seventeenth embodiment of the present invention.

FIG. 45 is a block diagram showing the structure of a waveform shaping device according to a seventeenth embodiment. A waveform shaping device 513 is formed as a frequency multiplier for multiplying the frequency of a clock.

In FIG. 45, the reference numeral 161 designates a variable delay circuit and the reference numeral 162 designates an exclusive OR circuit. The variable delay circuit 161 has a delay quantity set to ¼ of that of a first variable delay circuit 11 under the same control signal Vin in the same manner as in the variable delay circuit 134 (FIG. 38). More specifically, the variable delay circuits 135 and 136, the SR flip-flops 137 and 138 and the OR circuit 139 are removed from the waveform shaping device 511 and the exclusive OR circuit 162 is provided in place of the SR flip-flop 137 so that the waveform shaping device 513 is formed. When using the waveform shaping device 513, a clock having a duty ratio set to 50% is inputted as an input clock IN.

Figure 46:
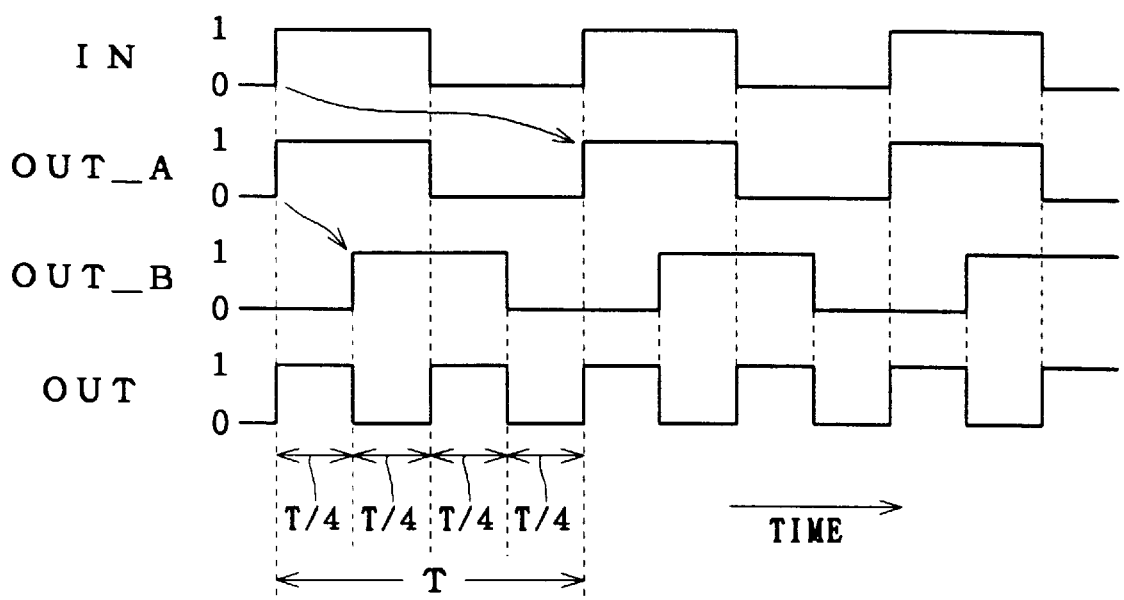
FIG. 46 is a timing chart of the waveform shaping device according to the seventeenth embodiment of the present invention.

FIG. 46 is a timing chart for explaining the operation of the waveform shaping device 513 as an example in which the first variable delay circuit 11 is in the locking state. Since the first variable delay circuit 11 is in the locking state, an output clock OUT_A is delayed from the input clock IN by a cycle T and a apparent (equivalent) phase difference therebetween is zero. In this case, an output clock OUT_B outputted from the variable delay circuit 161 is delayed from the input clock IN by T/4.

The exclusive OR circuit 162 calculates exclusive-OR (EXOR) of the output clock OUT_A and the output clock OUT_B, and outputs an output clock OUT. For this reason, the output clock OUT is obtained as a clock signal having a duty ratio of 50% and a cycle of T/4. In addition, there is no delay between the leading edge of the input clock IN and the leading edge of the output clock OUT obtained every two cycles.

Furthermore, a clock which is delayed from the input clock IN by a ¼ cycle can be obtained by fetching the output clock OUT_B as an output clock to the outside. In the waveform shaping device 513, thus, a clock having a phase shifted by a predetermined quantity and a clock having a frequency multiplied can be obtained by inputting the input clock IN having a duty ratio of 50%.

As is apparent from the comparison with the waveform shaping device 511 (FIG. 38), the waveform shaping device 513 can implement the multiplication of the frequency with a simple structure.

While the invention has been described in detail, the foregoing description is in all aspects illustrative and not restrictive. It is understood that numerous other modifications and variations can be devised without departing from the scope of the invention.

We claim:

1. A waveform shaping device which converts a waveform of an input clock to output an output clock, comprising:

a first variable delay circuit which receives said input clock, delays said input clock by a first delay quantity that is changed monotonously with a control signal, and outputs a first delay clock, wherein an upper bound of said first delay quantity is set to be more than one cycle and less than two cycles of said input clock;

a second variable delay circuit which at an input side receives one of said input clock and said first delay clock to be delayed according to said control signal by a second delay quantity which is changed with a constant ratio that is less than 1 with respect to said first delay quantity, and outputs a second delay clock at an output side thereof;

a control portion which compares phases of said input clock and said first delay clock, and generates said control signal according to a result of the comparison; and an SR flip-flop which has a set terminal and a reset terminal connected to said input and output sides of said second variable delay circuit respectively, and outputs an output signal as said output clock;

wherein said control portion changes said control signal in such a manner so that said first delay quantity is decreased when the phase of said first delay clock is later than a phase of said input clock, and so that said first delay quantity is increased when said phase of said first delay clock is earlier than the phase of said input clock.

2. The waveform shaping device as defined in claim 1, wherein said control portion includes:

a phase comparator which compares the phases of said input clock and said first delay clock, selects either of an up signal and a down signal according to whether one of said input clock and said first delay clock is later or earlier than the other clock, and outputs a selected signal over a period which is equivalent to a phase difference for each cycle of said input clock;

a charging pump circuit for selectively outputting one or the other of positive and negative currents over a period in which said up signal or said down signal is outputted respectively; and a loop filter which has a capacity element, stores said positive and negative currents outputted from said charging pump in said capacity element, and outputs the voltage of said capacity element as said control signal.

3. The waveform shaping device as defined in claim 1, wherein said first variable delay circuit and said second variable delay circuit have respectively a first part and a second part of a group of unit delay elements having the same structure that are cascade-connected so as to be arranged straight;

each of said unit delay elements forming said group includes an inverter for sending a signal in a delay time which is reduced as a supplied source current is increased, and a current source for supplying said source current to said inverter in response to a bias signal; and said first variable delay circuit and said second variable delay circuit further share a single bias circuit portion for supplying, in response to said control signal, a common signal as said bias signal to each said current source respectively belonging to each of said unit delay elements forming said group.

4. The waveform shaping device as defined in claim 1, wherein said first variable delay circuit includes:

a first fixed delay circuit which has a group of first unit delay elements that are cascade-connected, and outputs, as a first signal string, a string of output signals fetched every first constant number of said first unit delay elements; and a first selector which is connected to said first fixed delay circuit, selects a signal from said first signal string in response to a selection signal of a digital form expressing a binary number in such a manner that a delay quantity varies monotonously with said binary number, and outputs a selected signal as said first delay clock;

wherein said second variable delay circuit includes:

a second fixed delay circuit which has a group of second unit delay elements that are cascade-connected, and outputs, as a second signal string, a string of output signals fetched every second constant number of said second unit delay elements; and a second selector which is connected to said second fixed delay circuit, selects, from said second signal string in response to said selection signal, a signal which has a delay quantity having said constant ratio to a delay quantity of said signal selected by said first variable delay circuit, and outputs a selected signal as said second delay clock; and wherein said control portion sends said selection signal as said control signal.

5. The waveform shaping device as defined in claim 4, wherein said first and second selectors have the same structure, and a connecting relationship between said first selector and said first fixed delay circuit is set identical to a connecting relationship between said second selector and said second fixed delay circuit, said first and second unit delay elements have the same structure, and said first constant number is set greater than said second constant number.

6. The waveform shaping device as defined in claim 4, wherein said first and second selectors have the same structure, said first and second fixed delay circuits have the same structure, said control portion sends said selection signal corresponding to a binary number as a parallel signal, a connecting relationship between said first selector and said first fixed delay circuit is set identical to a connecting relationship between said second selector and said second fixed delay circuit, and a wiring between said first or second selector and said control portion is connected in such a manner that said control signal is bit-shifted.

7. The waveform shaping device as defined in claim 4, wherein said control portion includes:

a D latch that has a data input terminal and a clock input terminal to which one and the other of said first delay clock and said input clock are inputted respectively, and updates an output according to a level of a signal of said data input terminal every leading edge, to an active level, of a signal of said clock input terminal;

a first counter for selectively executing count-up and count-down in the cycle of said input clock according to the level of said output of said D latch, and a second counter for increasing and decreasing a count value synchronously with said input clock every time said first counter overflows and underflows respectively, and for sending said count value as said selection signal.

8. The waveform shaping device as defined in claim 1, further comprising:

N ($\geq 1$) third variable delay circuits which are sequentially cascade-connected after said second variable delay circuit and have the same structure as that of said second variable delay circuit, and to which said control signal is inputted as a signal for controlling a delay quantity, and said device, referring to said SR flip-flop as a first SR flip-flop, further comprising, M second SR flip-flops having set and reset terminals connected to M ($1 \leq M \leq N$) input and output sides of said N third variable delay circuits respectively.

9. The waveform shaping device as defined in claim 8, wherein said N is an even number and said M is N/2, said first SR flip-flop and said M second SR flip-flops are connected every other circuit of a group of variable delay circuits which are formed by said second variable delay circuit and said N third variable delay circuits and are cascade-connected, and said constant ratio is set to $1/(N+2)$, said waveform shaping device further comprising an OR circuit for calculating and outputting a logical OR of the output signals of said first SR flip-flop and said M second SR flip-flops.

10. The waveform shaping device as defined in claim 1, further comprising an offset generating portion which is inserted between said control portion and said second variable delay circuit, and superposes an offset signal on said control signal sent from said control portion to send a superposed signal to said second variable delay circuit.

11. The waveform shaping device as defined in claim 1, wherein said SR flip-flop includes two one-shot pulse circuits for generating a one-shot pulse synchronously with the leading edge, to an active level, of clocks inputted to said set terminal and said reset terminal respectively.

12. The waveform shaping device as defined in claim 1, further comprising a one-shot pulse circuit for outputting a one-shot pulse synchronously with the leading edge, to an active level, of said input clock inputted from the outside,
wherein said one shot-pulse is supplied to each portion of said waveform shaping device except for said one-shot pulse circuit in place of said input clock.

13. A waveform shaping device which converts a waveform of an input clock to output an output clock, comprising:
a one-shot pulse circuit for outputting a one-shot pulse synchronously with a leading edge of said input clock to an active level;
a first variable delay circuit which receives said one-shot pulse, delays said one-shot pulse by a first delay quantity that is changed monotonously with a control signal, and outputs a delay clock, wherein an upper bound of said first delay quantity is set to be more than one cycle and less than two cycles of said input clock;
a second variable delay circuit which at an input side receives one of said one-shot pulse and said delay clock, and outputs a delay signal string which is sequentially delayed with a delay width that is changed according to said control signal in such a manner that a second delay quantity of a signal on a last portion keeps a constant ratio which is less than 1 with respect to said first delay quantity;
a control portion which compares phases of said one-shot pulse and said delay clock, and generates said control signal according to a result of the comparison; and
an OR circuit which calculates a logical OR of said delay clock received by said second variable delay circuit and said delay signal string, and outputs said logical OR as said output clock;
wherein said control portion changes said control signal in such a manner so that said first delay quantity is decreased when said phase of said delay clock is later than the phase of said one-shot pulse, and so that said first delay quantity is increased when said phase of said delay clock is earlier than the phase of said one-shot pulse.

14. A waveform shaping device which converts a waveform of an input clock to output an output clock, comprising:
a variable delay circuit which receives said input clock, delays said input clock by a delay quantity that is changed monotonously with a control signal, and outputs a delay clock, wherein an upper bound of said delay quantity is set to be less than one cycle of said input clock;
an SR flip-flop that has a set terminal and a reset terminal which respectively receive said input clock and said delay clock, and outputs an output signal as said output clock;
an integrator for integrating said output clock and outputting an integrated clock; and
a differential amplifier which receives the integrated clock output from said integrator at a first input and a reference signal at a second input, amplifies a difference in value between said first and second inputs so as to decrease said delay quantity when a value of one of said first and second inputs is greater than a value of another of said first and second inputs and to increase said delay quantity when said value of said one of said first and second inputs is smaller than said value of said another of said first and second inputs, and outputs an amplified signal as said control signal.

15. The waveform shaping device as defined in claim 14, further comprising a reference signal generating portion for generating said reference signal, wherein said reference signal has a constant value.

16. A waveform shaping device which converts a waveform of an input clock to output an output clock, comprising:
a fixed delay circuit which has a group of unit delay elements that are cascade-connected, and outputs a signal string that is obtained by sequentially delaying said input clock every constant number of said unit delay elements; and
a selector which, is connected to said fixed delay circuit, selects a signal from said signal string in response to a selection signal of a digital form expressing a binary number in such a manner that a delay quantity has a monotonous relationship with said binary number, and outputs a selected signal as a delay clock;
an SR flip-flop that has a set terminal and a reset terminal which respectively receive said input clock and said delay clock, and outputs an output signal as said output clock;
a first counter for selectively executing count-up and count-down in a smaller cycle than said input clock according to a level of said output clock; and
a second counter for selectively increasing and decreasing a count value in such a manner that a deviation of the duty ratio of said output clock from 50% is eliminated every time said first counter overflows and underflows, and for sending said count value as said selection signal.

17. A waveform shaping device which converts a waveform of an input clock to output an output clock, comprising:
a first variable delay circuit which receives said input clock, delays said input clock by a first delay quantity that is changed monotonously with a control signal and outputs a first delay clock, wherein an upper bound of said first delay quantity is set to be more than one cycle and less than two cycles of said input clock;
a second variable delay circuit which at an input side receives one of said input clock and said first delay clock to be delayed according to said control signal by a second delay quantity which is changed with a constant ratio of ¼ with respect to said first delay quantity, and outputs a second delay clock at an output side;
a control portion which compares phases of said input clock and said first delay clock, and generates said control signal according to a result of the comparison; and
an exclusive OR circuit which calculates exclusive-OR of signals on the input and output sides of said second variable delay circuit, and outputs said exclusive-OR as said output clock;
wherein said control portion changes said control signal in such a manner that said first delay quantity is decreased when said phase of said first delay clock is later than said phase of said input clock, and that said first delay quantity is increased when said phase of said first delay clock is earlier than said phase of said input clock.

* * * * *